US012765168B2

(12) United States Patent
Watabe et al.

(10) Patent No.: US 12,765,168 B2
(45) Date of Patent: Oct. 13, 2026

(54) LIGHT-EMITTING DEVICE, DISPLAY APPARATUS, ELECTRONIC DEVICE, LIGHT-EMITTING APPARATUS, LIGHTING DEVICE

(71) Applicant: Semiconductor Energy Laboratory Co., Ltd., Kanagawa-ken (JP)

(72) Inventors: Takeyoshi Watabe, Atsugi (JP); Nobuharu Ohsawa, Zama (JP); Satoshi Seo, Sagamihara (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 346 days.

(21) Appl. No.: 18/700,081

(22) PCT Filed: Oct. 3, 2022

(86) PCT No.: PCT/IB2022/059399

§ 371 (c)(1),
(2) Date: Apr. 10, 2024

(87) PCT Pub. No.: WO2023/062474

PCT Pub. Date: Apr. 20, 2023

(65) Prior Publication Data

US 2024/0349531 A1 Oct. 17, 2024

(30) Foreign Application Priority Data

Oct. 15, 2021 (JP) ................................ 2021-169265

(51) Int. Cl.
*H10K 50/858* (2023.01)
*H10K 50/13* (2023.01)
(Continued)

(52) U.S. Cl.
CPC .......... *H10K 50/858* (2023.02); *H10K 50/13* (2023.02); *H10K 50/17* (2023.02); *H10K 50/171* (2023.02);
(Continued)

(58) Field of Classification Search
CPC ...... H10K 50/858; H10K 50/13; H10K 50/17; H10K 59/879; H10K 2102/351; H10K 50/171
See application file for complete search history.

(56) References Cited

U.S. PATENT DOCUMENTS

| | | | |
|---|---|---|---|
| 8,593,059 | B2 | 11/2013 | Tanaka. et al. |
| 9,276,221 | B2 | 3/2016 | Nowatari et al. |

(Continued)

FOREIGN PATENT DOCUMENTS

| | | | |
|---|---|---|---|
| JP | 2015-216040 | A | 12/2015 |
| JP | 2016-004761 | A | 1/2016 |
| WO | WO-2015/174508 | | 11/2015 |

OTHER PUBLICATIONS

IP.COM search (Year: 2026).*

(Continued)

*Primary Examiner* — Zandra V Smith
*Assistant Examiner* — Andre C Stevenson
(74) *Attorney, Agent, or Firm* — Husch Blackwell LLP

(57) ABSTRACT

A novel light-emitting device that is highly convenient, useful, or reliable is provided. The light-emitting device includes a first electrode, a second electrode, a first layer, a second layer, and a third layer. The first layer is interposed between the first electrode and the second electrode. The second layer is interposed between the second electrode and the first layer. The third layer is interposed between the second layer and the first layer. The first layer contains a first light-emitting material. The first light-emitting material has
(Continued)

an emission spectrum having a peak at a wavelength λ1. The first layer has an ordinary refractive index n1 at the wavelength λ1. The second layer contains a second light-emitting material. The second light-emitting material has an emission spectrum having a peak at a wavelength λ2. The second layer has an ordinary refractive index n2 at the wavelength λ2. The third layer has an ordinary refractive index n31 which is lower than the ordinary refractive index n1 at the wavelength λ1. The third layer has an ordinary refractive index n32 which is lower than the ordinary refractive index n2 at the wavelength λ2.

20 Claims, 21 Drawing Sheets

(51) Int. Cl.

| | |
|---|---|
| ***H10K 50/17*** | (2023.01) |
| ***H10K 59/80*** | (2023.01) |
| ***H10K 102/00*** | (2023.01) |

(52) U.S. Cl.

CPC ..... *H10K 59/879* (2023.02); *H10K 2102/351* (2023.02)

(56) References Cited

U.S. PATENT DOCUMENTS

| | | | | |
|---|---|---|---|---|
| 9,515,278 | B2 | 12/2016 | Suzuki et al. | |
| 9,627,650 | B2 | 4/2017 | Seo et al. | |
| 10,637,004 | B2 | 4/2020 | Kajimoto | |
| 10,950,805 | B2 | 3/2021 | Watabe et al. | |
| 2014/0225102 | A1 * | 8/2014 | Ikeda | H10K 50/13 257/43 |
| 2016/0043146 | A1 * | 2/2016 | Uesaka | H10K 59/80518 257/40 |
| 2017/0033317 | A1 | 2/2017 | Kajimoto | |
| 2018/0323396 | A1 * | 11/2018 | Tsukamoto | H10K 50/121 |
| 2020/0176692 | A1 | 6/2020 | Watabe. et al. | |
| 2021/0005814 | A1 | 1/2021 | Watabe et al. | |
| 2021/0257562 | A1 | 8/2021 | Watabe. et al. | |
| 2021/0317069 | A1 | 10/2021 | Seo et al. | |

OTHER PUBLICATIONS

International Search Report (Application No. PCT/IB2022/059399) Dated Dec. 27, 2022.

Written Opinion (Application No. PCT/IB2022/059399) Dated Dec. 27, 2022.

* cited by examiner

LIGHT-EMITTING DEVICE, DISPLAY APPARATUS, ELECTRONIC DEVICE, LIGHT-EMITTING APPARATUS, LIGHTING DEVICE

This application is a 371 of international application PCT/IB2022/059399 filed on Oct. 3, 2022, which is incorporated herein by reference.

TECHNICAL FIELD

One embodiment of the present invention relates to a light-emitting device, a display apparatus, an electronic device, a light-emitting apparatus, a lighting device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display apparatus, a light-emitting apparatus, a power storage device, a memory device, a driving method thereof, and a manufacturing method thereof.

BACKGROUND ART

Low light extraction efficiency is often a problem in an organic EL device. In order to improve the light extraction efficiency, a structure including a layer formed using a low refractive index material in an EL layer has been proposed (see Patent Document 1, for example).

REFERENCE

Patent Document

[Patent Document 1] United States Patent Application Publication No. 2020/0176692

SUMMARY OF THE INVENTION

Problems to be Solved by the Invention

An object of one embodiment of the present invention is to provide a novel light-emitting device that is highly convenient, useful, or reliable. Another object is to provide a novel display apparatus that is highly convenient, useful, or reliable. Another object is to provide a novel electronic device that is highly convenient, useful, or reliable. Another object is to provide a novel light-emitting apparatus that is highly convenient, useful, or reliable. Another object is to provide a novel lighting device that is highly convenient, useful, or reliable. Another object is to provide a novel light-emitting device, a novel display apparatus, a novel electronic device, a novel light-emitting apparatus, a novel lighting device, or a novel semiconductor device.

Note that the description of these objects does not preclude the presence of other objects. In one embodiment of the present invention, there is no need to achieve all of these objects. Other objects will be apparent from the description of the specification, the drawings, the claims, and the like, and other objects can be derived from the description of the specification, the drawings, the claims, and the like.

Means for Solving the Problems (1) One embodiment of the present invention is a light-emitting device including a first electrode, a second electrode, a first layer, a second layer, and a third layer.

The first layer is interposed between the first electrode and the second electrode, the second layer is interposed between the second electrode and the first layer, and the third layer is interposed between the second layer and the first layer.

The first layer contains a first light-emitting material. The first light-emitting material has an emission spectrum having a peak at a wavelength λ1, and the first layer has an ordinary refractive index n1 at the wavelength λ1.

The second layer contains a second light-emitting material. The second light-emitting material has an emission spectrum having a peak at a wavelength λ2. The second layer has an ordinary refractive index n2 at the wavelength λ2.

The third layer has an ordinary refractive index n31 which is lower than the ordinary refractive index n1 at the wavelength λ1, and the third layer has an ordinary refractive index n32 which is lower than the ordinary refractive index n2 at the wavelength λ2.

(2) Another embodiment of the present invention is a light-emitting device including a first electrode, a second electrode, a first layer, a second layer, and a third layer.

The first layer is interposed between the first electrode and the second electrode, the second layer is interposed between the second electrode and the first layer, and the third layer is interposed between the second layer and the first layer.

The first layer contains a first light-emitting material and a first host material. The first light-emitting material has an emission spectrum having a peak at a wavelength λ1. The first host material formed into a film has an ordinary refractive index n1 at the wavelength λ1.

The second layer contains a second light-emitting material and a second host material. The second light-emitting material has an emission spectrum having a peak at a wavelength λ2. The second host material formed into a film has an ordinary refractive index n2 at the wavelength λ2.

The third layer has an ordinary refractive index n31 which is lower than the ordinary refractive index n1 at the wavelength λ1, and the third layer has an ordinary refractive index n32 which is lower than the ordinary refractive index n2 at the wavelength λ2.

(3) Another embodiment of the present invention is the above light-emitting device in which the third layer has an ordinary refractive index higher than or equal to 1.50 and lower than or equal to 1.75 with respect to light with a wavelength in the range of 455 nm to 465 nm.

(4) Another embodiment of the present invention is the above light-emitting device in which the third layer has an ordinary refractive index higher than or equal to 1.45 and lower than or equal to 1.70 with respect to light with a wavelength of 633 nm.

(5) Another embodiment of the present invention is the above light-emitting device in which the third layer has a distance d1 from a center plane of the first layer, the third layer has a distance d2 from a center plane of the second layer, and the third layer has a thickness t3.

Note that the distance d1, the distance d2, the thickness t3, the wavelength λ1, the wavelength λ2, the ordinary refractive index n1, the ordinary refractive index n2, the ordinary refractive index n31, and the ordinary refractive index n32 satisfy the following Formula (1) and Formula (2).

[Formula 1]

$$n1 \times d1 + n31 \times t3 < \frac{1}{2} \times \lambda 1 \quad (1)$$

$$n2 \times d2 + n32 \times t3 < \frac{1}{2} \times \lambda 2 \quad (2)$$

Accordingly, light emitted from the first layer and light emitted from the second layer can be extracted efficiently. Consequently, a novel light-emitting device that is highly convenient, useful, or reliable can be provided.

(6) Another embodiment of the present invention is the above light-emitting device in which the wavelength λ1 and the wavelength λ2 are each in the range of 430 nm to 490 nm.

(7) Another embodiment of the present invention is the above light-emitting device in which the second light-emitting material is the same as the first light-emitting material.

Accordingly, the light emitted from the first layer and the light emitted from the second layer can be extracted efficiently. In addition, a light-emitting device with a high blue index can be obtained. Consequently, a novel light-emitting device that is highly convenient, useful, or reliable can be provided.

(8) Another embodiment of the present invention is the above light-emitting device including a fourth layer.

The fourth layer is interposed between the first electrode and the first layer, the fourth layer has an ordinary refractive index n41 which is lower than the ordinary refractive index n1 at the wavelength λ1, and the fourth layer has an ordinary refractive index n42 which is lower than the ordinary refractive index n2 at the wavelength λ2.

(9) Another embodiment of the present invention is the above light-emitting device in which the fourth layer has an ordinary refractive index higher than or equal to 1.50 and lower than or equal to 1.75 with respect to light with a wavelength in the range of 455 nm to 465 nm.

(10) Another embodiment of the present invention is the above light-emitting device in which the fourth layer has an ordinary refractive index higher than or equal to 1.45 and lower than or equal to 1.70 with respect to light with a wavelength of 633 nm.

(11) Another embodiment of the present invention is the above light-emitting device in which the fourth layer contains the same material as the third layer.

(12) Another embodiment of the present invention is the above light-emitting device including a fifth layer.

The fifth layer is interposed between the second layer and the first layer, and the fifth layer supplies holes to the second layer and electrons to the first layer.

(13) Another embodiment of the present invention is the above light-emitting device in which the third layer is interposed between the second layer and the fifth layer.

Accordingly, a light-emitting device having high current efficiency can be achieved. Consequently, a novel light-emitting device that is highly convenient, useful, or reliable can be provided.

(14) Another embodiment of the present invention is a display apparatus including a first light-emitting device and a second light-emitting device.

The first light-emitting device has the above structure, and the fifth layer contains an electron-accepting substance.

The second light-emitting device is adjacent to the first light-emitting device, and the second light-emitting device includes a third electrode, a fourth electrode, and a sixth layer.

A gap is provided between the third electrode and the first electrode.

The sixth layer is interposed between the third electrode and the fourth electrode, and the sixth layer contains the electron-accepting substance. A region having a thickness smaller than that of the fifth layer is provided between the fifth layer and the sixth layer, and the region overlaps with the above gap.

(15) Another embodiment of the present invention is a display apparatus including a first light-emitting device and a second light-emitting device.

The first light-emitting device has the above structure, and the fifth layer contains an organic compound having a halogen group or a cyano group or a transition metal oxide.

The second light-emitting device is adjacent to the first light-emitting device, and the second light-emitting device includes a third electrode, a fourth electrode, and a sixth layer.

A gap is provided between the third electrode and the first electrode.

The sixth layer is interposed between the third electrode and the fourth electrode, and the sixth layer contains the organic compound having a halogen group or a cyano group or the transition metal oxide. A region having a thickness smaller than that of the fifth layer is provided between the fifth layer and the sixth layer, and the region overlaps with the above gap.

Accordingly, current flowing through a region having a smaller thickness than the fourth layer can be reduced, for example. In addition, current flowing between the fourth layer and the fifth layer can be reduced. It is also possible to inhibit occurrence of a phenomenon in which when the first light-emitting device operates, the adjacent second light-emitting device unintentionally emits light. As a result, a novel display apparatus that is highly convenient, useful, or reliable can be provided.

(16) Another embodiment of the present invention is a display apparatus including the above light-emitting device and a transistor or a substrate.

(17) Another embodiment of the present invention is an electronic device including the above display apparatus and a sensor, an operation button, a speaker, or a microphone.

(18) Another embodiment of the present invention is a light-emitting apparatus including the above light-emitting device and a transistor or a substrate.

(19) Another embodiment of the present invention is a lighting device including the above light-emitting apparatus and a housing.

Although a block diagram in which components are classified by their functions and shown as independent blocks is shown in the drawing attached to this specification, it is difficult to completely separate actual components according to their functions and one component can relate to a plurality of functions.

Note that the light-emitting apparatus in this specification includes, in its category, an image display device that uses a light-emitting device. The light-emitting apparatus may also include a module in which a light-emitting device is provided with a connector such as an anisotropic conductive film or a TCP (Tape Carrier Package), a module in which a printed wiring board is provided at the end of a TCP, and a module in which an IC (integrated circuit) is directly mounted on a light-emitting device by a COG (Chip On Glass) method. Furthermore, a lighting device or the like may include the light-emitting apparatus.

Effect of the Invention

According to one embodiment of the present invention, a novel light-emitting device that is highly convenient, useful, or reliable can be provided. Another embodiment of the present invention can provide a novel display apparatus that is highly convenient, useful, or reliable. Another embodiment of the present invention can provide a novel electronic appliance that is highly convenient, useful, or reliable. Another embodiment of the present invention can provide a novel light-emitting apparatus that is highly convenient, useful, or reliable. Another embodiment of the present invention can provide a novel lighting device that is highly convenient, useful, or reliable. Alternatively, A novel light-emitting device can be provided. Alternatively, novel display apparatus can be provided. Alternatively, a novel electronic device can be provided. Alternatively, a novel light-emitting device can be provided. Another embodiment of the present invention can provide a novel lighting device. A novel semiconductor device can be provided.

Note that the description of these effects does not preclude the existence of other effects. Note that one embodiment of the present invention does not need to have all the effects. Other effects will be apparent from the description of the specification, the drawings, the claims, and the like, and other effects can be derived from the description of the specification, the drawings, the claims, and the like.

MODE FOR CARRYING OUT THE INVENTION

Figure 1A:
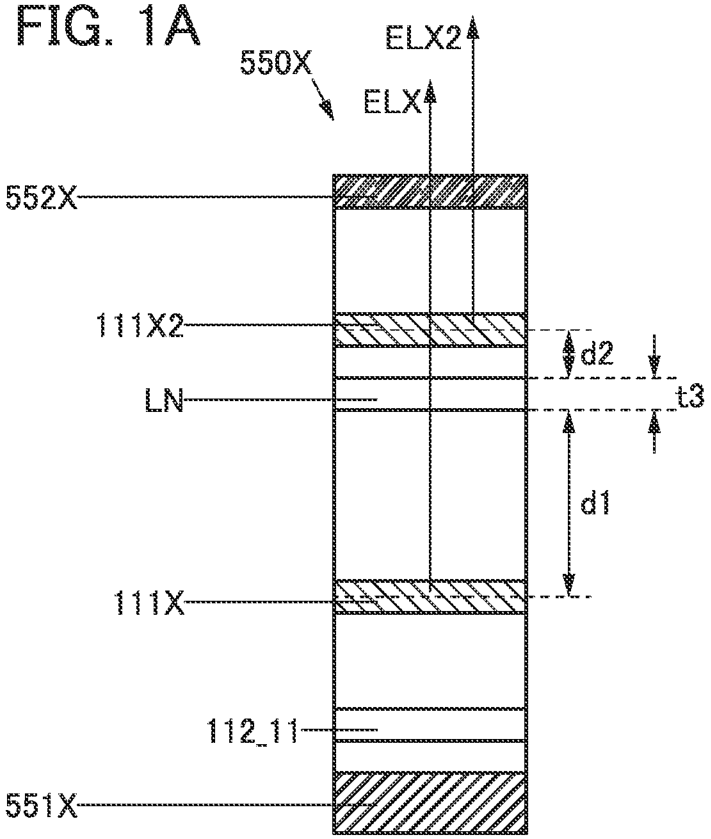
FIG. 1A and FIG. 1B are diagrams illustrating a structure of a light-emitting device of an embodiment.

A light-emitting device of one embodiment of the present invention includes a first electrode, a second electrode, a first layer, a second layer, and a third layer. The first layer is interposed between the first electrode and the second electrode. The second layer is interposed between the second electrode and the first layer. The third layer is interposed between the second layer and the first layer. The first layer contains a first light-emitting material. The first light-emitting material has an emission spectrum having a peak at a wavelength λ1. The first layer has an ordinary refractive index n1 at the wavelength λ1. The second layer contains a second light-emitting material. The second light-emitting material has an emission spectrum having a peak at a wavelength λ2. The second layer has an ordinary refractive index n2 at the wavelength λ2. The third layer has an ordinary refractive index n31 which is lower than the ordinary refractive index n1 at the wavelength λ1. The third layer has an ordinary refractive index n32 which is lower than the ordinary refractive index n2 at the wavelength λ2.

Accordingly, light emitted from the first layer and light emitted from the second layer can be extracted efficiently. Consequently, a novel light-emitting device that is highly convenient, useful, or reliable can be provided.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, a structure of a light-emitting device 550X of one embodiment of the present invention is described with reference to FIG. 1.

Figure 1B:
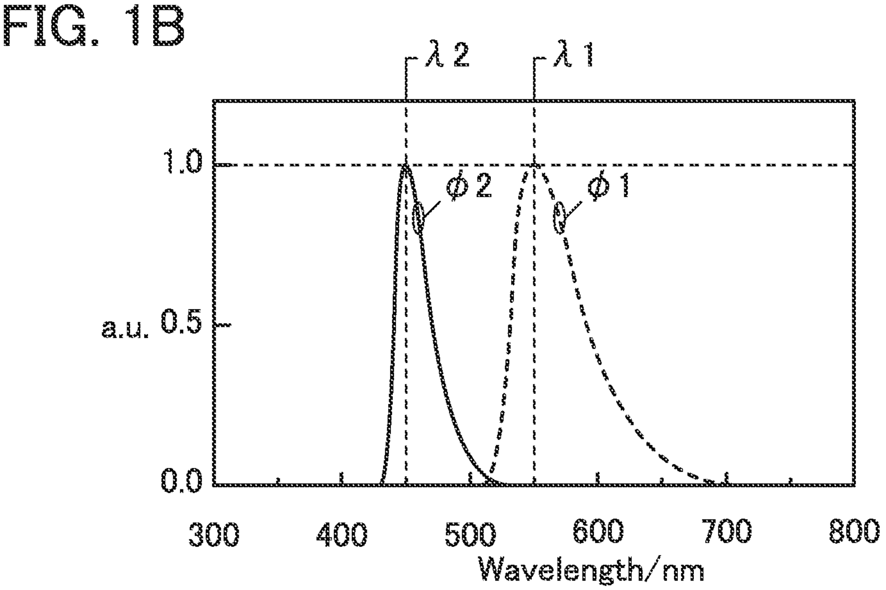

FIG. 1A is a cross-sectional view illustrating the structure of the light-emitting device of one embodiment of the present invention. FIG. 1B is a schematic view illustrating emission spectra of light-emitting materials used for the light-emitting device of one embodiment of the present invention.

In this specification and the like, a device manufactured using a metal mask or an FMM (a fine metal mask or a high-resolution metal mask) may be referred to as a device having an MM (metal mask) structure. In this specification and the like, a device manufactured without using a metal mask or an FMM may be referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Light-emitting devices can be classified roughly into a single structure and a tandem structure. A device with a single structure includes one light-emitting unit between a pair of electrodes, and the light-emitting unit preferably includes one or more light-emitting layers. To obtain white light emission, two or more of light-emitting layers are selected such that their emission colors are complementary. For example, when an emission color of a first light-emitting layer and an emission color of a second light-emitting layer are complementary colors, a light-emitting device can be configured to emit white light as a whole. The same applies to a light-emitting device including three or more light-emitting layers.

A device with a tandem structure includes two or more light-emitting units between a pair of electrodes, and each light-emitting unit preferably includes one or more light-emitting layers. To obtain white light emission, the structure is made such that light from light-emitting layers of the plurality of light-emitting units can be combined to be white light. Note that a structure for obtaining white light emission is similar to that in the case of a single structure. In the device with a tandem structure, an intermediate layer such as a charge-generation layer is suitably provided between the plurality of light-emitting units.

When the above white-light-emitting device (having a single structure or a tandem structure) and the above light-emitting device having an SBS structure are compared to each other, the light-emitting device having an SBS structure can have lower power consumption than the white-light-emitting device. To reduce power consumption, the light-emitting device having an SBS structure is suitably used. Meanwhile, the white-light-emitting device is suitable in terms of lower manufacturing cost or higher manufacturing yield because the manufacturing process of the white-light-emitting device is simpler than that of the light-emitting device having an SBS structure.

Structure Example 1 of Light-Emitting Device 550X

The light-emitting device 550X described in this embodiment includes an electrode 551X, an electrode 552X, a layer 111X, a layer 112X2, and a layer LN (see FIG. 1A). The layer 111X has a function of emitting light ELX, and the layer 111X2 has a function of emitting light ELX2.

The layer 111X is interposed between the electrode 551X and the electrode 552X, and the layer 111X2 is interposed between the electrode 552X and the layer 111X. The layer LN is interposed between the layer 111X2 and the layer 111X.

Structure Example 1 of Layer 111X

The layer 111X contains a light-emitting material EM1. The light-emitting material EM1 has an emission spectrum φ1 having a peak at the wavelength λ1 (see FIG. 1). Note that in this specification, the maximum of an emission spectrum is referred to as a peak.

The wavelength λ1 can be determined from the maximum of an emission spectrum of a solution of the light-emitting material EM1. For example, an organic solvent such as toluene can be used for adjusting the solution of the light-emitting material EM1.

The wavelength λ1 can be determined from the maximum of a spectrum of the light ELX emitted from the light-emitting device 550X.

The layer 111X has the ordinary refractive index n1 at the wavelength λ1. The layer 111X has an ordinary refractive index higher than or equal to 1.75 and less than or equal to 2.1 with respect to light with a wavelength in the range of 455 nm to 465 nm, for example. The layer 111X has an ordinary refractive index higher than or equal to 1.70 and lower than or equal to 2.05 with respect to light with a wavelength of 633 nm.

In the case where the material has anisotropy, the refractive index with respect to an ordinary ray might differ from the refractive index with respect to an extraordinary ray. When a thin film subjected to the measurement is in such a state, anisotropy analysis can be performed to separately calculate the ordinary refractive index and the extraordinary refractive index. In this specification, when the material subjected to the measurement has both the ordinary refractive index and the extraordinary refractive index, the ordinary refractive index is used as an indicator. The refractive index can be measured by a spectroscopic ellipsometer, for example.

Structure Example 2 of Layer 111X

A light-emitting material or a light-emitting material and a host material can be used for the layer 111X, for example. The layer 111X can be referred to as a light-emitting layer. The layer 111X is preferably placed in a region where holes and electrons are recombined. In that case, energy generated by recombination of carriers can be efficiently converted into light and emitted.

Note that in the case where the layer 111X contains the light-emitting material EM1 and a host material HO1 and the light-emitting material EM1 has an emission spectrum having the maximum at the wavelength λ1, the host material HO1 formed into a film has the ordinary refractive index n1 at the wavelength λ1.

Furthermore, the layer 111X is preferably placed apart from a metal used for the electrode or the like. In that case, a quenching phenomenon caused by the metal used for the electrode or the like can be inhibited.

It is preferable that a distance from an electrode or the like having reflectivity to the layer 111X be adjusted and the layer 111X be placed in an appropriate position in accordance with an emission wavelength. Thus, the amplitude can be increased by utilizing an interference phenomenon between light reflected by the electrode or the like and light emitted by the layer 111X. Light of a predetermined wavelength can be intensified and the spectrum of the light can be narrowed. In addition, bright light emission colors with high intensity can be obtained. In other words, the layer 111X is placed in an appropriate position, for example, between electrodes and the like, and thus a microcavity structure (microcavity) can be formed.

For example, a fluorescent substance, a phosphorescent substance, or a substance exhibiting thermally activated delayed fluorescence (TADF) (also referred to as a TADF material) can be used as the light-emitting material. Thus, energy generated by recombination of carriers can be released as the light ELX from the light-emitting material (see FIG. 1A).

[Fluorescent Substance]

A fluorescent substance can be used for the layer 111X. For example, any of the following fluorescent substances can be used for the layer 111X. Note that without being limited to the following ones, any of a variety of known fluorescent substances can be used for the layer 111X.

Specifically, it is possible to use, for example, 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N,N'-(pyrene-1,6-diyl)bis[(6,N-diphenylbenzo[b]naphtho[1,2-d]furan)-8-amine](abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), or 3,10-bis[N-(dibenzofuran-3-yl)-N-phenylamino]naphtho[2,3-b;6,7-b']bisbenzofuran (abbreviation: 3,10FrA2Nbf(IV)-02).

Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, or high reliability.

In addition, it is possible to use, for example, N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]rysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracene-2-amine (abbreviation: 2YGABPhA), N,N,9-triphenylanthracene-9-amine (abbreviation: DPhAPhA), coumarin 545T, N,N'-diphenylquinacridone (abbreviation: DPQd), rubrene, or 5,12-bis(1,1'-biphenyl-4-yl)-6,11-diphenyltetracene (abbreviation: BPT).

Furthermore, it is possible to use, for example, 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), or 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM).

[Phosphorescent Substance]

A phosphorescent substance can be used for the layer 111X. For example, any of the following phosphorescent substances can be used for the layer 111X. Note that without being limited to the following ones, any of a variety of known phosphorescent substances can be used for the layer 111X.

For the layer 111X, it is possible to use, for example, an organometallic iridium complex having a 4H-triazole skeleton, an organometallic iridium complex having a 1H-triazole skeleton, an organometallic iridium complex having an imidazole skeleton, an organometallic iridium complex having a phenylpyridine derivative with an electron-withdrawing group as a ligand, an organometallic iridium complex having a pyrimidine skeleton, an organometallic iridium complex having a pyrazine skeleton, an organometallic iridium complex having a pyridine skeleton, a rare earth metal complex, or a platinum complex.

[Phosphorescent Substance (Blue)]

As an organometallic iridium complex having a 4H-triazole skeleton or the like, tris{2-[5-(2-methylphenyl)-4-(2,6-dimethylphenyl)-4H-1,2,4-triazol-3-yl-κ$N^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), or the like can be used.

As an organometallic iridium complex having a 1H-triazole skeleton or the like, tris[3-methyl-1-(2-methylphenyl)-5-phenyl-1H-1,2,4-triazolato]iridium(III) (abbreviation: [Ir(Mptz1-mp)$_3$]), tris(1-methyl-5-phenyl-3-propyl-1H-1,2,4-triazolato]iridium(III) (abbreviation: [Ir(Prptz1-Me)$_3$]), or the like can be used.

As an organometallic iridium complex having an imidazole skeleton or the like, fac-tris[1-(2,6-diisopropylphenyl)-2-phenyl-1H-imidazole]iridium(III) (abbreviation: [Ir(iPrpmi)$_3$]), tris[3-(2,6-dimethylphenyl)-7-methylimidazo[1,2-f]phenanthridinato]iridium(III) (abbreviation: [Ir(dmpimpt-Me)$_3$]), or the like can be used.

As an organometallic iridium complex having a phenylpyridine derivative with an electron-withdrawing group as a ligand, or the like, bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: [Ir($CF_3$ppy)$_2$(pic)]), bis[2-(4',6'-difluorophenyl)pyridinato-N,$C^{2'}$]iridium(III) acetylacetonate (abbreviation: FIracac), or the like can be used.

Note that these are compounds exhibiting blue phosphorescence and are compounds having an emission wavelength peak at 440 nm to 520 nm.

[Phosphorescent Substance (Green)]

As an organometallic iridium complex having a pyrimidine skeleton or the like, it is possible to use, for example, tris(4-methyl-6-phenylpyrimidinato)iridium(III) (abbreviation: $[Ir(mppm)_3]$), tris(4-t-butyl-6-phenylpyrimidinato) iridium(III) (abbreviation: $[Ir(tBuppm)_3]$), (acetylacetonato) bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (acetylacetonato)bis[6-(2-norbornyl)-4-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), or (acetylacetonato) bis(4,6-diphenylpyrimidinato)iridium(III) (abbreviation: $[Ir(dppm)_2(acac)]$).

As an organometallic iridium complex having a pyrazine skeleton or the like, (acetylacetonato)bis(3,5-dimethyl-2-phenylpyrazinato)iridium(III) (abbreviation: $[Ir(mppr\text{-}Me)_2(acac)]$), (acetylacetonato)bis(5-isopropyl-3-methyl-2-phenylpyrazinato)iridium(III) (abbreviation: $[Ir(mppr\text{-}iPr)_2(acac)]$), or the like can be used.

As an organometallic iridium complex having a pyridine skeleton or the like, it is possible to use, for example, tris(2-phenylpyridinato-N,$C^{2'}$)iridium(III) (abbreviation: $[Ir(ppy)_3]$), bis(2-phenylpyridinato-N,$C^{2'}$)iridium(III) acetylacetonate (abbreviation: $[Ir(ppy)_2(acac)]$), bis(benzo[h]quinolinato)iridium(III) acetylacetonate (abbreviation: $[Ir(bzq)_2(acac)]$), tris(benzo[h]quinolinato)iridium(III) (abbreviation: $[Ir(bzq)_3]$), tris(2-phenylquinolinato-N,$C^{2'}$)iridium (III) (abbreviation: $[Ir(pq)_3]$), bis(2-phenylquinolinato-N,$C^{2'}$)iridium(III) acetylacetonate (abbreviation: $[Ir(pq)_2(acac)]$), [2-$d_3$-methyl-8-(2-pyridinyl-κN)benzofuro[2,3-b]pyridine-κC]bis[2-(5-$d_3$-methyl-2-pyridinyl-κN2)phenyl-κC]iridium(III) (abbreviation: $[Ir(5mppy\text{-}d_3)_2(mbfpypy\text{-}d_3)]$), or [2-$d_3$-methyl-(2-pyridinyl-κN)benzofuro[2,3-b]pyridine-κC]bis[2-(2-pyridinyl-κN)phenyl-κC]iridium(III) (abbreviation: $[Ir(ppy)_2(mbfpypy\text{-}d_3)]$).

An example of a rare earth metal complex is tris(acetylacetonato)(monophenanthroline)terbium(III) (abbreviation: $[Tb(acac)_3(Phen)]$).

Note that these are compounds mainly exhibiting green phosphorescence and have an emission wavelength peak at 500 nm to 600 nm. An organometallic iridium complex having a pyrimidine skeleton excels particularly in reliability or emission efficiency.

[Phosphorescent Substance (Red)]

As an organometallic iridium complex having a pyrimidine skeleton or the like, (diisobutyrylmethanato)bis[4,6-bis(3-methylphenyl)pyrimidinato]iridium(III) (abbreviation: $[Ir(5mdppm)_2(dibm)]$), bis[4,6-bis(3-methylphenyl)pyrimidinato](dipivaloylmethanato)iridium(III) (abbreviation: $[Ir(5mdppm)_2(dpm)]$), bis[4,6-di(naphthalen-1-yl)pyrimidinato](dipivaloylmethanato)iridium(III) (abbreviation: $[Ir(d1npm)_2(dpm)]$), or the like can be used.

As an organometallic iridium complex having a pyrazine skeleton or the like, (acetylacetonato)bis(2,3,5-triphenylpyrazinato)iridium(III) (abbreviation: $[Ir(tppr)_2(acac)]$), bis(2,3,5-triphenylpyrazinato)(dipivaloylmethanato)iridium (III) (abbreviation: $[Ir(tppr)_2(dpm)]$), (acetylacetonato)bis[2,3-bis(4-fluorophenyl)quinoxalinato]iridium(III) (abbreviation: $[Ir(Fdpq)_2(acac)]$), or the like can be used.

As an organometallic iridium complex having a pyridine skeleton or the like, tris(1-phenylisoquinolinato-N,$C^{2'}$) iridium(III) (abbreviation: $[Ir(piq)_3]$), bis(1-phenylisoquinolinato-N,$C^{2'}$)iridium(III) acetylacetonate (abbreviation: $[Ir(piq)_2(acac)]$), or the like can be used.

As a rare earth metal complex or the like, tris(1,3-diphenyl-1,3-propanedionato)(monophenanthroline)europium(III) (abbreviation: $[Eu(DBM)_3(Phen)]$), tris[1-(2-thenoyl)-3,3,3-trifluoroacetonato](monophenanthroline) europium(III) (abbreviation: $[Eu(TTA)_3(Phen)]$), or the like can be used.

As a platinum complex or the like, 2,3,7,8,12,13,17,18-octaethyl-21H,23H-porphyrin platinum(II) (abbreviation: PtOEP) or the like can be used.

Note that these are compounds exhibiting red phosphorescence and have an emission peak at 600 nm to 700 nm. Furthermore, from the organometallic iridium complex having a pyrazine skeleton, red light emission with chromaticity favorably used for display apparatuses can be obtained.

[Substance Exhibiting Thermally Activated Delayed Fluorescence (TADF)]

A TADF material can be used for the layer 111X. For example, any of the TADF materials given below can be used as the light-emitting material. Note that without being limited thereto, any of a variety of known TADF materials can be used as the light-emitting material.

In the TADF material, the difference between the S1 level and the T1 level is small, and reverse intersystem crossing (upconversion) from the triplet excited state into the singlet excited state can be achieved by a little thermal energy. Thus, the singlet excited state can be efficiently generated from the triplet excited state. In addition, the triplet excitation energy can be converted into light.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

Examples of the TADF material include a fullerene, a derivative thereof, an acridine, a derivative thereof, and an eosin derivative. Furthermore, porphyrin containing a metal such as magnesium (Mg), zinc (Zn), cadmium (Cd), tin (Sn), platinum (Pt), indium (In), or palladium (Pd) can be also used for the TADF material.

Specifically, any of the following materials whose structural formulae are shown below can be used: a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), an octaethylporphyrin-platinum chloride complex ($PtCl_2OEP$), and the like.

[Chemical Formula 1]
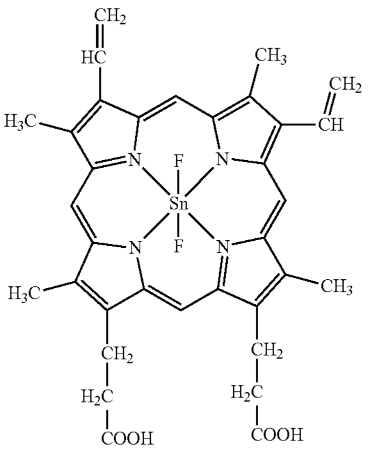
$SnF_2$(Proto IX)
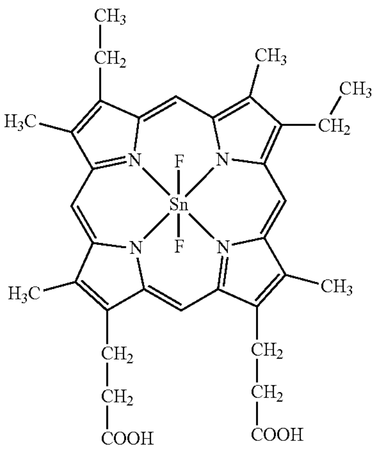
$SnF_2$(Meso IX)
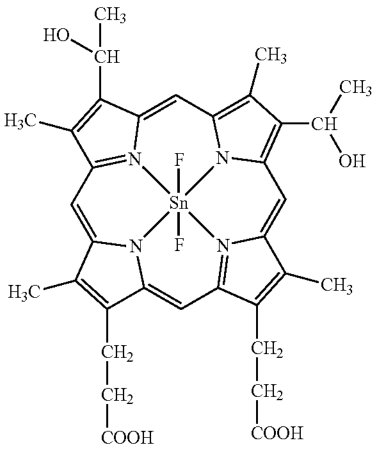
$SnF_2$(Hemato IX)
-continued
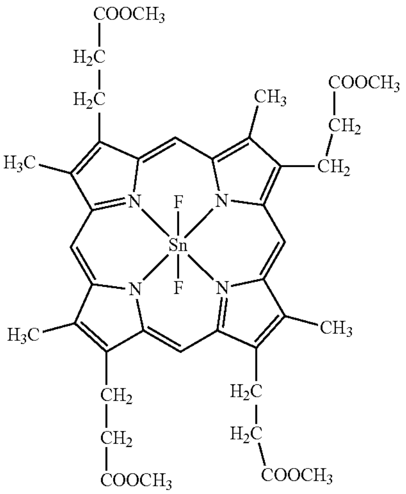
$SnF_2$(Copro III-4Me)
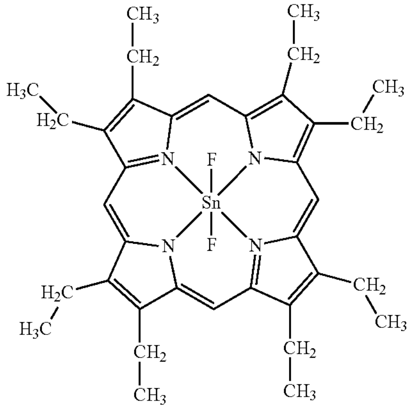
$SnF_2$(OEP)
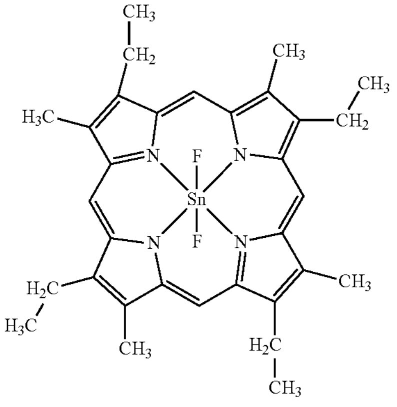
$SnF_2$(Etio I)

-continued

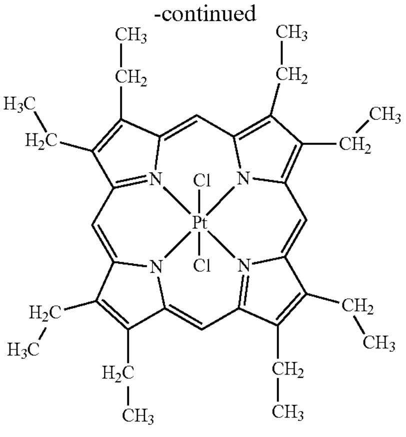

$PtCl_2OEP$

Furthermore, a heterocyclic compound including one or both of a π-electron rich heteroaromatic ring and a π-electron deficient heteroaromatic ring can be used, for example, for the TADF material.

Specifically, any of the following materials whose structural formulae are shown below can be used: 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), and the like.

[Chemical Formula 2]

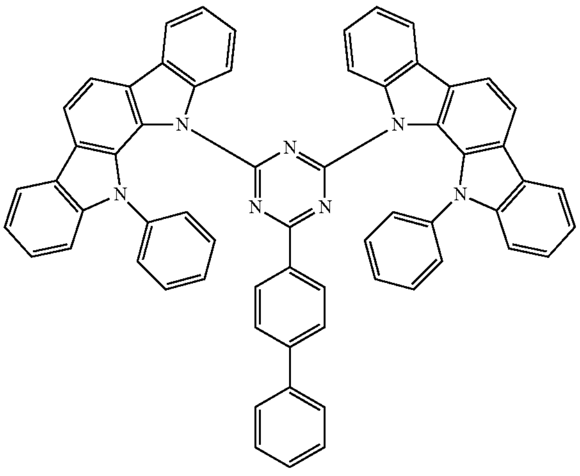

PIC-TRZ

-continued

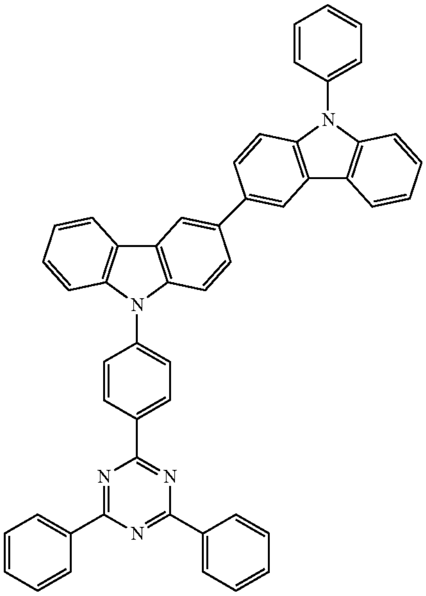

PCCzPTzn

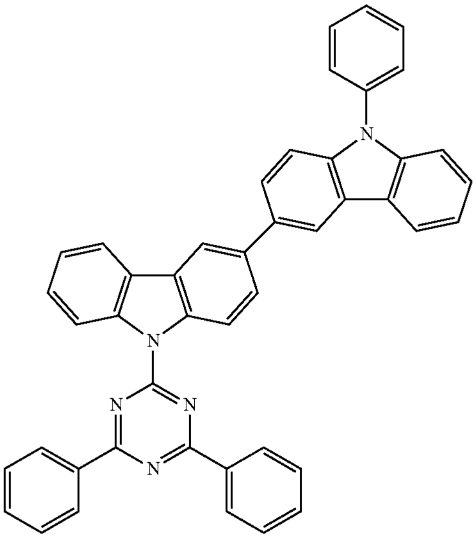

PCCzTzn

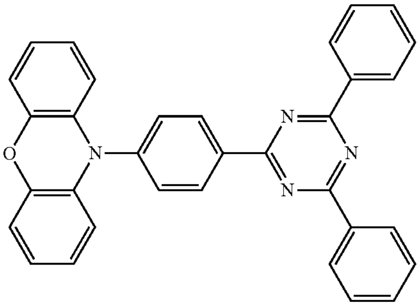

PXZ-TRZ

-continued

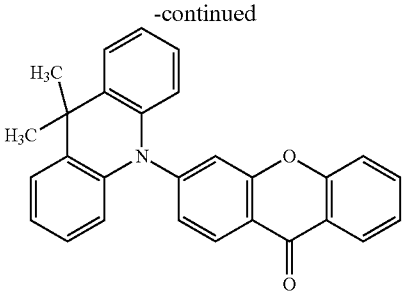

ACRXTN

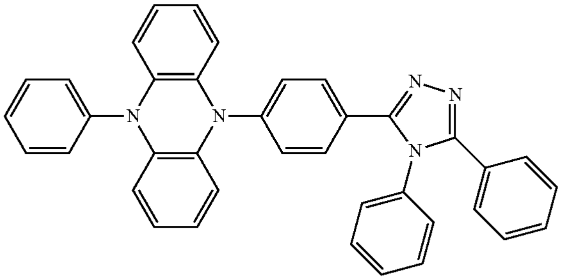

PPZ-3TPT

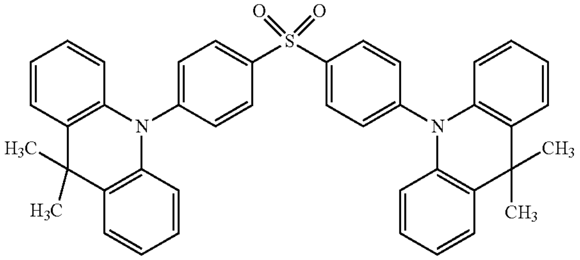

DMAC-DPS

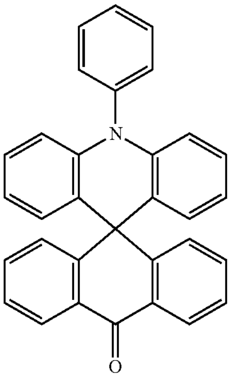

ACRSA

Such a heterocyclic compound is preferable because of having excellent electron-transport and hole-transport properties owing to a π-electron rich heteroaromatic ring and a π-electron deficient heteroaromatic ring. Among skeletons having the π-electron deficient heteroaromatic ring, in particular, a pyridine skeleton, a diazine skeleton (a pyrimidine skeleton, a pyrazine skeleton, and a pyridazine skeleton), and a triazine skeleton are preferable because of their high stability and reliability. In particular, a benzofuropyrimidine skeleton, a benzothienopyrimidine skeleton, a benzofuropyrazine skeleton, and a benzothienopyrazine skeleton are preferable because of their high electron-accepting properties and reliability.

Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; thus, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which the π-electron rich heteroaromatic ring is directly bonded to the π-electron deficient heteroaromatic ring is particularly preferable because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used.

As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a nitrile group or a cyano group such as benzonitrile or cyanobenzene, a carbonyl skeleton such as benzophenone, a phosphine oxide skeleton, a sulfone skeleton, or the like can be used.

As described above, a π-electron deficient skeleton and a π-electron rich skeleton can be used instead of at least one of the π-electron deficient heteroaromatic ring and the π-electron rich heteroaromatic ring.

Structure Example 3 of Layer 111X

A material having a carrier-transport property can be used as the host material. For example, a material having a hole-transport property, a material having an electron-transport property, a substance exhibiting thermally activated delayed fluorescence (TADF), a material having an anthracene skeleton, or a mixed material can be used as the host material. A material having a wider band gap than the light-emitting material contained in the layer 111X is preferably used as the host material. In that case, energy transfer from excitons generated in the layer 111X to the host material can be inhibited.

[Material Having Hole-Transport Property]

A material having a hole mobility higher than or equal to $1\times10^{-6}$ $cm^2/Vs$ can be suitably used as the material having a hole-transport property.

As the material having a hole-transport property, an amine compound or an organic compound having a π-electron rich heteroaromatic ring skeleton can be used, for example. Specifically, a compound having an aromatic amine skeleton, a compound having a carbazole skeleton, a compound having a thiophene skeleton, a compound having a furan skeleton, or the like can be used. In particular, a compound having an aromatic amine skeleton and a compound having a carbazole skeleton are preferable because these have favorable reliability, have high hole-transport properties, and contribute to a reduction in driving voltage.

The following are examples that can be used as the compound having an aromatic amine skeleton: 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine (abbreviation: PCBASF).

As the compound having a carbazole skeleton, for example, 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), or the like can be used.

As the compound having a thiophene skeleton, for example, 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), or the like can be used.

As the compound having a furan skeleton, for example, 4,4',4"-(benzene-1,3,5-triyl)tri(dibenzofuran) (abbreviation: DBF3P-II), 4-{3-[3-(9-phenyl-9H-fluoren-9-yl)phenyl]phenyl}dibenzofuran (abbreviation: mmDBFFLBi-II), or the like can be used.

[Material Having Electron-Transport Property]

For example, a metal complex or an organic compound having a π-electron deficient heteroaromatic ring skeleton can be used as the material having an electron-transport property.

As the metal complex, bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), bis[2-(2-benzothiazolyl)phenolato]zinc(II) (abbreviation: ZnBTZ), or the like can be used, for example.

As the organic compound having a π-electron deficient heteroaromatic ring skeleton, a heterocyclic compound having a polyazole skeleton, a heterocyclic compound having a diazine skeleton, a heterocyclic compound having a pyridine skeleton, a heterocyclic compound having a triazine skeleton, or the like can be used, for example. In particular, the heterocyclic compound having a diazine skeleton or the heterocyclic compound having a pyridine skeleton has favorable reliability and thus is preferable. Furthermore, the heterocyclic compound having a diazine (pyrimidine or pyrazine) skeleton has a high electron-transport property and can contribute to a reduction in driving voltage.

As the heterocyclic compound having a polyazole skeleton, 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or the like can be used, for example.

As the heterocyclic compound having a diazine skeleton, 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,8-bis[3-(dibenzothiophen-4-yl)phenyl]benzo[h]quinazoline (abbreviation: 4,8mDBtP2Bqn), or the like can be used, for example.

As the heterocyclic compound having a pyridine skeleton, 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), or the like can be used, for example.

As the heterocyclic compound having a triazine skeleton, 2-[3'-(9,9-dimethyl-9H-fluoren-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), or the like can be used, for example.

[Material Having Anthracene Skeleton]

An organic compound having an anthracene skeleton can be used as the host material. In particular, when a fluorescent substance is used as the light-emitting substance, an organic compound having an anthracene skeleton is preferably used. In that case, a light-emitting device with high emission efficiency and high durability can be obtained.

As the organic compound having an anthracene skeleton, an organic compound having a diphenylanthracene skeleton, in particular, a 9,10-diphenylanthracene skeleton is chemically stable and thus is preferable. The host material preferably has a carbazole skeleton, in which case the hole-injection and hole-transport properties are improved. In particular, the host material preferably has a dibenzocarbazole skeleton, in which case the HOMO (Highest Occupied Molecular Orbital) level thereof is shallower than that of carbazole by approximately 0.1 eV, so that holes enter the host material easily, the hole-transport property is improved, and the heat resistance is increased. Note that in terms of the hole-injection and hole-transport properties, a benzofluorene skeleton or a dibenzofluorene skeleton may be used instead of a carbazole skeleton.

Thus, a substance having both a 9,10-diphenylanthracene skeleton and a carbazole skeleton, a substance having both a 9,10-diphenylanthracene skeleton and a benzocarbazole skeleton, or a substance having both a 9,10-diphenylanthracene skeleton and a dibenzocarbazole skeleton is preferable as the host material.

For example, it is possible to use 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9-(1-naphthyl)-10-[4-(2-naphthyl)phenyl]anthracene (abbreviation: α,N-βNPAnth), 9-phenyl-3-[4-(10-phenyl-9-anthryl)phenyl]-9H-carbazole (abbreviation: PCzPA), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), or 3-[4-(1-naphthyl)-phenyl]-9-phenyl-9H-carbazole (abbreviation: PCPN).

In particular, CzPA, cgDBCzPA, 2mBnfPPA, and PCzPA have excellent characteristics.

[Substance Exhibiting Thermally Activated Delayed Fluorescence (TADF)]

A TADF material can be used as the host material. When the TADF material is used as the host material, triplet excitation energy generated in the TADF material can be converted into singlet excitation energy by reverse intersystem crossing. Moreover, excitation energy can be transferred to the light-emitting substance. In other words, the TADF material functions as an energy donor, and the light-emitting substance functions as an energy acceptor. Thus, the emission efficiency of the light-emitting device can be increased.

This is very effective in the case where the light-emitting substance is a fluorescent substance. In that case, the S1 level of the TADF material is preferably higher than that of the fluorescent substance in order that high emission efficiency can be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength of a lowest-energy-side absorption band of the fluorescent substance, in which case excitation energy is transferred smoothly from the TADF material to the fluorescent substance and light emission can be obtained efficiently.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protecting group around a luminophore (a skeleton which causes light emission) of the fluorescent substance. As the protecting group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protecting groups. The substituents having no π bond are poor in carrier-transport performance, whereby the TADF material and the luminophore of the fluorescent substance can be made away from each other with little influence on carrier transport or carrier recombination.

Here, the luminophore refers to an atomic group (skeleton) that causes light emission in a fluorescent substance. The luminophore is preferably a skeleton having a π bond, further preferably includes an aromatic ring, still further preferably includes a condensed aromatic ring or a condensed heteroaromatic ring.

Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferable because of its high fluorescence quantum yield.

For example, the TADF material that can be used as the light-emitting material can be used as the host material.

Structure Example 1 of Mixed Material

A material in which a plurality of kinds of substances are mixed can be used as the host material. For example, a material that contains an electron-transport material and a hole-transport material can be used as the mixed material. The weight ratio between the hole-transport material and the electron-transport material contained in the mixed material may be (the hole-transport material/the electron-transport material)=(1/19) or more and (19/1) or less. Accordingly, the carrier-transport property of the layer 111X can be easily adjusted. In addition, a recombination region can be controlled easily.

Structure Example 2 of Mixed Material

A material mixed with a phosphorescent substance can be used as the host material. When a fluorescent substance is used as the light-emitting substance, a phosphorescent substance can be used as an energy donor for supplying excitation energy to the fluorescent substance.

Structure Example 3 of Mixed Material

A mixed material containing a material to form an exciplex can be used as the host material. For example, a material forming an exciplex whose emission spectrum overlaps with the wavelength of the absorption band on the lowest energy side of the light-emitting substance can be used as the host material. This enables smooth energy transfer and improves emission efficiency. Alternatively, the driving voltage can be reduced. With such a structure, light emission can be efficiently obtained by ExTET (Exciplex-Triplet Energy Transfer), which is energy transfer from an exciplex to a light-emitting substance (a phosphorescent material).

A phosphorescent substance can be used as at least one of the materials forming an exciplex. Accordingly, reverse intersystem crossing can be used. Alternatively, triplet excitation energy can be efficiently converted into singlet excitation energy.

A combination of materials forming an exciplex is preferably such that the HOMO level of a material having a hole-transport property is higher than or equal to the HOMO level of a material having an electron-transport property. Alternatively, the LUMO (Lowest Unoccupied Molecular Orbit) level of the material having a hole-transport property is preferably higher than or equal to the LUMO level of the material having an electron-transport property. In that case, an exciplex can be efficiently formed. Note that the LUMO levels and the HOMO levels of the materials can be derived from the electrochemical characteristics (the reduction potentials and the oxidation potentials). Specifically, the reduction potentials and the oxidation potentials can be measured by cyclic voltammetry (CV).

The formation of an exciplex can be confirmed by a phenomenon in which the emission spectrum of a mixed film in which the material having a hole-transport property and the material having an electron-transport property are mixed is shifted to a longer wavelength than the emission spectrum of each of the materials (or has another peak on the longer wavelength side) observed in comparison of the emission spectrum of the material having a hole-transport property, the emission spectrum of the material having an electron-transport property, and the emission spectrum of the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed in comparison of transient PL of the material having a hole-transport property, the transient PL of the material having an electron-transport property, and the transient PL of the mixed film of these materials. The transient PL can be rephrased as transient electroluminescence (EL). That is, the formation of an exciplex can also be confirmed by a difference in transient response observed in comparison of the transient EL of the material having a hole-transport property, the transient EL of the material having an electron-transport property, and the transient EL of the mixed film of these materials.

Structure Example of Layer 111X2

The layer 111X2 contains a light-emitting material EM2. The light-emitting material EM2 has an emission spectrum $\phi 2$ having the maximum at the wavelength $\lambda$2 (see FIG. 1). The layer 111X2 has the ordinary refractive index n2 at the wavelength $\lambda$2. The layer 111X2 has an ordinary refractive index higher than or equal to 1.75 and lower than or equal to 2.1 with respect to light with a wavelength in the range of 455 nm to 465 nm, for example. In addition, the layer 111X2 has an ordinary refractive index higher than or equal to 1.70 and lower than or equal to 2.05 with respect to light with a wavelength of 633 nm.

Note that the wavelength $\lambda$2 can be determined from the maximum of an emission spectrum of a solution of the light-emitting material EM2. For example, an organic solvent such as toluene can be used for adjusting the solution of the light-emitting material EM2.

The wavelength $\lambda$2 can be determined from the maximum of a spectrum of the light ELX2 emitted from the light-emitting device 550X2.

Note that the structure that can be used for the layer 111X can be used for the layer 111X2. For example, the same structure as the layer 111X can be used for the layer 111X2.

Alternatively, a structure different from that of the layer 111X can be used for the layer 111X2. For example, the structure emitting light whose hue is different from that of light emitted from the layer 111X can be used for the layer 111X2.

For example, a structure in which one light selected from blue, green, red, and the like is used for the layer 111X, and a structure in which light of another color is emitted can be used for the layer 111X2. Specifically, a structure in which blue light is emitted can be used for the layer 111X, and a structure in which red light is emitted can be used for the layer 111X2. A structure in which blue light is emitted can be used for the layer 111X, and a structure in which yellow light is emitted can be used for the layer 111X2. A structure in which blue light is emitted can be used for the layer 111X, and a structure in which green light is emitted can be used for the layer 111X2. Accordingly, a light-emitting device that emits light of a desired color can be provided. For example, a light-emitting device that emits white light can be provided.

Note that in the case where the layer 111X2 contains the light-emitting material EM2 and a host material HO2 and the light-emitting material EM2 has an emission spectrum having the maximum at the wavelength $\lambda$2, the host material HO2 formed into a film has the ordinary refractive index n2 at the wavelength $\lambda$2.

Structure Example 1 of Layer LN

The layer LN has the ordinary refractive index n31 which is lower than the ordinary refractive index n1 at the wavelength $\lambda$1. The layer LN has the ordinary refractive index n32 which is lower than the ordinary refractive index n2 at the wavelength $\lambda$2. Note that in order to measure the refractive index of the layer LN, a material contained in the layer LN can be formed into a film. For example, in the case where the layer LN contains a plurality of substances, each of the substances may be formed into a film to measure the refractive index. The difference between the ordinary refractive index n1 and the ordinary refractive index n31 is preferably greater than or equal to 0.12, further preferably greater than or equal to 0.15. The difference between the ordinary refractive index n2 and the ordinary refractive index n32 is preferably greater than or equal to 0.12, further preferably greater than or equal to 0.15. The layer between the layer 111X and the layer LN has an ordinary refractive index higher than or equal to 1.75 and lower than or equal to 2.1 with respect to light with a wavelength in the range of 455 nm to 465 nm. In addition, the layer between the layer 111X and the layer LN has an ordinary refractive index higher than or equal to 1.70 and lower than or equal to 2.05 with respect to light with a wavelength of 633 nm. The same applies to a layer between the layer 111X2 and the layer LN. When the layer whose ordinary refractive index is in the above ranges is in contact with the layer LN, light is reflected at the interface thereof.

Structure Example 2 of Layer LN

The layer LN has an ordinary refractive index higher than or equal to 1.50 and lower than or equal to 1.75 with respect to light with a wavelength in the range of 455 nm to 465 nm. In addition, the layer LN has an ordinary refractive index higher than or equal to 1.45 and lower than or equal to 1.70 with respect to light with a wavelength of 633 nm.

Structure Example 3 of Layer LN

The layer LN has a distance d1 from a center plane of the layer 111X, and the layer LN has a distance d2 from a center plane of the layer 111X2 (see FIG. 1A). The layer LN has a thickness t3.

The distance d1, the distance d2, the thickness t3, the wavelength $\lambda$1, the wavelength $\lambda$2, the ordinary refractive index n1, the ordinary refractive index n2, the ordinary refractive index n31, and the ordinary refractive index n32 satisfy the following Formula (1) and Formula (2). When an interface where a layer whose ordinary refractive index is higher than the layer LN and the layer LN are in contact with each other is placed at a predetermined distance from the layer 111X, weakening of the intensity of light due to an interference effect can be prevented, whereby the intensity of light with a predetermined wavelength can be increased. When an interface where a layer whose ordinary refractive index is higher than the layer LN and the layer LN are in contact with each other is placed at a predetermined distance from the layer 111X2, a similar effect can be obtained.

[Formula 2]

$$n1 \times d1 + n31 \times t3 < \frac{1}{2} \times \lambda 1 \quad (1)$$

$$n2 \times d2 + n32 \times t3 < \frac{1}{2} \times \lambda 2 \quad (2)$$

Accordingly, the light ELX emitted from the layer 111X and the light ELX2 emitted from the layer 111X2 can be extracted efficiently. Consequently, a novel light-emitting device that is highly convenient, useful, or reliable can be provided.

Structure Example 4 of Layer LN

The layer LN has a giant surface potential (GSP). The potential gradient (the slope of GSP) where the GSP is divided by the thickness t3 is preferably less than or equal to 20 mV/nm. The value (ΔGSP) obtained by subtracting the slope of GSP of the layer 111X from the slope of GSP of the layer LN is preferably less than or equal to 10 mV/nm, further preferably less than or equal to 0 mV/nm. The same applies to a value (ΔGSP) obtained by subtracting the slope of GSP of the layer 111X2 from the slope of GSP of the layer LN. With such a structure, carrier injection to the light-emitting layer can be favorable.

The giant surface potential refers to a phenomenon in which a surface potential of an evaporated film increases in proportion to a film thickness, and can be described as spontaneous orientation polarization due to slight deviation of a permanent dipole moment of an organic compound to the thickness direction. In order to treat the surface potential as a value independent of a film thickness, a value obtained by dividing the surface potential of an evaporated film by the film thickness, that is, the potential gradient (slope) of the surface potential of an evaporated film, is used. In this specification, the potential gradient of the surface potential of an evaporated film is denoted by the slope of GSP (mV/nm).

A method for obtaining the slope of GSP of an organic compound will be described.

In general, a slope of a plot of a surface potential of an evaporated film in the thickness direction by Kelvin probe measurement is assumed as the level of the giant surface potential, that is, the slope of GSP (mV/nm); in the case where two different layers are stacked, a change in the density of polarization charges ($mC/m^2$) accumulated at the interface, which is in association with the slope of GSP, can be utilized to estimate the slope of GSP.

The following formulae are satisfied when current is made to flow through a stack of organic thin films (a thin film 1 and a thin film 2; note that the thin film 1 is located on the anode side and the thin film 2 is located on the cathode side) with different kinds of spontaneous polarization.

[Formula 3]

$$\sigma_{if} = \frac{Q_{if}}{s} = (V_i - V_{bi})\frac{\varepsilon_2}{d_2} \quad (3)$$

[Formula 4]

$$\sigma_{if} = P_1 - P_2 = \frac{\varepsilon_1 V_1}{d_1} - \frac{\varepsilon_2 V_2}{d_2} \quad (4)$$

In Formula (3), $\sigma_{if}$ is a polarization charge density, $V_i$ is a hole-injection voltage, $V_{bi}$ is a threshold voltage, $d_2$ is a thickness of the thin film 2, and $\varepsilon_2$ is a dielectric constant of the thin film 2. Note that $V_i$ and $V_{bi}$ can be estimated from the capacity-voltage characteristics of a device. The square of an ordinary refractive index $n_o$(633 nm) can be used as the dielectric constant. As described above, according to Formula (3), the polarization charge density $\sigma_{if}$ can be calculated using $V_i$ and $V_{bi}$ estimated from the capacity-voltage characteristics, the dielectric constant $\varepsilon_2$ of the thin film 2 calculated from the refractive index, and the thickness $d_2$ of the thin film 2.

Next, in Formula (4), $\sigma_{if}$ is a polarization charge density, $P_n$ is the slope of GSP of a thin film n, $\varepsilon_n$ is the dielectric constant of the thin film n, and $d_n$ is the thickness of the thin film n. Since the polarization charge density $\sigma_{if}$ can be obtained from Formula (3) above, the use of a substance with the known slope of GSP for the thin film 2 enables the slope of GSP of the thin film 1 to be estimated.

In this specification, an evaporation film of an organic compound with the slope of GSP to be obtained is formed as the thin film 1, and a thin film using tris(8-quinolinolato) aluminum (abbreviation: Alq3) is formed as the thin film 2. Note that the slope of GSP of Alq3 is 48 mV/nm.

The orientation of an evaporated film is known to depend on the substrate temperature in evaporation, and the value of the slope of GSP also possibly depends on the substrate temperature in evaporation. The measured values in this specification are values of films evaporated with the substrate temperature set to room temperature.

Structure Example of Light-Emitting Material EM1

The wavelength λ1 is in the range of 430 nm to 490 nm.

Structure Example 1 of Light-Emitting Material EM2

The wavelength λ2 is in the range of 430 nm to 490 nm.

Structure Example 2 of Light-Emitting Material EM2

The light-emitting material EM2 is the same material as the light-emitting material EM1.

Accordingly, the light ELX emitted from the layer 111X and the light ELX2 emitted from the layer 111X2 can be extracted efficiently. In addition, a light-emitting device with a high blue index can be obtained. Consequently, a novel light-emitting device that is highly convenient, useful, or reliable can be provided.

Structure Example 2 of Light-Emitting Device 550X

The light-emitting device 550X described in this embodiment includes a layer 112_11 (see FIG. 1A). The layer 112_11 is interposed between the electrode 551X and the layer 111X.

Structure Example 1 of Layer 112_11>

The layer 112_11 has the ordinary refractive index n41 which is lower than the ordinary refractive index n1 at the wavelength λ1, and the layer 112_11 has the ordinary refractive index n42 which is lower than the ordinary refractive index n2 at the wavelength λ2. Note that the difference between the ordinary refractive index n1 and the ordinary refractive index n41 is preferably greater than or equal to 0.12, further preferably greater than or equal to 0.15. The difference between the ordinary refractive index n2 and the ordinary refractive index n42 is preferably greater than or equal to 0.12, further preferably greater than or equal to 0.15.

Structure Example 2 of Layer 112_11>>

The layer 11211 has an ordinary refractive index higher than or equal to 1.50 and lower than or equal to 1.75 with respect to light with a wavelength in the range of 455 nm to 465 nm. In addition, the layer 112_11 has an ordinary refractive index higher than or equal to 1.45 and lower than or equal to 1.70 with respect to light with a wavelength of 633 nm.

For example, a material that can be used for the layer LN can be used for the layer 112_11.

Note that this embodiment can be combined with any of the other embodiments described in this specification as appropriate.

Embodiment 2

In this embodiment, a structure of the light-emitting device 550X of one embodiment of the present invention is described with reference to FIG. 2.

Figure 2:
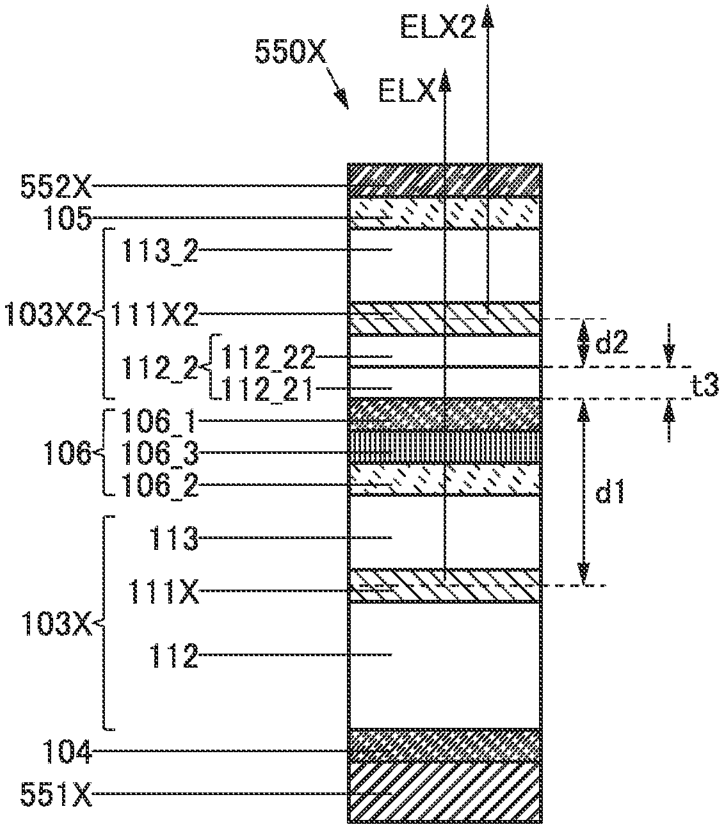
FIG. 2 is a diagram illustrating a structure of a light-emitting device of an embodiment.

FIG. 2 is a cross-sectional view illustrating a structure of the light-emitting device of one embodiment of the present invention.

Structure Example 1 of Light-Emitting Device 550X

The light-emitting device 550X described in this embodiment includes the electrode 551X, the electrode 552X, a unit 103X, a layer 104, and a layer 105 (see FIG. 2). The light-emitting device 550X includes a unit 103X2 and a layer 106.

The unit 103X is interposed between the electrode 551X and the electrode 552X.

The layer 104 is interposed between the unit 103X and the electrode 551X, and the layer 105 is interposed between the electrode 552X and the unit 103X2.

The unit 103X2 is interposed between the electrode 552X and the unit 103X.

The layer 106 is interposed between the unit 103X2 and the unit 103X.

Structure Example of Unit 103X

The unit 103X has a single-layer structure or a stacked-layer structure. For example, the unit 103X includes the layer 111X, a layer 112, and a layer 113 (see FIG. 2). The unit 103X has a function of emitting the light ELX.

The layer 111X is interposed between the layer 112 and the layer 113, the layer 112 is interposed between the electrode 551X and the layer 111X, and the layer 113 is interposed between the electrode 552X and the layer 111X.

For example, a layer selected from functional layers such as a light-emitting layer, a hole-transport layer, an electron-transport layer, and a carrier-blocking layer can be used in the unit 103X. Moreover, a layer selected from functional layers such as a hole-injection layer, an electron-injection layer, an exciton-blocking layer, and a charge-generation layer can be used in the unit 103X.

Structure Example of Layer 111X

For example, the structure of the layer 111X described in Embodiment 1 can be used for the layer 111X.

Structure Example of Layer 112

For example, a material having a hole-transport property can be used for the layer 112. The layer 112 can be referred to as a hole-transport layer. A material having a wider band gap than the light-emitting material contained in the layer 111X is preferably used for the layer 112. In that case, energy transfer from excitons generated in the layer 111X to the layer 112 can be inhibited.

[Material Having Hole-Transport Property]

A material having a hole mobility higher than or equal to $1\times10^{-6}$ $cm^2/Vs$ can be suitably used as the material having a hole-transport property.

For example, a material having a hole-transport property that can be used for the layer 111X can be used for the layer 112. Specifically, a material having a hole-transport property that can be used as the host material can be used for the layer 112.

Structure Example of Layer 113

A material having an electron-transport property, a material having an anthracene skeleton, or a mixed material can be used for the layer 113, for example. The layer 113 can be referred to as an electron-transport layer. A material having a wider band gap than the light-emitting material contained in the layer 111X is preferably used for the layer 113. In that case, energy transfer from excitons generated in the layer 111X to the layer 113 can be inhibited.

[Material Having Electron-Transport Property]

For example, a metal complex or an organic compound having a π-electron deficient heteroaromatic ring skeleton can be used as the material having an electron-transport property.

For example, a material having an electron-transport property that can be used for the layer 111X can be used for the layer 113. Specifically, a material having an electron-transport property that can be used as the host material can be used for the layer 113.

[Material Having Anthracene Skeleton]

An organic compound having an anthracene skeleton can be used for the layer 113. In particular, an organic compound having both an anthracene skeleton and a heterocyclic skeleton can be suitably used.

For example, an organic compound having both an anthracene skeleton and a nitrogen-containing five-membered ring skeleton can be used. Alternatively, an organic compound having both an anthracene skeleton and a nitrogen-containing five-membered ring skeleton where two heteroatoms are included in a ring can be used. Specifically, a pyrazole ring, an imidazole ring, an oxazole ring, a thiazole ring, or the like can be favorably used as the heterocyclic skeleton.

For example, an organic compound having both an anthracene skeleton and a nitrogen-containing six-membered ring skeleton can be used. Alternatively, an organic compound having both an anthracene skeleton and a nitrogen-containing six-membered ring skeleton where two heteroatoms are included in a ring can be used. Specifically, a pyrazine ring, a pyrimidine ring, a pyridazine ring, or the like can be favorably used as the heterocyclic skeleton.

Structure Example of Mixed Material

A material in which a plurality of kinds of substances are mixed can be used for the layer 113. Specifically, a mixed material that contains a substance having an electron-transport property and any of an alkali metal, an alkali metal compound, and an alkali metal complex can be used for the layer 113. Note that it is further preferable that the HOMO level of the material having an electron-transport property be higher than or equal to −6.0 eV.

Structure Example of Electrode 551X

For example, a conductive material can be used for the electrode 551X. Specifically, a single layer or a stacked layer of a metal, an alloy, or a film containing a conductive compound can be used for the electrode 551X.

For example, a film that efficiently reflects light can be used for the electrode 551X. Specifically, an alloy containing silver, copper, and the like, an alloy containing silver, palladium, and the like, or a metal film of aluminum or the like can be used for the electrode 551X.

Alternatively, for example, a metal film that transmits part of light and reflects the other part of the light can be used as the electrode 551X. Thus, a microcavity structure (microcavity) can be provided in the light-emitting device 550X. Light of a predetermined wavelength can be extracted more efficiently than other light. Light with a narrow half width of a spectrum can be extracted. Light of a bright color can be extracted.

A film having a property of transmitting visible light can be used for the electrode 551X, for example. Specifically, a single layer or a stacked layer of a metal film, an alloy film, a conductive oxide film, or the like that is thin enough to transmit light can be used for the electrode 551X.

In particular, a material having a work function higher than or equal to 4.0 eV can be suitably used for the electrode 551X.

For example, a conductive oxide containing indium can be used. Specifically, indium oxide, indium oxide-tin oxide (abbreviation: ITO), indium oxide-tin oxide containing silicon or silicon oxide (abbreviation: ITSO), indium oxide-zinc oxide, indium oxide containing tungsten oxide and zinc oxide (abbreviation: IWZO), or the like can be used.

Furthermore, for example, a conductive oxide containing zinc can be used. Specifically, zinc oxide, zinc oxide to which gallium is added, zinc oxide to which aluminum is added, or the like can be used.

Furthermore, for example, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used. Alternatively, graphene can be used.

Structure Example 1 of Layer 104

For example, a material having a hole-injection property can be used for the layer 104. The layer 104 can be referred to as a hole-injection layer.

For example, a material having a hole mobility lower than or equal to $1\times10^{-3}$ cm/Vs when the square root of the electric field strength [V/cm] is 600 can be used for the layer 104. A film having an electrical resistivity greater than or equal to $1\times10^{4}$ [Ω·cm] and less than or equal to $1\times10^{7}$ [Ω·cm] can be used as the layer 104. The electrical resistivity of the layer 104 is preferably greater than or equal to $5\times10^{4}$ [Ω·cm] and less than or equal to $1\times10^{7}$ [Ω·cm], further preferably greater than or equal to $1\times10^{5}$ [Ω·cm] and less than or equal to $1\times10^{7}$ [Ω·cm].

Structure Example 2 of Layer 104

Specifically, a substance having an electron-accepting property can be used for the layer 104. A composite material containing a plurality of kinds of substances can be used for the layer 104. This can facilitate injection of holes from the electrode 551X, for example. Alternatively, the driving voltage of the light-emitting device 550X can be lowered.

[Substance Having Electron-Accepting Property]

An organic compound and an inorganic compound can be used as the substance having an electron-accepting property. The substance having an electron-accepting property can extract electrons from an adjacent hole-transport layer or an adjacent material having a hole-transport property by the application of an electric field.

For example, a compound having an electron-withdrawing group (a halogen group or a cyano group) can be used as the substance having an electron-accepting property. That is, the layer 104 preferably contains an organic compound having a halogen group or a cyano group. Fluorine (a fluoro group) is particularly preferable as the halogen group. Note that an organic compound having an electron-accepting property is easily evaporated and deposited. As a result, the productivity of the light-emitting device 550X can be increased.

Specifically, it is possible to use, for example, 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylen-1,3,4,5,6,8,9,10-octafluoro-7H-pyren-2-ylidene)malononitrile.

A compound in which electron-withdrawing groups are bonded to a condensed aromatic ring having a plurality of heteroatoms, such as HAT-CN, is particularly preferable because it is thermally stable.

Alternatively, a [3]radialene derivative having an electron-withdrawing group (in particular, a cyano group or a halogen group such as a fluoro group) is preferable because it has a very high electron-accepting property.

Specifically, it is possible to use, for example, α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], or α,α',α"-1,2,3-cyclopropanetriylidenetris[2,3,4,5,6-pentafluorobenzeneacetonitrile].

As the substance having an electron-accepting property, a transition metal oxide such as molybdenum oxide, vanadium oxide, ruthenium oxide, tungsten oxide, or manganese oxide can be used. That is, the layer 104 preferably contains a transition metal oxide.

Alternatively, it is possible to use phthalocyanine (abbreviation: $H_2Pc$), a phthalocyanine-based complex compound such as copper phthalocyanine (CuPc), and compounds having an aromatic amine skeleton such as 4,4'-bis[N-(4-diphenylaminophenyl)-N-phenylamino]biphenyl (abbreviation: DPAB) and N,N'-bis{4-[bis(3-methylphenyl)amino]phenyl}-N,N'-diphenyl-(1,1'-biphenyl)-4,4'-diamine (abbreviation: DNTPD).

Furthermore, a high molecular compound such as poly(3,4-ethylenedioxythiophene)/poly(styrenesulfonic acid) (PEDOT/PSS) can be used.

Structure Example 1 of Composite Material

For example, a composite material containing a substance having an electron-accepting property and a material having a hole-transport property can be used for the layer 104. Thus, not only a material having a high work function, but also a material having a low work function can be used for the electrode 551X. Alternatively, a material used for the electrode 551X can be selected from a wide range of materials regardless of its work function.

As the material having a hole-transport property in the composite material, for example, a compound having an aromatic amine skeleton, a carbazole derivative, an aromatic hydrocarbon, an aromatic hydrocarbon having a vinyl group, a high molecular compound (such as an oligomer, a dendrimer, or a polymer), or the like can be used. A material having a hole mobility of $1\times10^{-6}$ $cm^2/Vs$ or higher can be suitably used as the material having a hole-transport property in the composite material.

A substance having a relatively deep HOMO level can be suitably used as the material having a hole-transport property in the composite material. Specifically, the HOMO level is preferably higher than or equal to −5.7 eV and lower than or equal to −5.4 eV. In that case, hole injection to the unit 103X can be facilitated. Alternatively, hole injection to the layer 112 can be facilitated. Alternatively, the reliability of the light-emitting device 550X can be increased.

As the compound having an aromatic amine skeleton, it is possible to use, for example, N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), or 1,3,5-tris[N-(4-diphenylaminophenyl)-N-phenylamino]benzene (abbreviation: DPA3B).

As the carbazole derivative, it is possible to use, for example, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), or 1,4-bis[4-(N-carbazolyl)phenyl]-2,3,5,6-tetraphenylbenzene.

As the aromatic hydrocarbon, it is possible to use, for example, 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, or coronene.

As the aromatic hydrocarbon having a vinyl group, it is possible to use, for example, 4,4'-bis(2,2-diphenylvinyl)biphenyl (abbreviation: DPVBi) or 9,10-bis[4-(2,2-diphenylvinyl)phenyl]anthracene (abbreviation: DPVPA).

As the high molecular compound, it is possible to use, for example, poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), or poly[N,N'-bis(4-butylphenyl)-N,N'-bis(phenyl)benzidine](abbreviation: Poly-TPD).

As another example, a substance having any of a carbazole skeleton, a dibenzofuran skeleton, a dibenzothiophene skeleton, and an anthracene skeleton can be favorably used as the material having a hole-transport property in the composite material. Moreover, as the material having a hole-transport property in the composite material, it is possible to use a substance including any of an aromatic amine having a substituent that includes a dibenzofuran ring or a dibenzothiophene ring, an aromatic monoamine that includes a naphthalene ring, and an aromatic monoamine in which a 9-fluorenyl group is bonded to nitrogen of amine through an arylene group. With the use of a substance including an N,N-bis(4-biphenyl)amino group, the reliability of the light-emitting device 550X can be increased.

As these materials, it is possible to use, for example, N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiPNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(4-biphenylyl)-9,9'-spirobi[9H-fluoren]-2-amine (abbreviation: BBASF), N,N-bis(1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(dibenzofuran-4-yl)-9,9-dimethyl-9H-fluoren-2-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, or N,N-bis(9,9-dimethyl-9H-fluoren-2-yl)-9,9'-spirobi-9H-fluoren-1-amine.

Structure Example 2 of Composite Material

For example, a composite material containing a substance having an electron-accepting property, a material having a hole-transport property, and a fluoride of an alkali metal or a fluoride of an alkaline earth metal can be used as the material having a hole-injection property. In particular, a composite material in which the proportion of fluorine atoms is higher than or equal to 20% can be suitably used. Thus, the refractive index of the layer 104 can be reduced. Alternatively, a layer with a low refractive index can be formed inside the light-emitting device 550X. Alternatively, the external quantum efficiency of the light-emitting device 550X can be improved.

Structure Example of Unit 103X2

The unit 103X2 includes the layer 111X2, a layer 112_2, and a layer 113_2 (see FIG. 2). The unit 103X2 has a function of emitting the light ELX2.

The layer 111X2 is interposed between the layer 112_2 and the layer 113_2, the layer 112_2 is interposed between the electrode 551X and the layer 111X2, and the layer 113_ is interposed between the electrode 552X and the layer 111X2.

Structure Example of Layer 111X2

For example, the structure of the layer 111X2 described in Embodiment 1 can be used for the layer 111X2.

Structure Example of Layer 112_2

The layer 1122 includes a layer 112_21 and a layer 112_22. The layer 112_22 is interposed between the layer 111X2 and the layer 11221.

Structure Example of Layer 112_21

For example, the structure describing the layer LN in Embodiment 1 can be used for the layer 112_21.

Specifically, for the layer 112_21, it is possible to use a material that has a hole-transport property and an ordinary refractive index higher than or equal to 1.40 and lower than or equal to 1.75 in a blue light emission range (455 nm to 465 nm) or an ordinary refractive index higher than or equal to 1.40 and lower than or equal to 1.70 with respect to 633-nm light, which is usually used for measurement of refractive indices.

For example, a monoamine compound including a first aromatic group, a second aromatic group, and a third aromatic group which are bonded to the same nitrogen atom can used for the layer 112_21.

In the monoamine compound, the proportion of carbon atoms each forming bonds by the sp3 hybrid orbitals to the total number of carbon atoms in the molecule is preferably higher than or equal to 23% and lower than or equal to 55%. In addition, it is preferable that the integral value of signals at lower than 4 ppm exceed the integral value of signals at 4 ppm or higher in the results of $^1$H-NMR measurement conducted on the monoamine compound.

The monoamine compound preferably has at least one fluorene skeleton. One or more of the first aromatic group, the second aromatic group, and the third aromatic group are preferably a fluorene skeleton.

Examples of the above-described organic compound having a hole-transport property include organic compounds having structures represented by General Formulae ($G_{h1}1$) to ($G_{h1}4$) below.

[Chemical Formula 3]

($G_{h1}1$)

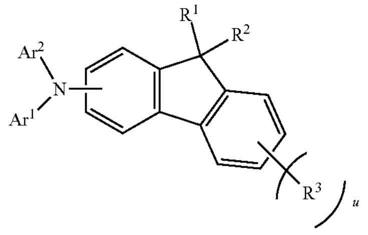

In General Formula ($G_{h1}1$), $Ar^1$ and $Ar^2$ each independently represent a benzene ring or a substituent in which two or three benzene rings are bonded to each other. Note that one or both of $Ar^1$ and $Ar^2$ have one or more hydrocarbon groups each having 1 to 12 carbon atoms forming bonds only by the sp3 hybrid orbitals. The total number of carbon atoms contained in all of the hydrocarbon groups bonded to $Ar^1$ and $Ar^2$ is 8 or more, and the total number of carbon atoms contained in all of the hydrocarbon groups bonded to either $Ar^1$ or $Ar^2$ is 6 or more. Note that in the case where a plurality of straight-chain alkyl groups each having one or two carbon atoms are bonded to $Ar^1$ or $Ar^2$ as the hydrocarbon groups, the straight-chain alkyl groups may be bonded to each other to form a ring. As the hydrocarbon group having 1 to 12 carbon atoms forming bonds only by the sp3 hybrid orbitals, an alkyl group having 3 to 8 carbon atoms and a cycloalkyl group having 6 to 12 carbon atoms are preferable. Specifically, a methyl group, an ethyl group, a propyl group, an isopropyl group, a butyl group, a sec-butyl group, an isobutyl group, a tert-butyl group, a pentyl group, an isopentyl group, a sec-pentyl group, a tert-pentyl group, a neopentyl group, a hexyl group, an isohexyl group, a sec-hexyl group, a tert-hexyl group, a neohexyl group, a heptyl group, an octyl group, a nonyl group, a decyl group, a cyclohexyl group, a 4-methylcyclohexyl group, a cycloheptyl group, a cyclooctyl group, a cyclononyl group, a cyclodecyl group, a decahydronaphthyl group, a cycloundecyl group, a cyclododecyl group, or the like can be used, and in particular, a t-butyl group, a cyclohexyl group, and a cyclododecyl group are preferred.

[Chemical Formula 4]

(G$_{h1}$2)

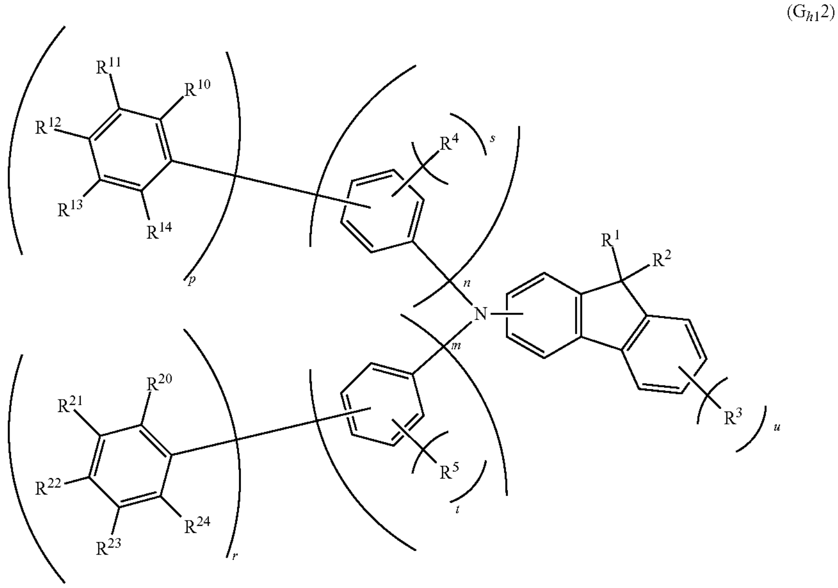

In General Formula (G$_{h1}$2), m and r each independently represent 1 or 2 and m+r is 2 or 3. Furthermore, t independently represents an integer of 0 to 4 and is preferably 0. $R^4$ and $R^5$ each independently represent hydrogen or any of hydrocarbon groups having 1 to 3 carbon atoms. When m is 2, the kind and number of substituents and the position of bonds included in one phenylene group may be the same as or different from those of the other phenylene group; and when r is 2, the kind and number of substituents and the position of bonds included in one phenyl group may be the same as or different from those of the other phenyl group. In the case where t is an integer of 2 to 4, $R^5$s may be the same as or different from each other; and adjacent groups (adjacent $R^5$s) may be bonded to each other to form a ring.

In General Formulae (G$_{h1}$2) and (G$_{h1}$3), n and p each independently represent 1 or 2 and n+p is independently 2 or 3. In addition, s independently represents an integer of 0 to 4 and is preferably 0. In the case where s is an integer of 2 to 4, $R^4$s may be the same as or different from each other. $R^4$ represents hydrogen or any of hydrocarbon groups having 1 to 3 carbon atoms. When n is 2, the kind and number of substituents and the position of bonds in one phenylene group may be the same as or different from those of the other phenylene group; and when p is 2, the kind and number of substituents and the position of bonds in one phenyl group may be the same as or different from those of the other phenyl group. In the case where s is an integer of 2 to 4, $R^4$s may be the same as or different from each other. Examples of the hydrocarbon group having 1 to 3 carbon atoms include a methyl group, an ethyl group, a propyl group, and an isopropyl group.

[Chemical Formula 5]

(G$_{h1}$3)

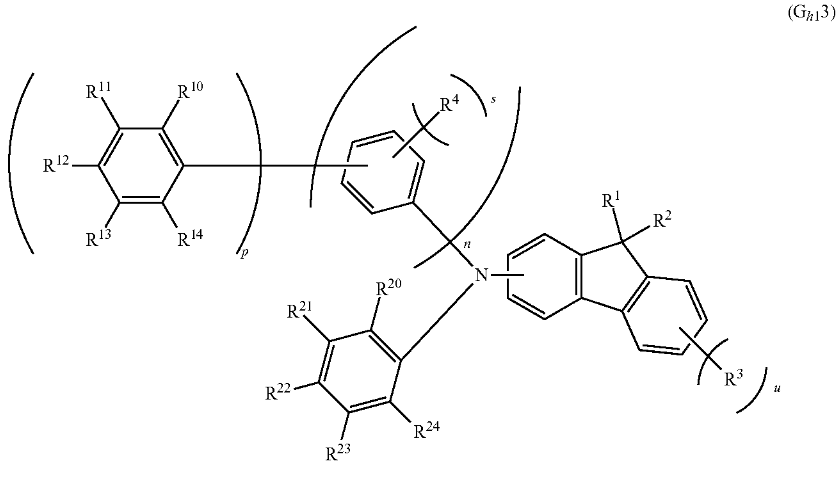

[Chemical Formula 6]

($G_{h1}4$)

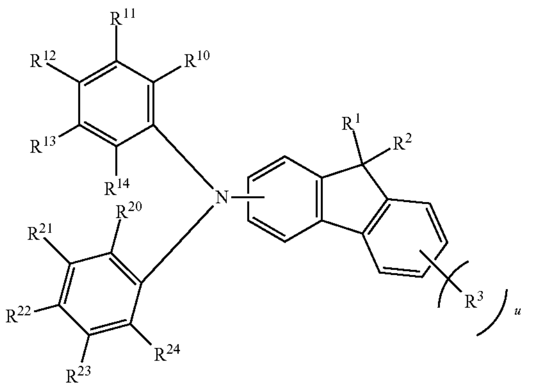

In General Formulae ($G_{h1}2$) to ($G_{h1}4$), $R^{10}$ to $R^{14}$ and $R^{20}$ to $R^{24}$ each independently represent hydrogen or a hydrocarbon group having 1 to 12 carbon atoms each forming bonds only by the sp3 hybrid orbitals. Note that at least three of $R^{10}$ to $R^{14}$ and at least three of $R^{20}$ to $R^{24}$ are preferably hydrogen. As the hydrocarbon group having 1 to 12 carbon atoms each forming bonds only by the sp3 hybrid orbitals, a tert-butyl group and a cyclohexyl group are preferable. The total number of carbon atoms contained in $R^{10}$ to $R^{14}$ and $R^{20}$ to $R^{24}$ is 8 or more and the total number of carbon atoms contained in either $R^{10}$ to $R^{14}$ or $R^{20}$ to $R^{24}$ is 6 or more. Note that adjacent groups of $R^{10}$ to $R^{14}$ and $R^{20}$ to $R^{24}$ may be bonded to each other to form a ring.

As the hydrocarbon group having 1 to 12 carbon atoms forming bonds only by the sp3 hybrid orbitals, an alkyl group having 3 to 8 carbon atoms and a cycloalkyl group having 6 to 12 carbon atoms are preferable. Specifically, a propyl group, an isopropyl group, a butyl group, a sec-butyl group, an isobutyl group, a tert-butyl group, a pentyl group, an isopentyl group, a sec-pentyl group, a tert-pentyl group, a neopentyl group, a hexyl group, an isohexyl group, a sec-hexyl group, a tert-hexyl group, a neohexyl group, a heptyl group, an octyl group, a cyclohexyl group, a 4-methylcyclohexyl group, a cycloheptyl group, a cyclooctyl group, a cyclononyl group, a cyclodecyl group, a decahydronaphthyl group, a cycloundecyl group, a cyclododecyl group, and the like can be used, and in particular, a t-butyl group, a cyclohexyl group, and a cyclododecyl group are preferred.

In General Formulae ($G_{h1}1$) to ($G_{h1}4$), each u independently represents an integer of 0 to 4 and is preferably 0. In the case where u is an integer of 2 to 4, R's may be the same as or different from each other. In addition, $R^1$, $R^2$, and $R^3$ each independently represent an alkyl group having 1 to 4 carbon atoms and $R^1$ and $R^2$ may be bonded to each other to form a ring. Examples of the hydrocarbon group having 1 to 4 carbon atoms include a methyl group, an ethyl group, a propyl group, and a butyl group.

An arylamine compound that has at least one aromatic group having first to third benzene rings and at least three alkyl groups is also preferable as one of the materials having a hole-transport property. Note that the first to third benzene rings are bonded in this order and the first benzene ring is directly bonded to nitrogen of amine.

The first benzene ring may further include a substituted or unsubstituted phenyl group and preferably includes an unsubstituted phenyl group. Furthermore, the second benzene ring or the third benzene ring may include a phenyl group substituted by an alkyl group.

Note that hydrogen is not directly bonded to carbon atoms at 1- and 3-positions in two or more of, preferably all of the first to third benzene rings, and the carbon atoms are bonded to any of the first to third benzene rings, the phenyl group substituted by the alkyl group, the at least three alkyl groups, and the nitrogen of the amine.

It is preferable that the arylamine compound further include a second aromatic group. It is preferable that the second aromatic group have an unsubstituted monocyclic ring or a substituted or unsubstituted bicyclic or tricyclic condensed ring; in particular, it is further preferable that the second aromatic group be a group having a substituted or unsubstituted bicyclic or tricyclic condensed ring where the number of carbon atoms forming the ring is 6 to 13. Still further preferably, the second aromatic group is a group having a benzene ring, a naphthalene ring, a fluorene ring, or an acenaphthylene ring, and particularly preferably a group having a fluorene ring. Note that a dimethylfluorenyl group is preferable as the second aromatic group.

It is preferable that the arylamine compound further include a third aromatic group. The third aromatic group is a group having 1 to 3 substituted or unsubstituted benzene rings.

It is preferable that the at least three alkyl groups and the alkyl group substituted for the phenyl group be each a chain alkyl group having 2 to 5 carbon atoms. In particular, as the alkyl group, a chain alkyl group having a branch formed of 3 to 5 carbon atoms is preferable, and a t-butyl group is further preferable.

Examples of the above-described material having a hole-transport property include organic compounds having structures represented by ($G_{h2}1$) to ($G_{h2}3$) below.

[Chemical Formula 7]

($G_{h2}1$)

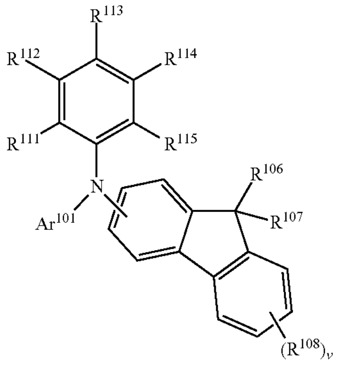

(g1)

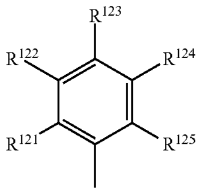

-continued (g2)

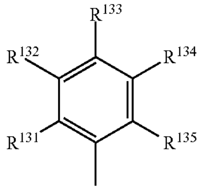

Note that in General Formula ($G_{h2}1$) above, $Ar^{101}$ represents a substituted or unsubstituted benzene ring or a substituent in which two or three substituted or unsubstituted benzene rings are bonded to one another.

[Chemical Formula 8]

($G_{h2}2$)

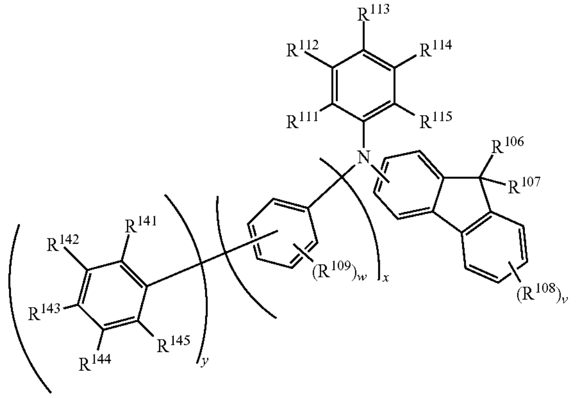

(g1)

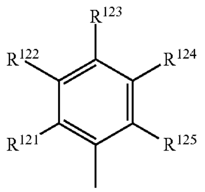

(g2)

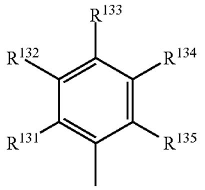

Note that in General Formula ($G_{h2}2$) above, x and y each independently represent 1 or 2 and x+y is 2 or 3. Furthermore, $R^{109}$ represents an alkyl group having 1 to 4 carbon atoms, and w represents an integer of 0 to 4. $R^{141}$ to $R^{145}$ each independently represent any one of hydrogen, an alkyl group having 1 to 6 carbon atoms, and a cycloalkyl group having 5 to 12 carbon atoms. When w is 2 or more, $R^{109}$s may be the same as or different from each other. When x is 2, the kind and number of substituents and the position of bonds included in one phenylene group may be the same as or different from those of the other phenylene group. When y is 2, the kind and number of substituents included in one phenyl group including $R^{141}$ to $R^{145}$ may be the same as or different from those of the other phenyl group including $R^{141}$ to $R^{145}$.

[Chemical Formula 9]

($G_{h2}3$)

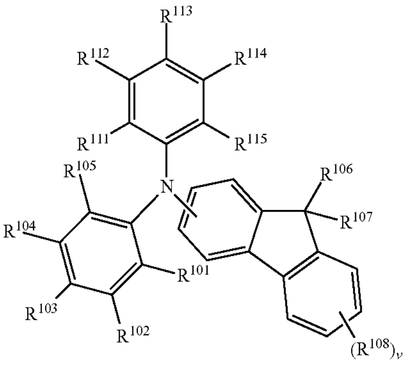

(g1)

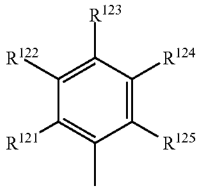

(g2)

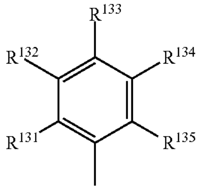

In General Formula ($G_{h2}3$), $R^{101}$ to $R^{105}$ each independently represent any one of hydrogen, an alkyl group having 1 to 6 carbon atoms, a cycloalkyl group having 6 to 12 carbon atoms, and a substituted or unsubstituted phenyl group.

In General Formulae ($G_{h2}1$) to ($G_{h2}3$) above, each of $R^{106}$, $R^{107}$, and $R^{108}$ independently represents an alkyl group having 1 to 4 carbon atoms, and v represents an integer of 0 to 4. Note that when v is 2 or more, $R^{108}$s may be the same as or different from each other. One of $R^{111}$ to $R^{115}$ represents a substituent represented by General Formula (g1), and the others each independently represent any one of hydrogen, an alkyl group having 1 to 6 carbon atoms, and a substituted or unsubstituted phenyl group. In General Formula (g1), one of $R^{121}$ to $R^{125}$ represents a substituent represented by General Formula (g2), and the others each independently represent any one of hydrogen, an alkyl group having 1 to 6 carbon atoms, and a phenyl group substituted by an alkyl group having 1 to 6 carbon atoms. In General Formula (g2), $R^{131}$ to $R^{135}$ each independently represent any one of hydrogen, an alkyl group having 1 to 6 carbon atoms, and a phenyl group substituted by an alkyl group having 1 to 6 carbon atoms. Note that at least three of $R^{111}$ to $R^{115}$, $R^{121}$ to $R^{125}$, and $R^{131}$ to $R^{135}$ are each an alkyl group having 1 to 6 carbon atoms; the number of substituted or unsubstituted phenyl groups in $R^{111}$ to $R^{115}$ is one or less; and the number of phenyl groups substituted by an alkyl group having 1 to 6 carbon atoms in $R^{121}$ to $R^{125}$ and $R^{131}$ to $R^{135}$ is one or less. In at least two combinations of the three combinations $R^{112}$ and $R^{114}$, $R^{122}$ and $R^{124}$, and $R^{132}$ and $R^{134}$, at least one R represents any of the substituents other than hydrogen.

In the case where the substituted or unsubstituted benzene ring or the substituted or unsubstituted phenyl group has a substituent in General Formulae ($G_{h2}1$) to ($G_{h2}3$), the substituent can be an alkyl group having 1 to 6 carbon atoms or a cycloalkyl group having 5 to 12 carbon atoms. The alkyl group having 1 to 4 carbon atoms is preferably a methyl group, an ethyl group, a propyl group, an isopropyl group, a butyl group, a sec-butyl group, an isobutyl group, or a tert-butyl group. The alkyl group having 1 to 6 carbon atoms is preferably a chain alkyl group having 2 or more carbon atoms; in terms of ensuring the transport property, a chain alkyl group having 5 or less carbon atoms is preferable. A chain alkyl group having a branch and 3 or more carbon atoms is significantly effective in lowering the refractive index. That is, the alkyl group having 1 to 6 carbon atoms is preferably a chain alkyl group having 2 to 5 carbon atoms, and further preferably a chain alkyl group having a branch and 3 to 5 carbon atoms. As the alkyl group having 1 to 6 carbon atoms, a methyl group, an ethyl group, a propyl group, an isopropyl group, a butyl group a sec-butyl group, an isobutyl group, a tert-butyl group, or a pentyl group is preferable, and a tert-butyl group is particularly preferable. As the cycloalkyl group having 5 to 12 carbon atoms, a cyclohexyl group, a 4-methylcyclohexyl group, a cycloheptyl group, a cyclooctyl group, a cyclononyl group, a cyclodecyl group, a decahydronaphthyl group, a cycloundecyl group, a cyclododecyl group, or the like can be used; a cycloalkyl group having 6 or more carbon atoms is preferred to lower the refractive index, and in particular, a cyclohexyl group and a cyclododecyl group are preferred.

The above-described organic compounds having a hole-transport property each have an ordinary refractive index greater than or equal to 1.40 and less than or equal to 1.75 in a blue-light-emitting region (455 nm to 465 nm) or an ordinary refractive index greater than or equal to 1.40 and less than or equal to 1.70 with respect to light with a wavelength of 633 nm, which is typically used for measurement of the refractive index. A highly reliable organic compound having a high glass transition temperature (Tg) can also be obtained at the same time. Such organic compounds also have a sufficient hole-transport property.

Preferable examples of such a material include N,N-bis(4-cyclohexylphenyl)-9,9-dimethyl-9H-fluoren-2-amine (abbreviation: dchPAF), N-[(4'-cyclohexyl)-1,1'-biphenyl-4-yl]-N-(4-cyclohexylphenyl)-9,9-dimethyl-9H-fluoren-2-amine (abbreviation: chBichPAF), N,N-bis(4-cyclohexylphenyl)-N-(spiro[cyclohexane-1,9'[9H]fluoren]-2'yl)amine (abbreviation: dchPASchF), N-[(4'-cyclohexyl)-1,1'-biphenyl-4-yl]-N-(4-cyclohexylphenyl)-N-(spiro[cyclohexane-1,9'-[9H]fluoren]-2'yl)amine (abbreviation: chBichPASchF), N-(4-cyclohexylphenyl)-bis(spiro[cyclohexane-1,9'-[9H]fluoren]-2'-yl)amine (abbreviation: SchFB1chP), N-[(3',5'-ditertiarybutyl)-1,1'-biphenyl-4-yl]-N-(4-cyclohexylphenyl)-9,9-dimethyl-9H-fluoren-2-amine (abbreviation: mmtBuBichPAF), N,N-bis(3',5'-ditertiarybutyl-1,1'-biphenyl-4-yl)-9,9-dimethyl-9H-fluoren-2-amine (abbreviation: dmmtBuBiAF), N-(3,5-ditertiarybutylphenyl)-N-(3',5'-ditertiarybutyl-1,1'-biphenyl-4-yl)-9,9-dimethyl-9H-fluoren-2-amine (abbreviation: mmtBuBimmtBuPAF), NN-bis(4-cyclohexylphenyl)-9,9-dipropyl-9H-fluoren-2-amine (abbreviation: dchPAPrF), N-[(3',5'-dicyclohexyl)-1,1'-biphenyl-4-yl]-N-(4-cyclohexylphenyl)-9,9-dimethyl-9H-fluoren-2-amine (abbreviation: mmchBichPAF), N-(3,3",5,5"-tetra-t-butyl-1,1':3',1"-terphenyl-5'-yl)-N-(4-cyclohexylphenyl)-9,9-dimethyl-9H-fluoren-2-amine (abbreviation: mmtBumTPchPAF), N-(4-cyclododecylphenyl)-N-(4-cyclohexylphenyl)-9,9-dimethyl-9H-fluoren-2-amine (abbreviation: CdoPchPAF), N-(3,3",5,5"-tetra-t-butyl-1,1':3,1"-terphenyl-5'-yl)-N-phenyl-9,9-dimethyl-9H-fluoren-2-amine (abbreviation: mmtBumTPFA), N-(1,1'-biphenyl-4-yl)-N-(3,3",5,5"-tetra-t-butyl-1,1':3',1"-terphenyl-5'-yl)-9,9-dimethyl-9H-fluoren-2-amine (abbreviation: mmtBumTPFBi), N-(1,1'-biphenyl-2-yl)-N-(3,3",5,5"-tetra-t-butyl-1,1':3',1"-terphenyl-5'-yl)-9,9-dimethyl-9H-fluoren-2-amine (abbreviation: mmtBumTPoFBi), N-[(3,3',5'-tri-t-butyl)-1,1'-biphenyl-5-yl]-N-(4-cyclohexylphenyl)-9,9-dimethyl-9H-fluoren-2-amine (abbreviation: mmtBumBichPAF), N-(1,1'-biphenyl-2-yl)-N-[(3,3',5'-tri-t-butyl)-1,1'-biphenyl-5-yl]-9,9-dimethyl-9H-fluoren-2-amine (abbreviation: mmtBumBioFBi), N-(4-tert-butylphenyl)-N-(3,3",5,5"-tetra-t-butyl-1,1':3,1"-terphenyl-5'-yl)-9,9-dimethyl-9H-fluoren-2-amine (abbreviation: mmtBumTPtBuPAF), N-(3,3",5',5"-tetra-tert-butyl-1,1:3',1"-terphenyl-5-yl)-N-phenyl-9,9-dimethyl-9H-fluoren-2-amine (abbreviation: mmtBumTPFA-02), N-(1,1'-biphenyl-4-yl)-N-(3,3",5',5"-tetra-tert-butyl-1,1':3',1"-terphenyl-5-yl)-9,9-dimethyl-9H-fluoren-2-amine (abbreviation: mmtBumTPFBi-02), N-(1,1'-biphenyl-2-yl)-N-(3,3",5',5"-tetra-tert-butyl-1,1:3',1"-terphenyl-5-yl)-9,9-dimethyl-9H-fluoren-2-amine (abbreviation: mmtBumTPoFBi-02), N-(4-cyclohexylphenyl)-N-(3,3",5',5"-tetra-tert-butyl-1,1':3',1"-terphenyl-5-yl)-9,9-dimethyl-9H-fluoren-2-amine (abbreviation: mmtBumTPchPAF-02), N-(1,1'-biphenyl-2-yl)-N-(3",5',5"-tri-tert-butyl-1,1':3',1"-terphenyl-5-yl)-9,9-dimethyl-9H-fluoren-2-amine (abbreviation: mmtBumTPoFBi-03), N-(4-cyclohexylphenyl)-N-(3",5',5"-tri-tert-butyl-1,1':3',1"-terphenyl-5-yl)-9,9-dimethyl-9H-fluoren-2-amine (abbreviation: mmtBumTPchPAF-03), N-(1,1'-biphenyl-2-yl-N-(3",5',5"-tri-tert-butyl-1,1':3',1"-terphenyl-4-yl)-9,9-dimethyl-9H-fluoren-2-amine (abbreviation: mmtBumTPoFBi-04), N-(4-cyclohexylphenyl)-N-(3",5',5"-tri-tert-butyl-1,1':3',1"-terphenyl-4-yl)-9,9-dimethyl-9H-fluoren-2-amine (abbreviation: mmtBumTPchPAF-04), N-(1,1'-biphenyl-2-yl)-N-(3,3",5"-tri-tert-butyl-1,1':4',1"-terphenyl-5-yl)-9,9-dimethyl-9H-fluoren-2-amine (abbreviation: mmtBumTPoFBi-05), N-(4-cyclohexylphenyl)-N-(3,3",5"-tri-tert-butyl-1,1':4',1"-terphenyl-5-yl)-9,9-dimethyl-9H-fluoren-2-amine (abbreviation: mmtBumTPchPAF-05), and N-(3',5'-ditertiarybutyl-1,1'-biphenyl-4-yl)-N-(1,1'-biphenyl-2-yl)-9,9-dimethyl-9H-fluoren-2-amine (abbreviation: mmtBuBioFBi).

Alternatively, 1,1-bis{4-[bis(4-methylphenyl)amino]phenyl}cyclohexane (abbreviation: TAPC) or the like can also be used.

Structure Example of Layer 112_22

For example, a material having a hole-transport property that can be used for the layer 112_22 can be used for the layer 112.

Structure Example of Layer 113_2

A material having an electron-transport property that can be used for the layer 113, a material having an anthracene skeleton, and a mixed material can be used for the layer 1132, for example.

Structure Example of Electrode 552X

A conductive material can be used for the electrode 552X, for example. Specifically, a single layer or a stacked layer of a metal, an alloy, or a material containing a conductive compound can be used for the electrode 552X.

For example, a material that can be used for the electrode 551X can be used for the electrode 552X. In particular, a material having a lower work function than the electrode 551X can be favorably used for the electrode 552X. Specifically, a material having a work function lower than or equal to 3.8 eV is preferable.

For example, an element belonging to Group 1 of the periodic table, an element belonging to Group 2 of the periodic table, a rare earth metal, or an alloy containing any of these elements can be used for the electrode 552X.

Specifically, lithium (Li), cesium (Cs), or the like; magnesium (Mg), calcium (Ca), strontium (Sr), or the like; europium (Eu), ytterbium (Yb), or the like; or an alloy containing any of these (MgAg or AlLi) can be used for the electrode 552X.

Structure Example of Layer 105

A material having an electron-injection property can be used for the layer 105, for example. The layer 105 can be referred to as an electron-injection layer.

Specifically, a substance having an electron-donating property can be used for the layer 105. Alternatively, a material in which a substance having an electron-donating property and a material having an electron-transport property are combined can be used for the layer 105. Alternatively, electride can be used for the layer 105. This can facilitate injection of electrons from the electrode 552X, for example. Alternatively, besides a material having a low work function, a material having a high work function can also be used for the electrode 552X. Alternatively, a material used for the electrode 552X can be selected from a wide range of materials regardless of its work function. Specifically, Al, Ag, ITO, indium oxide-tin oxide containing silicon or silicon oxide, or the like can be used for the electrode 552X. Alternatively, the driving voltage of the light-emitting device 550X can be lowered.

[Substance Having Electron-Donating Property]

For example, an alkali metal, an alkaline earth metal, a rare earth metal, or a compound thereof (an oxide, a halide, a carbonate, or the like) can be used as the substance having an electron-donating property. Alternatively, an organic compound such as tetrathianaphthacene (abbreviation: TTN), nickelocene, or decamethylnickelocene can be used as the substance having an electron-donating property.

As an alkali metal compound (including an oxide, a halide, and a carbonate), lithium oxide, lithium fluoride (LiF), cesium fluoride (CsF), lithium carbonate, cesium carbonate, 8-hydroxyquinolinato-lithium (abbreviation: Liq), or the like can be used.

As an alkaline earth metal compound (including an oxide, a halide, and a carbonate), calcium fluoride ($CaF_2$) or the like can be used.

Structure Example 1 of Composite Material

A material in which a plurality of kinds of substances are combined can be used as the material having an electron-injection property. For example, a substance having an electron-donating property and a material having an electron-transport property can be used for the composite material.

[Material Having Electron-Transport Property]

For example, a metal complex or an organic compound having a π-electron deficient heteroaromatic ring skeleton can be used as the material having an electron-transport property.

For example, a material having an electron-transport property that can be used for the unit 103X can be used for the composite material.

Structure Example 2 of Composite Material

A material including a fluoride of an alkali metal in a microcrystalline state and a material having an electron-transport property can be used for the composite material. Alternatively, a material including a fluoride of an alkaline earth metal in a microcrystalline state and a material having an electron-transport property can be used for the composite material. In particular, a composite material including a fluoride of an alkali metal or a fluoride of an alkaline earth metal at higher than or equal to 50 wt % can be suitably used. Alternatively, a composite material including an organic compound having a bipyridine skeleton can be suitably used. In that case, the refractive index of the layer 105 can be reduced. Alternatively, the external quantum efficiency of the light-emitting device 550X can be improved.

Structure Example 3 of Composite Material

For example, a composite material containing a first organic compound having an unshared electron pair and a first metal can be used for the layer 105. The sum of the number of electrons of the first organic compound and the number of electrons of the first metal is preferably an odd number. The molar ratio of the first metal to 1 mol of the first organic compound is preferably greater than or equal to 0.1 and less than or equal to 10, further preferably greater than or equal to 0.2 and less than or equal to 2, still further preferably greater than or equal to 0.2 and less than or equal to 0.8.

Accordingly, the first organic compound having an unshared electron pair interacts with the first metal and thus can form a singly occupied molecular orbital (SOMO). Furthermore, in the case where electrons are injected from the electrode 552X into the layer 105, a barrier therebetween can be lowered. The first metal has a low reactivity with water and oxygen; thus, the moisture resistance of the light-emitting device 550X can be improved.

For the layer 105, a composite material that allows the spin density measured by an electron spin resonance (ESR) method to be preferably higher than or equal to $1\times10^{16}$ spins/$cm^3$, further preferably higher than or equal to $5\times10^{16}$ spins/$cm^3$, still further preferably higher than or equal to $1\times10^{17}$ spins/$cm^3$ can be used.

[Organic Compound Having Unshared Electron Pair]

For example, a material having an electron-transport property can be used for the organic compound having an unshared electron pair. For example, a compound having an electron deficient heteroaromatic ring can be used. For example, a compound having an electron deficient heteroaromatic ring can be used. Specifically, a compound having at least one of a pyridine ring, a diazine ring (a pyrimidine ring, a pyrazine ring, or a pyridazine ring), and a triazine ring can be used. Accordingly, the driving voltage of the light-emitting device 550X can be lowered.

Note that the LUMO level of the organic compound having an unshared electron pair is preferably greater than or equal to −3.6 eV and less than or equal to −2.3 eV. In general, the HOMO level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

Alternatively, for example, copper phthalocyanine can be used for the organic compound having an unshared electron pair. The number of electrons of the copper phthalocyanine is an odd number.

[First Metal]

For example, when the number of electrons of the first organic compound having an unshared electron pair is an even number, a composite material of the first metal that belongs to an odd-numbered group in the periodic table and the first organic compound can be used for the layer 105.

For example, manganese (Mn), which is a metal belonging to Group 7, cobalt (Co), which is a metal belonging to Group 9, copper (Cu), silver (Ag), and gold (Au), which are metals belonging to Group 11, and aluminum (Al) and indium (In), which are metals belonging to Group 13, are odd-numbered groups in the periodic table. Note that elements belonging to Group 11 have a lower melting point than elements belonging to Group 7 or Group 9 and thus are suitable for vacuum evaporation. In particular, Ag is preferable because of its low melting point.

The use of Ag for the electrode 552X and the layer 105 can increase the adhesion between the layer 105 and the electrode 552X.

When the number of electrons of the first organic compound having an unshared electron pair is an odd number, a composite material of the first metal that belongs to an even-numbered group in the periodic table and the first organic compound can be used for the layer 105. For example, iron (Fe), which is a metal belonging to Group 8, is an element belonging to an even-numbered group in the periodic table.

[Electride]

For example, a substance obtained by adding electrons at high concentration to an oxide where calcium and aluminum are mixed, or the like can be used as the material having an electron-injection property.

Structure Example 1 of Layer 106

The layer 106 has a function of supplying electrons to the anode side and supplying holes to the cathode side by applying voltages. The layer 106 can be referred to as a charge-generation layer.

For example, a material having a hole-injection property that can be used for the layer 104 can be used for the layer 106. Specifically, a composite material can be used for the layer 106.

As another example, a stacked film in which a film including the composite material and a film including a material having a hole-transport property are stacked can be used as the layer 106.

Structure Example 2 of Layer 106

The layer 106 includes a layer 1061, a layer 1062, and a layer 106_3. The layer 106_1 includes a region interposed between the electrode 552X and the unit 103X, the layer 106_2 includes a region interposed between the layer 1061 and the unit 103X, and the layer 106_3 includes a region interposed between the layer 106_1 and the layer 106_2.

Structure Example of Layer 106_1

For example, a material having a hole-injection property that can be used for the layer 104 can be used for the layer 1061. Specifically, a composite material can be used for the layer 106_1. A film having an electrical resistivity greater than or equal to $1\times10^4$ [Ω·cm] and less than or equal to $1\times10^7$ [Ω·cm] can be used as the layer 106_1. The electrical resistivity of the layer 106_1 is preferably greater than or equal to $5\times10^4$ [Ω·cm] and less than or equal to $1\times10^7$ [Ω·cm], further preferably greater than or equal to $1\times10^5$ [Ω·cm] and less than or equal to $1\times10^7$[Ω·cm].

Structure Example of Layer 106_2

For example, a material that can be used for the layer 105 can be used for the layer 1062.

Structure Example of Layer 106_3

For example, a material having an electron-transport property can be used for the layer 106_3. The layer 1063 can be referred to as an electron-relay layer. With the use of the layer 106_3, a layer that is in contact with the anode side of the layer 106_3 can be distanced from a layer that is in contact with the cathode side of the layer 106_3. It is possible to reduce interaction between the layer in contact with the anode side of the layer 106_3 and the layer in contact with the cathode side of the layer 1063. Electrons can be smoothly supplied to the layer in contact with the anode side of the layer 106_3.

A substance whose LUMO level is positioned between the LUMO level of the substance having an acceptor property contained in the layer in contact with the cathode side of the layer 106_3 and the LUMO level of the substance contained in the layer in contact with the anode side of the layer 106_3 can be suitably used for the layer 106_3.

For example, a material that has a LUMO level higher than or equal to −5.0 eV, preferably higher than or equal to −5.0 eV and lower than or equal to −3.0 eV can be used for the layer 106_3.

Specifically, a phthalocyanine-based material can be used for the layer 106_3. For example, copper phthalocyanine (abbreviation: CuPc) or a metal complex having a metal-oxygen bond and an aromatic ligand can be used for the layer 106_3.

Note that this embodiment can be combined with any of the other embodiments described in this specification as appropriate.

Embodiment 3

In this embodiment, a structure of a light-emitting device 550X of one embodiment of the present invention is described with reference to FIG. 3.

Figure 3:
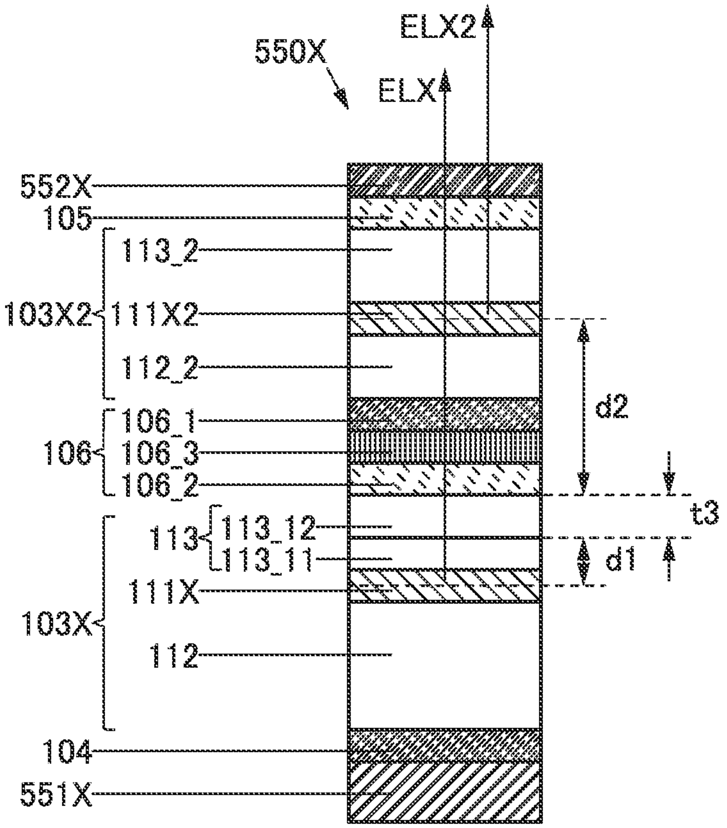
FIG. 3 is a diagram illustrating a structure of a light-emitting device of an embodiment.

FIG. 3 is a cross-sectional view illustrating a structure of the light-emitting device of one embodiment of the present invention, which is different from the structure illustrated in FIG. 2.

Structure Example 1 of Light-Emitting Device 550X

The light-emitting device 550X described in this embodiment includes the electrode 551X, the electrode 552X, the unit 103X, the layer 104, and the layer 105 (see FIG. 3). The light-emitting device 550X includes the unit 103X2 and the layer 106.

Note that the layer 113 is different from the light-emitting device 550X described with reference to FIG. 2 in Embodiment 2 in that the layer 113 includes the layer 113_11 and the layer 113_12 and the layer 112_2 is formed using a single layer. Different portions will be described in detail here, and the description in Embodiment 2 is referred to for portions having the same structure.

Structure Example of Layer 113

The layer 113 includes the layer 113_11 and the layer 113_12. The layer 113_11 is interposed between the layer 111X and the layer 11312.

Structure Example of Layer 113_11

For example, a material having an electron-transport property that can be used for the layer 113 described in Embodiment 2, a material having an anthracene skeleton, and a mixed material can be used for the layer 113_11.

Structure Example of Layer 113_12

For example, the structure describing the layer LN in Embodiment 1 can be used for the layer 113_12.

Specifically, for the layer 113_12, it is possible to use, for example, a material that has an electron-transport property and an ordinary refractive index higher than or equal to 1.50 and lower than or equal to 1.75 in a blue light emission range (455 nm to 465 nm) or an ordinary refractive index higher than or equal to 1.45 and lower than or equal to 1.70 with respect to 633-nm light, which is usually used for measurement of refractive indices.

For example, the organic compound with an electron-transport property including at least one six-membered heteroaromatic ring having 1 to 3 nitrogen atoms, a plurality of aromatic hydrocarbon rings each of which has 6 to 14 carbon atoms in the ring and at least two of which are benzene rings, and an organic compound having a plurality of hydrocarbon groups forming bonds by sp3 hybrid orbitals can be used for the layer 113_12.

The proportion of the number of carbon atoms forming bonds by sp3 hybrid orbitals is preferably higher than or equal to 10% and lower than or equal to 60%, further preferably higher than or equal to 10% and lower than or equal to 50% of the total number of carbon atoms in the molecule of the organic compound. Alternatively, when the above organic compound is subjected to $^{1}$H-NMR measurement, the integral value of signals at lower than 4 ppm is preferably ½ or more of the integral value of signals at 4 ppm or higher.

It is preferable that all the hydrocarbon groups forming bonds by sp3 hybrid orbitals in the organic compound be bonded to the above aromatic hydrocarbon rings each having 6 to 14 carbon atoms in the ring, and the LUMO of the organic compound not be distributed over the aromatic hydrocarbon rings.

For example, an organic compound represented by General formula (Gel) shown below can be used for the layer 113_12.

[Chemical Formula 10]

($G_e$1)

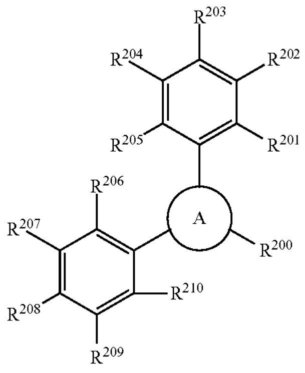

($G_e$1-1)

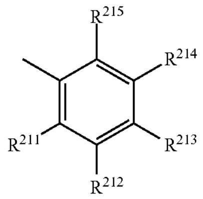

In the formula, A represents a six-membered heteroaromatic ring having 1 to 3 nitrogen atoms, and is preferably any of a pyridine ring, a pyrimidine ring, a pyrazine ring, a pyridazine ring, and a triazine ring.

$R^{200}$ represents any one of hydrogen, an alkyl group having 1 to 6 carbon atoms, an alicyclic group having 3 to 10 carbon atoms, and a substituent represented by Formula (Gel-1).

At least one of $R^{201}$ to $R^{215}$ represents a phenyl group having a substituent and the others each independently represent any of hydrogen, an alkyl group having 1 to 6 carbon atoms, an alicyclic group having 3 to 10 carbon atoms, a substituted or unsubstituted aromatic hydrocarbon group having 6 to 14 carbon atoms in a ring, and a substituted or unsubstituted pyridyl group. Note that $R^{201}$, $R^{203}$, $R^{205}$, $R^{206}$, $R^{208}$, $R^{210}$, $R^{211}$, $R^{213}$, and $R^{215}$ are preferably hydrogen. The phenyl group having a substituent has one or two substituents, which each independently represent any of an alkyl group having 1 to 6 carbon atoms, an alicyclic group having 3 to 10 carbon atoms, and a substituted or unsubstituted aromatic hydrocarbon group having 6 to 14 carbon atoms in a ring.

The organic compound represented by General Formula ($G_e$1) has a plurality of hydrocarbon groups selected from an alkyl group having 1 to 6 carbon atoms and an alicyclic group having 3 to 10 carbon atoms, and total carbon atoms forming bonds by $sp^3$ hybrid orbitals account for higher than or equal to 10% and lower than or equal to 60% of total carbon atoms in molecules of the organic compound.

For example, an organic compound represented by General Formula ($G_e$2) shown below can be used for the layer 113_12.

[Chemical Formula 11]

(G$_e$2)

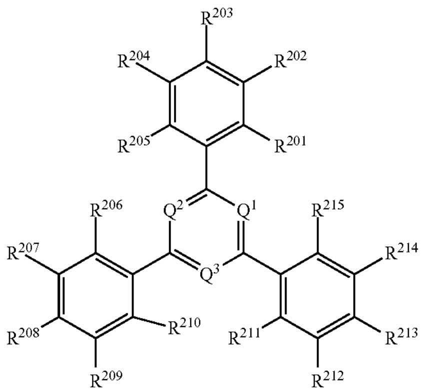

In the above general formula, two or three of $Q^1$ to $Q^3$ are each a nitrogen atom, and in the case where two of $Q^1$ to $Q^3$ each represent a nitrogen atom, the other one represents CH.

At least one of $R^{201}$ to $R^{215}$ represents a phenyl group having a substituent and the others of $R^{201}$ to $R^{215}$ each independently represent any of hydrogen, an alkyl group having 1 to 6 carbon atoms, an alicyclic hydrocarbon group having 3 to 10 carbon atoms, a substituted or unsubstituted aromatic hydrocarbon group having 6 to 14 carbon atoms in a ring, and a substituted or unsubstituted pyridyl group.

The phenyl group having a substituent has one or two substituents, which each independently represent any of an alkyl group having 1 to 6 carbon atoms, an alicyclic hydrocarbon group having 3 to 10 carbon atoms, and a substituted or unsubstituted aromatic hydrocarbon group having 6 to 14 carbon atoms in a ring.

Furthermore, the organic compound represented by General Formula (G$_e$2) in which sp3 carbon atoms account for higher than or equal to 10% and lower than or equal to 60% of total carbon atoms contained in the organic compound can be used for the layer 113_12, for example. Note that the sp3 carbon atom refers to a carbon atom that forms bonds with other atoms by sp3 hybrid orbitals.

In the organic compound represented by General Formula (G$_e$1) or (G$_e$2), the phenyl group having a substituent is preferably a group represented by Formula (G$_e$1-2) below.

[Chemical Formula 12]

(G$_e$1-2)

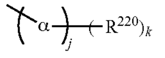

In the formula, α represents a substituted or unsubstituted phenylene group and is preferably a meta-substituted phenylene group. In the case where the meta-substituted phenylene group has a substituent, the substituent is also preferably meta-substituted. The substituent is preferably an alkyl group having 1 to 6 carbon atoms or an alicyclic group having 3 to 10 carbon atoms, further preferably an alkyl group having 1 to 6 carbon atoms, and still further preferably a t-butyl group.

$R^{220}$ represents an alkyl group having 1 to 6 carbon atoms, an alicyclic group having 3 to 10 carbon atoms, or a substituted or unsubstituted aromatic hydrocarbon group having 6 to 14 carbon atoms in a ring.

In addition, j and k each independently represent 1 or 2. In the case where j is 2, a plurality of a may be the same or different from each other. In the case where k is 2, a plurality of $R^{220}$ may be the same or different from each other. $R^{220}$ is preferably a phenyl group, and it is further preferable that the phenyl group have an alkyl group having 1 to 6 carbon atoms or an alicyclic group having 3 to 10 carbon atoms at one or both of the two meta-positions. The substituent at one or both of the two meta-positions of the phenyl group is preferably an alkyl group having 1 to 6 carbon atoms, further preferably a t-butyl group.

Structure Example of Layer 112_2

For example, a material having a hole-transport property that can be used for the layer 112 described in Embodiment 2 can be used for the layer 112_2.

Note that this embodiment can be combined with any of the other embodiments described in this specification as appropriate.

Embodiment 4

In this embodiment, a structure of a display apparatus 700 of one embodiment of the present invention will be described with reference to FIG. 4 and FIG. 5.

Figure 4:
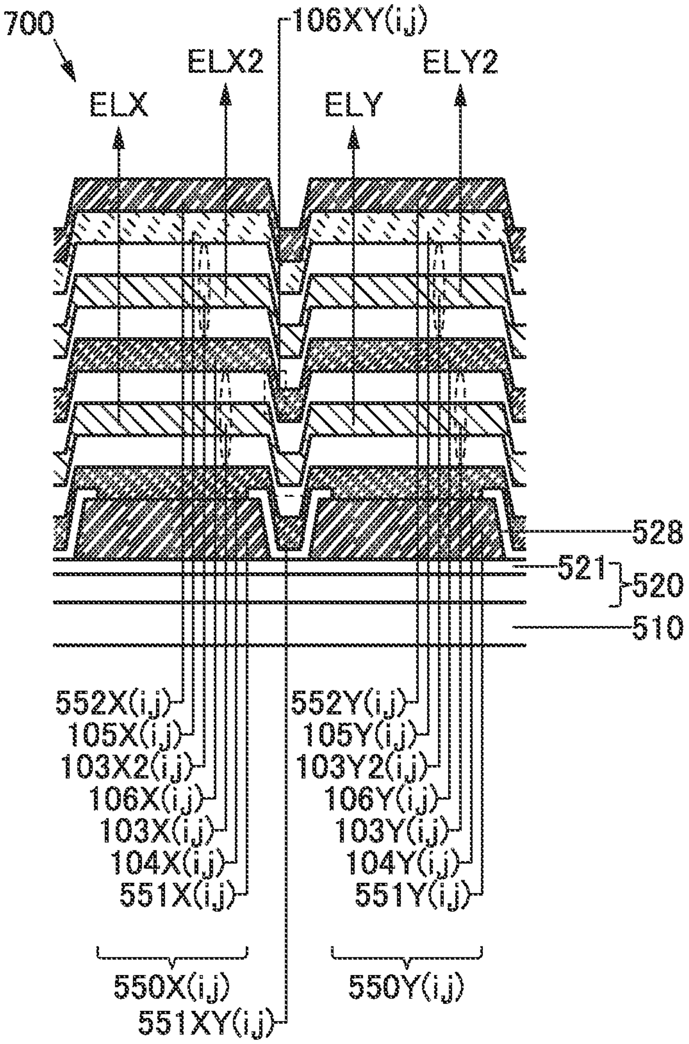
FIG. 4 is a diagram illustrating a structure of a display apparatus of an embodiment.

FIG. 4 is a cross-sectional view illustrating the structure of the display apparatus 700 of one embodiment of the present invention. FIG. 5 is a cross-sectional view illustrating the structure of the display apparatus 700 of one embodiment of the present invention different from FIG. 4.

Structure Example 1 of Display Apparatus 700

The display apparatus 700 described in this embodiment includes a light-emitting device 550X(i,j) and a light-emitting device 550Y(i,j) (see FIG. 4). The light-emitting device 550Y(i,j) is adjacent to the light-emitting device 550X(i,j).

The display apparatus 700 includes abase material 510 and a functional layer 520. The functional layer 520 includes an insulating film 521, and the light-emitting device 550X(i,j) and the light-emitting device 550Y(i,j) are formed over the insulating film 521. The functional layer 520 is interposed between the base material 510 and the light-emitting device 550X(i,j).

Structure Example of Light-Emitting Device 550X(i,j)

The light-emitting device 550X(i,j) includes an electrode 551X(i,j), an electrode 552X(i,j), a unit 103X(i,j), a unit 103X2(*i,j*), and a layer 106X(i,j). The light-emitting device 550X(i,j) includes a layer 104X(i,j) and a layer 105X(i,j).

For example, the light-emitting device 550X described in Embodiment 2 or Embodiment 3 can be used as the light-emitting device 550X(i,j). Specifically, the structure that can be used for the electrode 551X can be used for the electrode 551X(i,j). The structure that can be used for the unit 103X can be used for the unit 103X(i,j), and the structure that can be used for the unit 103X2 can be used for the unit 103X2(*i,j*). The structure that can be used for the layer 106 can be used for the layer 106X(i,j). The structure that can be used for the layer 104 can be used for the layer 104X(i,j), and the structure that can be used for the layer 105 can be used for the layer 105X(i,j).

Structure Example 1 of Light-Emitting Device 550Y(i,j)

The light-emitting device 550Y(i,j) described in this embodiment includes an electrode 551Y(i,j), an electrode 552Y(i,j), a unit 103Y(i,j), a unit 103Y2(*i,j*), and a layer 106Y(i,j). The light-emitting device 550Y(i,j) includes a layer 104Y(i,j) and a layer 105Y(i,j).

The electrode 551Y(i,j) is adjacent to the electrode 551X (i,j), and a gap 551XY(i,j) is provided between the electrode 551X(i,j) and the electrode 551Y(i,j). The potential supplied to the electrode 551Y(i,j) may be the same as or different from the potential supplied to the electrode 551X(i,j). By supplying a different potential, the light-emitting device 550Y(i,j) can be driven under conditions different from those for the light-emitting device 550X(i,j).

The electrode 552Y(i,j) overlaps with the electrode 551Y (i,j).

The unit 103Y(i,j) is interposed between the electrode 551Y(i,j) and the electrode 552Y(i,j), and the unit 103Y2(*i,j*) is interposed between the electrode 552Y(i,j) and the unit 103Y(i,j). The layer 106Y(i,j) is interposed between the unit 103Y2(*i,j*) and the unit 103Y(i,j).

The layer 104Y(i,j) is interposed between the unit 103Y (i,j) and the electrode 551Y(i,j), and the layer 105Y(i,j) is interposed between the electrode 552Y(i,j) and the unit 103Y2(*i,j*).

For example, the structure that can be used for the electrode 551X(i,j) can be used for the electrode 551Y(i,j). Furthermore, part of a conductive film that can be used for the electrode 552X(i,j) can be used for the electrode 552Y (i,j).

For example, the light-emitting device 550X described in Embodiment 2 or Embodiment 3 can be used as the light-emitting device 550Y(i,j). Specifically, the structure that can be used for the electrode 551X can be used for the electrode 551Y(i,j). The structure that can be used for the unit 103X can be used for the unit 103Y(i,j), and the structure that can be used for the unit 103X2 can be used for the unit 103Y2(*i,j*). The structure that can be used for the layer 106 can be used for the layer 106Y(i,j). The structure that can be used for the layer 104 can be used for the layer 104Y(i,j), and the structure that can be used for the layer 105 can be used for the layer 105Y(i,j).

Note that some of the components of the light-emitting device 550X(i,j) can be used as some of the components of the light-emitting device 550Y(i,j). Thus, some of the components can be used in common. Alternatively, the manufacturing process can be simplified.

A structure emitting light whose hue is different from that of light emitted from the light-emitting device 550X(i,j) can be used for the light-emitting device 550Y(i,j). For example, the hue of light ELY emitted from the unit 103Y(i,j) can be different from that of the light ELX. Furthermore, the hue of light ELY2 emitted from the unit 103Y2(*i,j*) can be different from that of the light ELX2.

Moreover, a structure emitting light whose hue is the same as light emitted from the light-emitting device 550X(i,j) can be used for the light-emitting device 550Y(i,j). For example, both the light-emitting device 550X(i,j) and the light-emitting device 550Y(i,j) may emit white light.

A coloring layer is provided to overlap with the light-emitting device 550X(i,j), whereby light of a predetermined hue can be extracted from white light. Another coloring layer is provided to overlap with the light-emitting device 550Y(i,j), whereby light of another predetermined hue can be extracted from white light.

For example, both the light-emitting device 550X(i,j) and the light-emitting device 550Y(i,j) may emit blue light. A color conversion layer is provided to overlap with the light-emitting device 550X(i,j), whereby blue light can be converted into light of a predetermined hue. Another coloring layer is provided to overlap with the light-emitting device 550Y(i,j), whereby blue light can be converted into light of another predetermined hue. Blue light can be converted into green light or red light, for example.

Structure Example 2 of Display Apparatus 700

The display apparatus 700 described in this embodiment includes an insulating film 528 (see FIG. 4).

Structure Example of Insulating Film 528

The insulating film 528 has openings; one opening overlaps with the electrode 551X(i,j) and the other opening overlaps with the electrode 551Y(i,j). The insulating film 528 overlaps with a gap 551XY(i,j).

Structure Example of Gap 551XY(i,j)

The gap 551XY(i,j) interposed between the electrode 551X(i,j) and the electrode 551Y(i,j) has a groove-like shape, for example. Thus, a step is formed along the groove. A split portion or a portion with a small film thickness is formed between a film deposited over the gap 551XY(i,j) and a film deposited over the electrode 551X(i,j).

For example, when an anisotropic deposition method such as a heating evaporation method is used, a split portion or a portion with a small film thickness is formed along the step in a region 106XY(i,j) interposed between the layer 106X (i,j) and the layer 106Y(i,j).

Thus, for example, a current flowing through the region 106XY(i,j) can be reduced. Moreover, current flowing between the layer 106X(i,j) and the layer 106Y(i,j) can be reduced. Furthermore, a phenomenon in which the light-emitting device 550Y(i,j) that is adjacent to the light-emitting device 550X(i,j) unintentionally emits light in accordance with the operation of the light-emitting device 550X(i,j) can be inhibited.

Structure Example 3 of Display Apparatus 700

Figure 5:
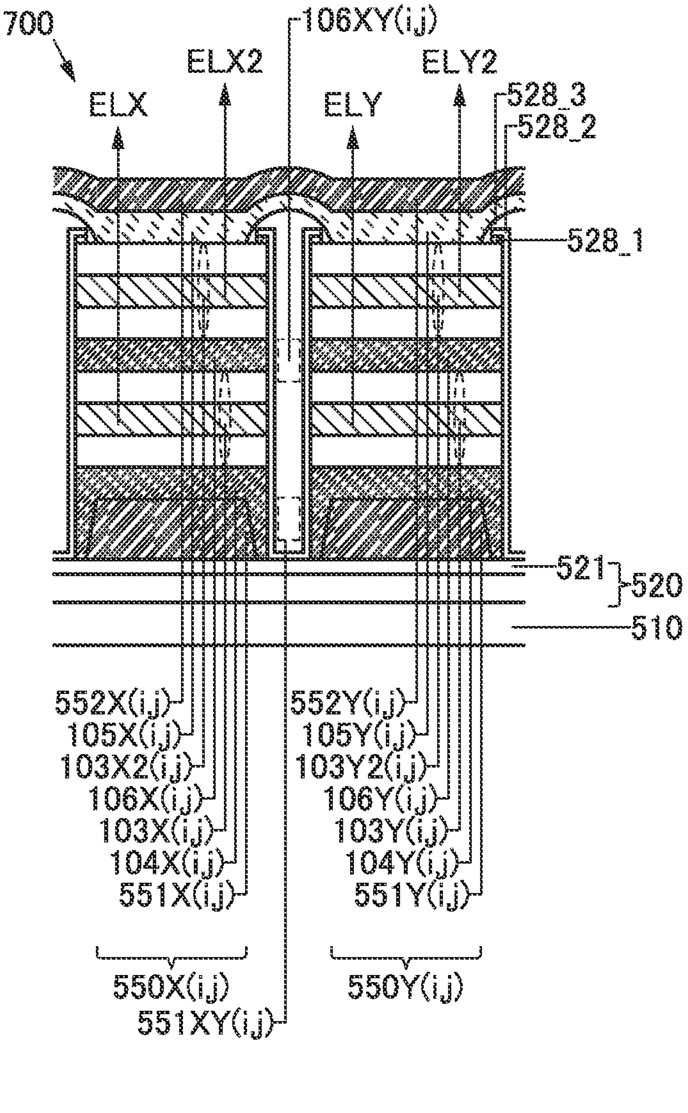
FIG. 5 is a diagram illustrating a structure of a display apparatus of an embodiment.

The display apparatus 700 described in this embodiment includes the light-emitting device 550X(i,j) and the light-emitting device 550Y(i,j) (see FIG. 5). The light-emitting device 550Y(i,j) is adjacent to the light-emitting device 550X(i,j).

Note that the display apparatus 700 is different from the display apparatus 700 described with reference to FIG. 4 in that an insulating film 528_1, an insulating film 528_2, and an insulating film 528_3 are included instead of the insulating film 528. Different portions will be described in detail below, and the above description is referred to for portions having the same structure as the above.

Structure Example of Insulating Film 528_1

The insulating film 528_1 has openings; one opening overlaps with the electrode 551X(i,j) and another opening overlaps with the electrode 551Y(i,j) (see FIG. 5). The insulating film 528_1 includes an opening overlapping with the gap 551XY(i,j).

Structure Example of Insulating Film 528_2

The insulating film 528_2 has openings; one opening overlaps with the electrode 551X(i,j) and another opening overlaps with the electrode 551Y(i,j). The insulating film 528_2 overlaps with the gap 551XY(i,j).

The insulating film 528_2 includes a region in contact with the layer 104X(i,j), the unit 103X(i,j), the layer 106X (i,j), and the unit 103X2(*i,j*).

The insulating film 528_2 includes a region in contact with the layer 104Y(i,j), the unit 103Y(i,j), the layer 106Y (i,j), and the unit 103Y2(*i,j*).

The layer 5282 includes a region in contact with the insulating film 521.

Structure Example of Insulating Film 528_3

The insulating film 528_3 has openings; one opening overlaps with the electrode 551X(i,j) and the other opening overlaps with the electrode 551Y(i,j). The insulating film 528_3 fills the groove formed in a region overlapping with the gap 551XY(i,j).

Accordingly, the layer 106X(i,j) can be electrically isolated from the layer 106Y(i,j), for example. For example, a current flowing through the region 106XY(i,j) can be reduced. Furthermore, a phenomenon in which the light-emitting device 550Y(i,j) that is adjacent to the light-emitting device 550X(i,j) unintentionally emits light in accordance with the operation of the light-emitting device 550X(i,j) can be inhibited. The size of a step generated between the top surface of the unit 103X2(*i,j*) and the top surface of the unit 103Y2(*i,j*) can be reduced. Occurrence of a phenomenon in which a split portion or a portion with a small film thickness due to the step is formed between the electrode 552X(i,j) and the electrode 552Y(i,j) can be inhibited. One conductive film can be used for the electrode 552X(i,j) and the electrode 552Y(i,j).

Note that this embodiment can be combined with any of the other embodiments described in this specification as appropriate.

Embodiment 5

In this embodiment, a light-emitting apparatus that includes the light-emitting device described in any one of Embodiment 1 to Embodiment 3 is described.

Figure 6A:
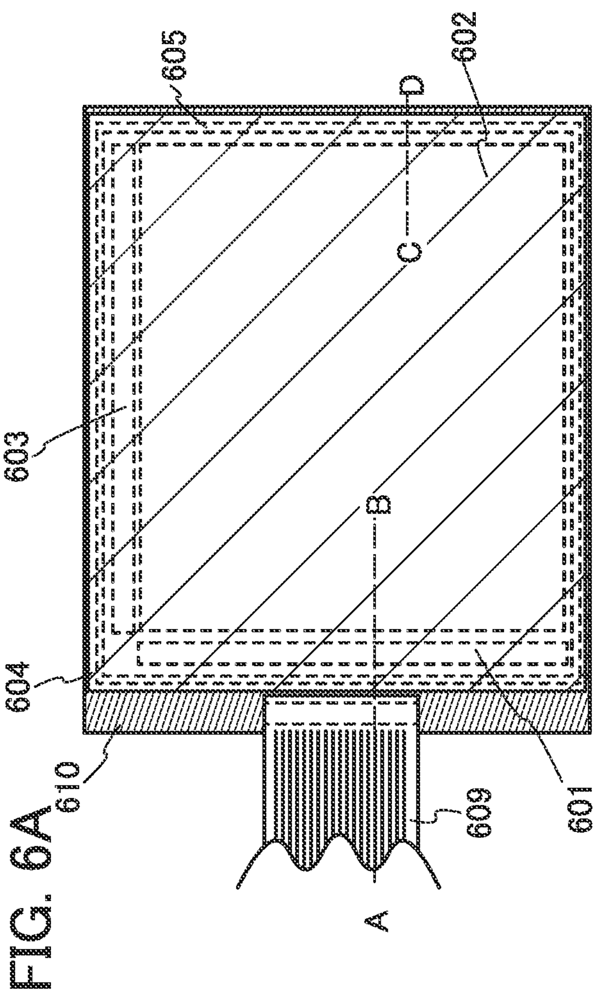
FIG. 6A and FIG. 6B are conceptual diagrams of an active matrix light-emitting apparatus.
Figure 6B:
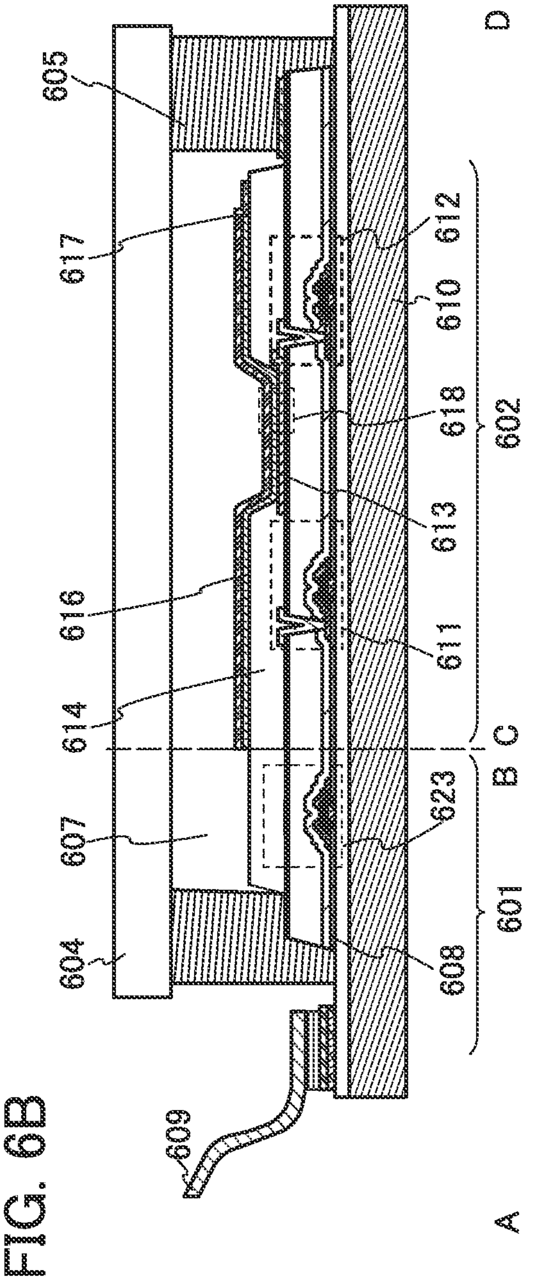

In this embodiment, a light-emitting apparatus manufactured using the light-emitting device described in any one of Embodiment 1 to Embodiment 3 is described with reference to FIG. 6. FIG. 6A is atop view illustrating the light-emitting apparatus, and FIG. 6B is a cross-sectional view taken along A-B and C-D in FIG. 6A. This light-emitting apparatus includes a pixel portion 602 and a driver circuit portion illustrated with dotted lines, which control light emission of the light-emitting devices, and the driver circuit portion includes a source line driver circuit 601 and a gate line driver circuit 603. The light-emitting apparatus is provided with a sealing substrate 604 and a sealant 605, and a space 607 is surrounded by the sealant 605.

A lead wiring 608 is a wiring for transmitting signals to be input to the source line driver circuit 601 and the gate line driver circuit 603 and receives a video signal, a clock signal, a start signal, a reset signal, or the like from an FPC (flexible printed circuit) serving as an external input terminal 609. Although only the FPC is illustrated here, a printed wiring board (PWB) may be attached to the FPC. The light-emitting apparatus in this specification includes, in its category, not only the light-emitting apparatus itself but also the light-emitting apparatus provided with the FPC or the PWB.

Next, a cross-sectional structure is described with reference to FIG. 6B. The driver circuit portions and the pixel portion are formed over an element substrate 610; here, the source line driver circuit 601, which is a driver circuit portion, and one pixel in the pixel portion 602 are illustrated.

The element substrate 610 may be formed using a substrate containing glass, quartz, an organic resin, a metal, an alloy, a semiconductor, or the like or a plastic substrate formed of FRP (Fiber Reinforced Plastics), PVF (polyvinyl fluoride), polyester, an acrylic resin, or the like.

There is no particular limitation on the structure of transistors used in pixels or driver circuits. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case degradation of the transistor characteristics can be inhibited.

Here, an oxide semiconductor is preferably used for semiconductor devices such as the transistors provided in the pixels or the driver circuits and transistors used for after-mentioned touch sensors and the like. In particular, an oxide semiconductor having a wider band gap than silicon is preferably used. When an oxide semiconductor having a wider band gap than silicon is used, the off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and having no grain boundary between adjacent crystal parts.

The use of such materials for the semiconductor layer makes it possible to provide a highly reliable transistor in which a change in the electrical characteristics is inhibited.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic device with extremely low power consumption can be obtained.

For stable characteristics or the like of the transistor, a base film is preferably provided. The base film can be formed to be a single layer or a stacked layer using an inorganic insulating film such as a silicon oxide film, a silicon nitride film, a silicon oxynitride film, or a silicon nitride oxide film. The base film can be formed by a sputtering method, a CVD (Chemical Vapor Deposition) method (e.g., a plasma CVD method, a thermal CVD method, or an MOCVD (Metal Organic CVD) method), an ALD (Atomic Layer Deposition) method, a coating method, a printing method, or the like. Note that the base film does not have to be provided if not necessary.

Note that an FET 623 is illustrated as a transistor formed in the source line driver circuit 601. The driver circuit is formed with any of a variety of circuits such as a CMOS circuit, a PMOS circuit, or an NMOS circuit. Although a driver-integrated type in which the driver circuit is formed over the substrate is described in this embodiment, the driver circuit is not necessarily formed over the substrate, and the driver circuit can be formed outside, not over the substrate.

The pixel portion 602 is formed with a plurality of pixels including a switching FET 611, a current control FET 612, and a first electrode 613 electrically connected to a drain of the current control FET 612; however, without being limited thereto, a pixel portion in which three or more FETs and a capacitor are combined may be employed.

Note that an insulator 614 is formed to cover an end portion of the first electrode 613. Here, the insulator 614 can be formed using a positive photosensitive acrylic resin film.

In order to improve the coverage with an EL layer or the like which is formed later, the insulator 614 is formed to have a curved surface with curvature at its upper or lower end portion. For example, in the case where a positive photosensitive acrylic resin is used as a material for the insulator 614, only the upper end portion of the insulator 614 preferably has a curved surface with a curvature radius (greater than or equal to 0.2 μm and less than or equal to 3 μm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material having a high work function is desirably used. For example, a single-layer film of an ITO film, an indium tin oxide film containing silicon, an indium oxide film containing zinc oxide at higher than or equal to 2 wt % and lower than or equal to 20 wt %, a titanium nitride film, a chromium film, a tungsten film, a Zn film, a Pt film, or the like, a stacked layer of a titanium nitride film and a film containing aluminum as its main component, a three-layer structure of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has the structure described in any one of Embodiment 1 to Embodiment 3. As another material included in the EL layer 616, a low molecular compound or a high molecular compound (including an oligomer or a dendrimer) may be used.

As a material used for the second electrode 617, which is formed over the EL layer 616 and functions as a cathode, a material having a low work function (e.g., Al, Mg, Li, Ca, or an alloy or a compound thereof (MgAg, MgIn, AlLi, or the like)) is preferably used. Note that in the case where light generated in the EL layer 616 passes through the second electrode 617, it is preferable to use, for the second electrode 617, a stacked layer of a thin metal film and a transparent conductive film (e.g., ITO, indium oxide containing zinc oxide at higher than or equal to 2 wt % and lower than or equal to 20 wt %, indium tin oxide containing silicon, or zinc oxide (ZnO)).

Note that a light-emitting device is formed with the first electrode 613, the EL layer 616, and the second electrode 617. The light-emitting device is the light-emitting device described in any one of Embodiment 1 to Embodiment 3. A plurality of light-emitting devices are formed in the pixel portion, and the light-emitting apparatus of this embodiment may include both the light-emitting device described in any one of Embodiment 1 to Embodiment 3 and a light-emitting device having a different structure.

The sealing substrate 604 is attached to the element substrate 610 with the sealant 605, so that the light-emitting device 618 is provided in the space 607 surrounded by the element substrate 610, the sealing substrate 604, and the sealant 605. The space 607 is filled with a filler; it is filled with an inert gas (e.g., nitrogen or argon) in some cases, and filled with the sealant in other cases. It is preferable that the sealing substrate have a recessed portion provided with a desiccant, in which case degradation due to the influence of moisture can be inhibited.

Note that an epoxy-based resin or glass frit is preferably used for the sealant 605. Furthermore, these materials are preferably materials that transmit moisture and oxygen as little as possible. As the material used for the sealing substrate 604, in addition to a glass substrate and a quartz substrate, a plastic substrate formed of FRP (Fiber Reinforced Plastics), PVF (polyvinyl fluoride), polyester, an acrylic resin, or the like can be used.

Although not illustrated in FIG. 6A or FIG. 6B, a protective film may be provided over the second electrode. The protective film is formed using an organic resin film or an inorganic insulating film. The protective film may be formed so as to cover an exposed portion of the sealant 605. The protective film can be provided to cover surfaces and side surfaces of the pair of substrates and exposed side surfaces of a sealing layer, an insulating layer, and the like.

The protective film can be formed using a material that does not easily transmit an impurity such as water. Thus, diffusion of an impurity such as water from the outside into the inside can be effectively inhibited.

As a material of the protective film, an oxide, a nitride, a fluoride, a sulfide, a ternary compound, a metal, a polymer, or the like can be used. For example, it is possible to use a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, or the like; a material containing aluminum nitride, hafnium nitride, silicon nitride, tantalum nitride, titanium nitride, niobium nitride, molybdenum nitride, zirconium nitride, gallium nitride, or the like; or a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a film formation method with favorable step coverage. One of such methods is an atomic layer deposition (ALD) method. A material that can be formed by an ALD method is preferably used for the protective film. With the use of an ALD method, a dense protective film with reduced defects such as cracks or pinholes or with a uniform thickness can be formed.

Furthermore, damage caused to a process member in forming the protective film can be reduced.

By an ALD method, for example, a uniform protective film with few defects can be formed even on a surface with a complex uneven shape or upper, side, and lower surfaces of a touch panel.

As described above, the light-emitting apparatus manufactured using the light-emitting device described in any one of Embodiment 1 to Embodiment 3 can be obtained.

The light-emitting apparatus in this embodiment is manufactured using the light-emitting device described in any one of Embodiment 1 to Embodiment 3 and thus can have favorable characteristics. Specifically, since the light-emitting device described in any one of Embodiment 1 to Embodiment 3 has favorable emission efficiency, the light-emitting apparatus can have low power consumption.

Figure 7A:
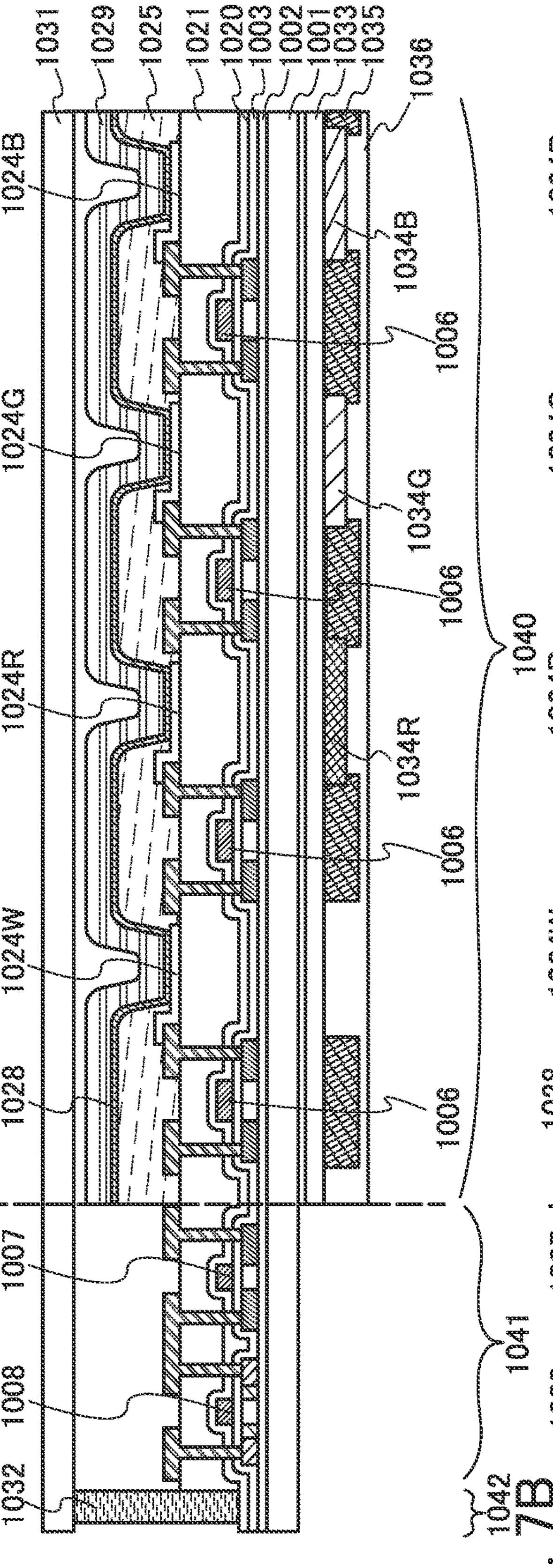
FIG. 7A and FIG. 7B are conceptual diagrams of an active matrix light-emitting apparatus.

FIG. 7 illustrates examples of a light-emitting apparatus in which full color display is achieved by formation of light-emitting devices emitting white light and provision of coloring layers (color filters) and the like. FIG. 7A illustrates a substrate 1001; a base insulating film 1002; a gate insulating film 1003; a gate electrode 1006; a gate electrode 1007; a gate electrode 1008; a first interlayer insulating film 1020; a second interlayer insulating film 1021; a peripheral portion 1042; a pixel portion 1040; a driver circuit portion 1041; an electrode 1024W, an electrode 1024R, an electrode 1024G, and an electrode 1024B of the light-emitting devices; a partition 1025; an EL layer 1028; an electrode 1029 of the light-emitting devices; a sealing substrate 1031; a sealant 1032; and the like.

In FIG. 7A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036. In FIG. 7A, a light-emitting layer from which light is emitted to the outside without passing through the coloring layer and light-emitting layers from which light is emitted to the outside, passing through the coloring layers of the respective colors are shown. Since light that does not pass through the coloring layer is white and light that passes through the coloring layer is red, green, or blue, an image can be expressed by pixels of the four colors.

Figure 7B:
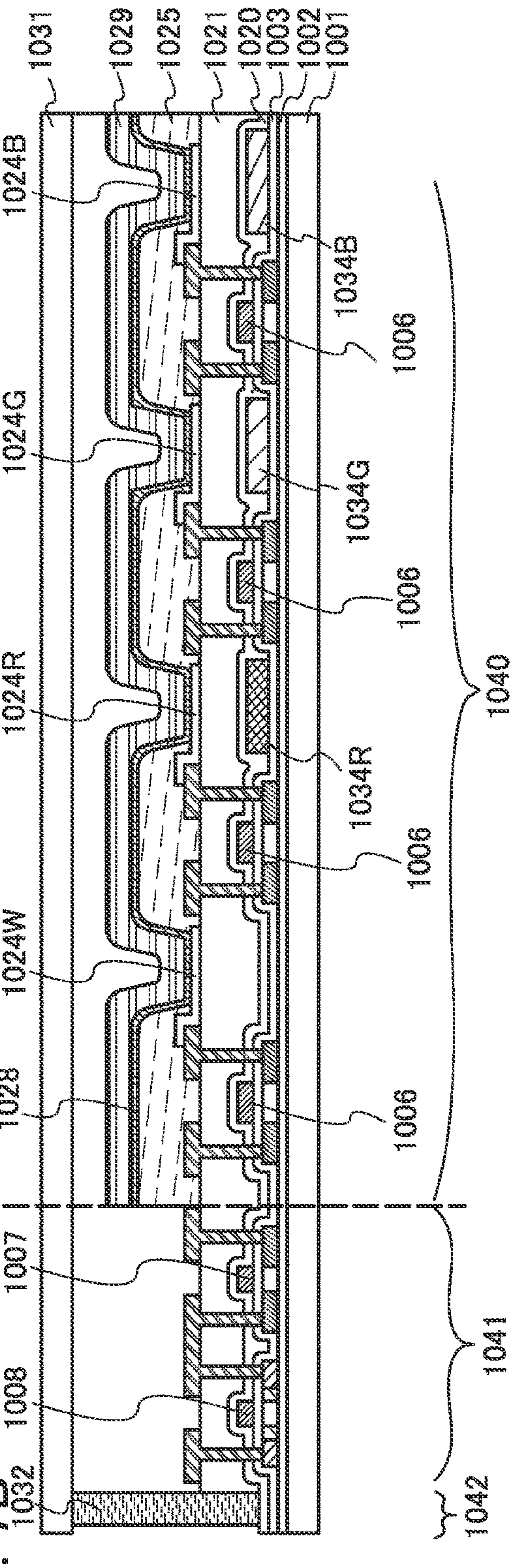

FIG. 7B shows an example in which the coloring layers (the red coloring layer 1034R, the green coloring layer 1034G, and the blue coloring layer 1034B) are formed between the gate insulating film 1003 and the first interlayer insulating film 1020. As in the structure, the coloring layers may be provided between the substrate 1001 and the sealing substrate 1031.

Figure 8:
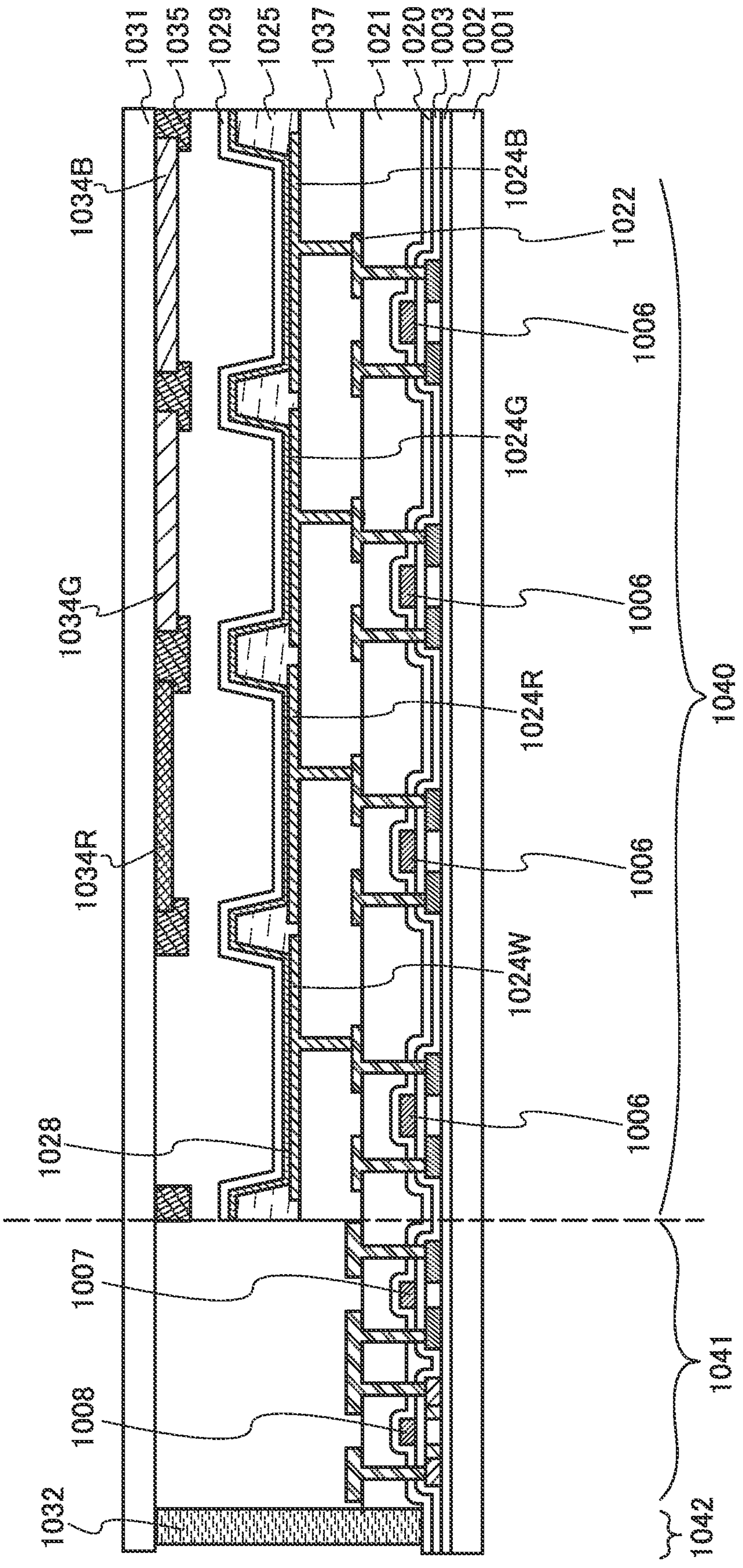
FIG. 8 is a conceptual diagram of an active matrix light-emitting apparatus.

The above-described light-emitting apparatus has a structure in which light is extracted from the substrate 1001 side where FETs are formed (a bottom emission structure), but may have a structure in which light is extracted from the sealing substrate 1031 side (atop emission structure). FIG. 8 shows a cross-sectional view of a top-emission light-emitting apparatus. In this case, a substrate that does not transmit light can be used as the substrate 1001. The process up to the step of forming a connection electrode that connects the FET and the anode of the light-emitting device is performed in a manner similar to that of the light-emitting apparatus having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any of other known materials.

The electrode 1024W, the electrode 1024R, the electrode 1024G, and the electrode 1024B of the light-emitting devices are each an anode here, but may each be a cathode. In the case of the top-emission light-emitting apparatus such as one in FIG. 8, the electrode 1024W, the electrode 1024R, the electrode 1024G, and the electrode 1024B are preferably reflective electrodes. The structure of the EL layer 1028 is a structure as described in any one of Embodiment 1 to Embodiment 3, and is an element structure with which white light emission can be obtained.

In the case of such a top-emission structure as in FIG. 8, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 that is located between pixels. The coloring layers (the red coloring layer 1034R, the green coloring layer 1034G, and the blue coloring layer 1034B) or the black matrix 1035 may be covered with the overcoat layer. Note that a substrate having a light-transmitting property is used as the sealing substrate 1031. Although an example in which full color display is performed using four colors of red, green, blue, and white is described here, there is no particular limitation and full color display may be performed using four colors of red, yellow, green, and blue or three colors of red, green, and blue.

In the top-emission light-emitting apparatus, a microcavity structure can be favorably employed. A light-emitting device with a microcavity structure can be obtained with the use of a reflective electrode as the first electrode and a transflective electrode as the second electrode. The light-emitting device with a microcavity structure includes at least an EL layer between the reflective electrode and the transflective electrode, and the EL layer includes at least a light-emitting layer serving as a light-emitting region.

Note that the reflective electrode is a film having a visible light reflectivity of 40% to 100%, preferably 70% to 100%, and a resistivity lower than or equal to $1\times10^{-2}$ Ωcm. In addition, the transflective electrode is a film having a visible light reflectivity of 20% to 80%, preferably 40% to 70%, and a resistivity lower than or equal to $1\times10^{-2}$ Ωcm.

Light emitted from the light-emitting layer included in the EL layer is reflected and resonated by the reflective electrode and the transflective electrode.

In the light-emitting device, by changing the thickness of the transparent conductive film, the above-described composite material, the carrier-transport material, or the like, the optical path length between the reflective electrode and the transflective electrode can be changed. Thus, light with a wavelength that is resonated between the reflective electrode and the transflective electrode can be intensified while light with a wavelength that is not resonated therebetween can be attenuated.

Note that light that is reflected back by the reflective electrode (first reflected light) considerably interferes with light that directly enters the transflective electrode from the light-emitting layer (first incident light). For this reason, the optical path length between the reflective electrode and the light-emitting layer is preferably adjusted to $(2n-1)\lambda/4$ (n is a natural number of 1 or larger and λ is a wavelength of light to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer; for example, in combination with the structure of the above-described tandem light-emitting device, a plurality of EL layers each including a single or a plurality of light-emitting layer(s) may be provided in one light-emitting device with a charge-generation layer interposed between the EL layers.

With the microcavity structure, emission intensity with a specific wavelength in the front direction can be increased, whereby power consumption can be reduced. Note that in the case of a light-emitting apparatus that displays images with subpixels of four colors, red, yellow, green, and blue, the luminance can be increased owing to yellow light emission and each subpixel can employ a microcavity structure suitable for wavelengths of the corresponding color, so that the light-emitting apparatus can have favorable characteristics.

The light-emitting apparatus in this embodiment is manufactured using the light-emitting device described in any one of Embodiment 1 to Embodiment 3 and thus can have favorable characteristics. Specifically, since the light-emitting device described in any one of Embodiment 1 to Embodiment 3 has favorable emission efficiency, the light-emitting apparatus can have low power consumption.

Figure 9A:
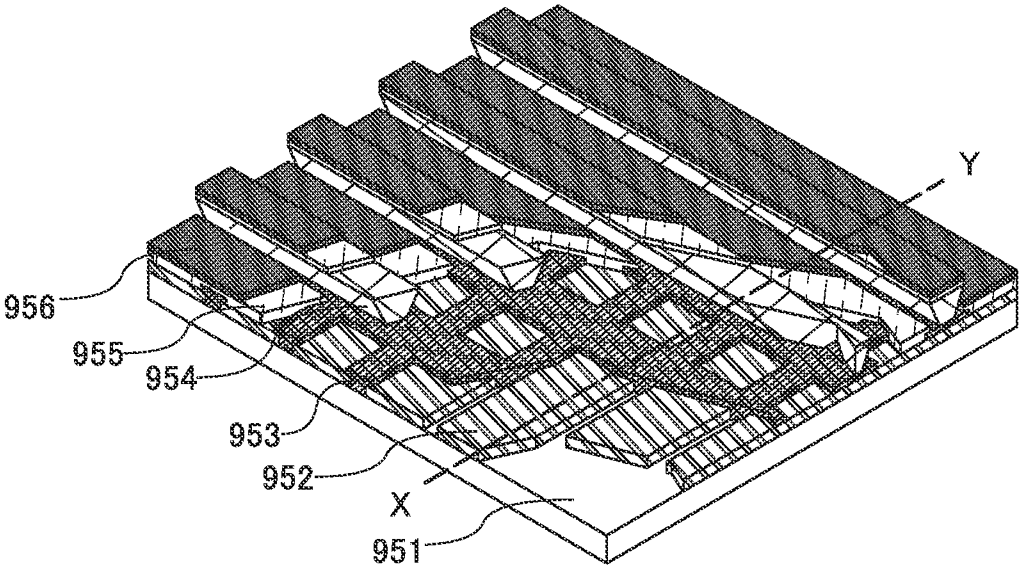
FIG. 9A and FIG. 9B are conceptual diagrams of a passive matrix light-emitting apparatus.
Figure 9B:
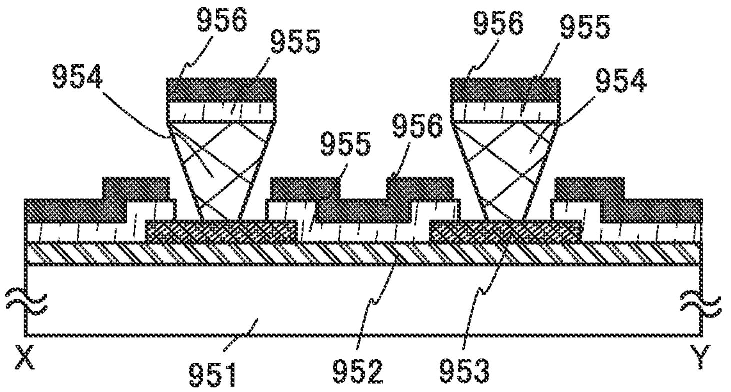

The active matrix light-emitting apparatus is described above, whereas a passive matrix light-emitting apparatus is described below. FIG. 9 illustrates a passive matrix light-emitting apparatus manufactured using the present invention. Note that FIG. 9A is a perspective view illustrating the light-emitting apparatus, and FIG. 9B is a cross-sectional view taken along X-Y in FIG. 9A. In FIG. 9, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. That is, a cross section in the short side direction of the partition layer 954 has a trapezoidal shape, and the lower side (the side facing the same direction as the plane direction of the insulating layer 953 and touching the insulating layer 953) is shorter than the upper side (the side facing the same direction as the plane direction of the insulating layer 953, and not touching the insulating layer 953). The partition layer 954 thus provided can prevent defects in the light-emitting device due to static electricity or the like. The passive matrix light-emitting apparatus also uses the light-emitting device described in any one of Embodiment 1 to Embodiment 3; thus, the light-emitting apparatus can have favorable reliability or low power consumption.

In the light-emitting apparatus described above, many minute light-emitting devices arranged in a matrix can each be controlled; thus, the light-emitting apparatus can be suitably used as a display apparatus for displaying images.

This embodiment can be freely combined with any of the other embodiments.

Embodiment 6

Figure 10A:
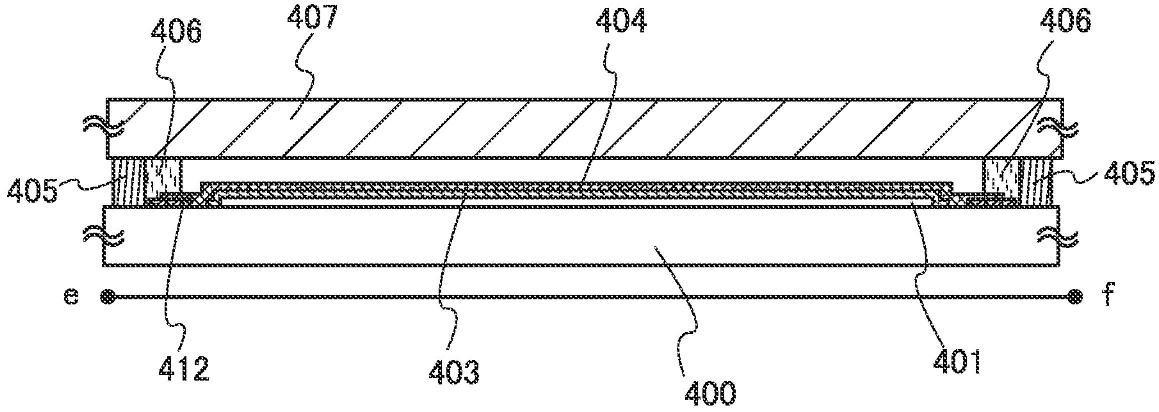
FIG. 10A and FIG. 10B are diagrams showing a lighting device.
Figure 10B:
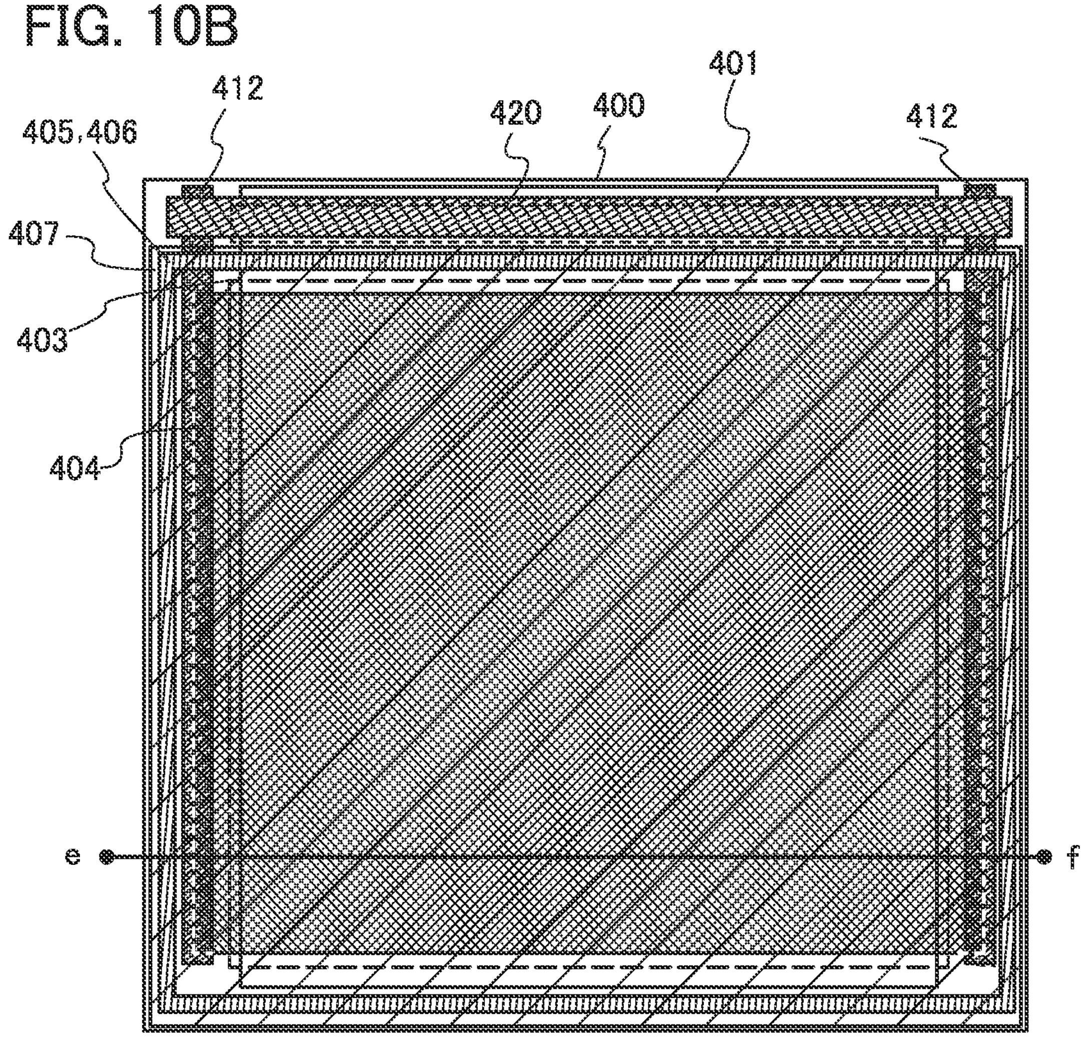

In this embodiment, an example in which the light-emitting device described in any one of Embodiment 1 to Embodiment 3 is used for a lighting device is described with reference to FIG. 10. FIG. 10B is a top view of the lighting device, and FIG. 10A is a cross-sectional view taken along e-f in FIG. 10B.

In the lighting device in this embodiment, a first electrode 401 is formed over a substrate 400 that is a support and has a light-transmitting property. The first electrode 401 corresponds to the electrode 551X in any one of Embodiment 1 to Embodiment 3. In the case where light emission is extracted from the first electrode 401 side, the first electrode 401 is formed using a material having a light-transmitting property.

A pad 412 for supplying a voltage to a second electrode 404 is formed over the substrate 400.

An EL layer 403 is formed over the first electrode 401. The EL layer 403 corresponds to the structure in which the layer 104, the unit 103X, and the layer 105 are combined, the structure in which the layer 104, the unit 103X, the layer 106, the unit 103X2, and the layer 105 are combined, or the like in Embodiment 2 or Embodiment 3. Note that for these structures, the corresponding description can be referred to.

The second electrode 404 is formed to cover the EL layer 403. The second electrode 404 corresponds to the electrode 552X in Embodiment 2 or Embodiment 3. In the case where light emission is extracted from the first electrode 401 side, the second electrode 404 is formed using a material having high reflectivity. The second electrode 404 is supplied with a voltage when connected to the pad 412.

As described above, the lighting device described in this embodiment includes a light-emitting device including the first electrode 401, the EL layer 403, and the second electrode 404. Since the light-emitting device is a light-emitting device with high emission efficiency, the lighting device in this embodiment can have low power consumption.

The substrate 400 provided with the light-emitting device having the above structure is fixed to a sealing substrate 407 with a sealant 405 and a sealant 406 and sealing is performed, whereby the lighting device is completed. It is possible to use only either the sealant 405 or the sealant 406. In addition, the inner sealant 406 (not shown in FIG. 10B) can be mixed with a desiccant, which enables moisture to be adsorbed, resulting in improved reliability.

When parts of the pad 412 and the first electrode 401 are provided to extend to the outside of the sealant 405 and the sealant 406, the extended parts can serve as external input terminals. An IC chip 420 mounted with a converter or the like may be provided over the external input terminals, for example.

The lighting device described in this embodiment includes the light-emitting device described in any one of Embodiment 1 to Embodiment 3 as an EL element; thus, the lighting device can have low power consumption.

Embodiment 7

In this embodiment, examples of electronic devices each partly including the light-emitting device described in any one of Embodiment 1 to Embodiment 3 are described. The light-emitting device described in any one of Embodiment 1 to Embodiment 3 is a light-emitting device with favorable emission efficiency and low power consumption. As a result, the electronic devices described in this embodiment can be electronic devices each including a light-emitting portion with low power consumption.

Examples of the electronic device including the above light-emitting device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic devices are described below.

Figure 11A:
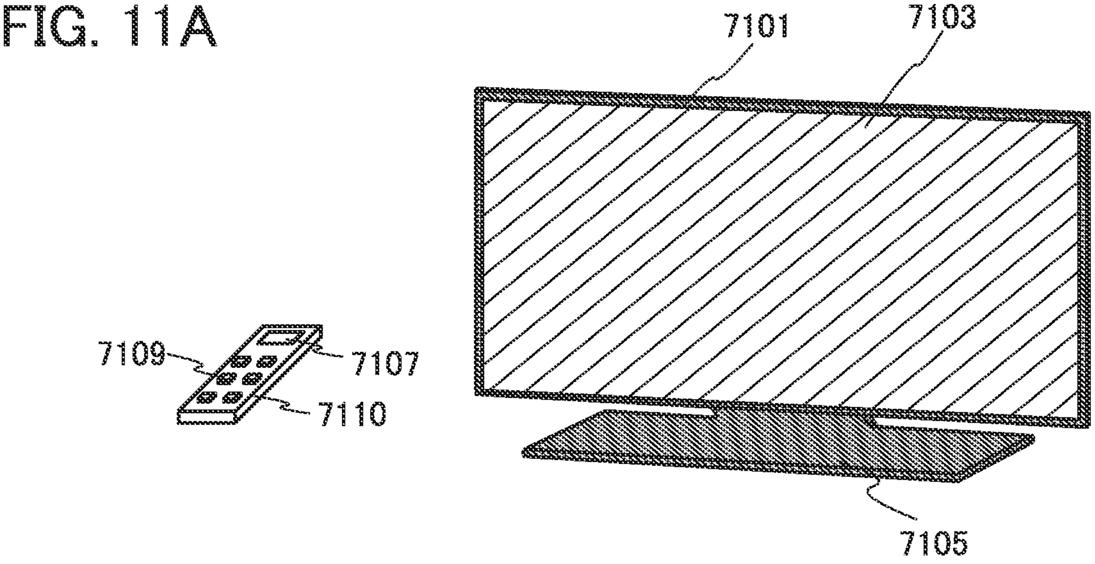
FIG. 11A to FIG. 11D are diagrams showing electronic devices.

FIG. 11A illustrates an example of a television device. In the television device, a display portion 7103 is incorporated in a housing 7101. Here, the housing 7101 is supported by a stand 7105. Images can be displayed on the display portion 7103, and the light-emitting devices described in any one of Embodiment 1 to Embodiment 3 are arranged in a matrix in the display portion 7103.

The television device can be operated with an operation switch of the housing 7101 or a separate remote controller 7110. With operation keys 7109 of the remote controller 7110, channels and volume can be operated and images displayed on the display portion 7103 can be operated. Furthermore, the remote controller 7110 may be provided with a display portion 7107, on which information output from the remote controller 7110 may be displayed.

Note that the television device has a structure including a receiver, a modem, or the like. With the use of the receiver, a general television broadcast can be received, and moreover, when the television device is connected to a communication network with or without wires via the modem, one-way (from a sender to a receiver) or two-way (between a sender and a receiver or between receivers) information communication can be performed.

Figure 11B:
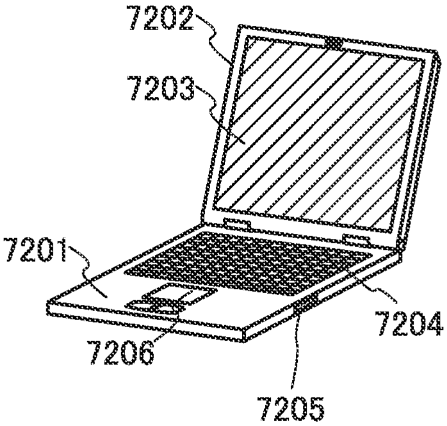
Figure 11C:
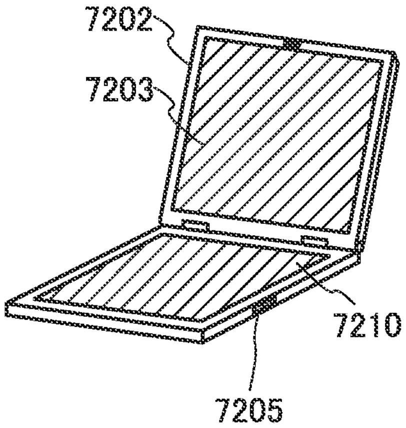

FIG. 11B shows a computer that includes a main body 7201, a housing 7202, a display portion 7203, a keyboard 7204, an external connection port 7205, a pointing device 7206, and the like. Note that this computer is manufactured using the light-emitting devices described in any one of Embodiment 1 to Embodiment 3 arranged in a matrix in the display portion 7203. The computer in FIG. 11B may be in a mode as illustrated in FIG. 11C. The computer in FIG. 11C is provided with a second display portion 7210 instead of the keyboard 7204 and the pointing device 7206. The second display portion 7210 is of a touch-panel type, and input can be performed by operating display for input displayed on the second display portion 7210 with a finger or a dedicated pen. The second display portion 7210 can also display images other than the display for input. The display portion 7203 may also be a touch panel. Connecting the two screens with a hinge can prevent troubles such as a crack in or damage to the screens caused when the computer is stored or carried.

Figure 11D:
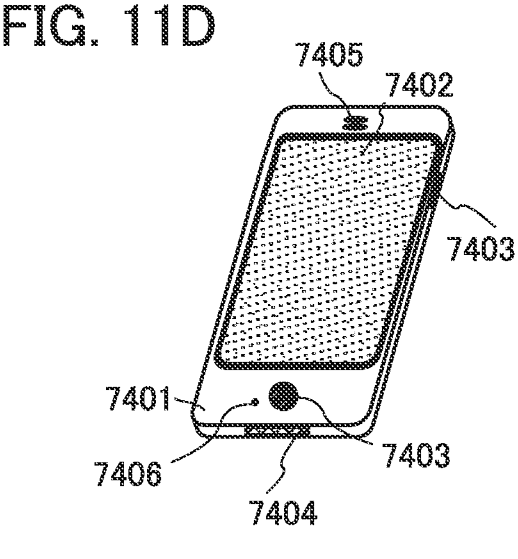

FIG. 11D illustrates an example of a portable terminal. The portable terminal includes operation buttons 7403, an external connection port 7404, a speaker 7405, a microphone 7406, and the like in addition to a display portion 7402 incorporated in a housing 7401. Note that the portable terminal includes the display portion 7402 that is manufactured by arranging the light-emitting devices described in any one of Embodiment 1 to Embodiment 3 in a matrix.

The portable terminal illustrated in FIG. 11D can have a structure in which information can be input by touching the display portion 7402 with a finger or the like. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting information such as text. The third mode is a display-and-input mode in which the two modes, the display mode and the input mode, are combined.

For example, in the case of making a call or creating an e-mail, the text input mode mainly for inputting text is selected for the display portion 7402 so that text displayed on the screen can be input. In this case, it is preferable to display a keyboard or number buttons on almost the entire screen of the display portion 7402.

When a detection device including a sensor such as a gyroscope sensor or an acceleration sensor for detecting inclination is provided inside the portable terminal, display on the screen of the display portion 7402 can be automatically changed by determining the orientation of the portable terminal (whether the portable terminal is placed vertically or horizontally).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is moving image data, the screen mode is switched to the display mode. When the signal is text data, the screen mode is switched to the input mode.

Moreover, in the input mode, when input by touching the display portion 7402 is not performed for a certain period while a signal detected by an optical sensor in the display portion 7402 is sensed, the screen mode may be controlled so as to be switched from the input mode to the display mode.

The display portion 7402 can also function as an image sensor. For example, an image of a palm print, a fingerprint, or the like is taken when the display portion 7402 is touched with the palm or the finger, whereby personal authentication can be performed. Furthermore, by providing a backlight that emits near-infrared light or a sensing light source that emits near-infrared light in the display portion, an image of a finger vein, a palm vein, or the like can be taken.

Figure 12A:
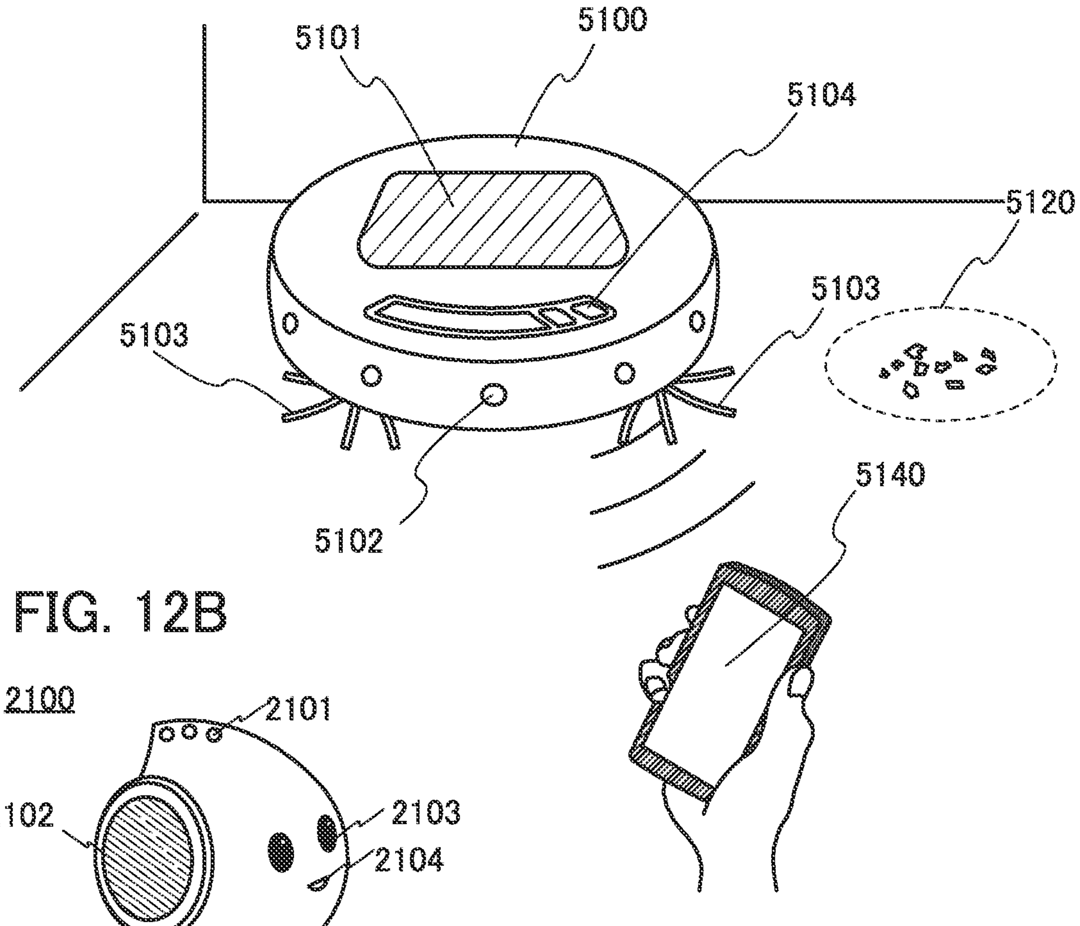
FIG. 12A to FIG. 12C are diagrams showing electronic devices.

FIG. 12A is a schematic view showing an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, senses dust 5120, and vacuums the dust through the inlet provided on the bottom surface.

The cleaning robot 5100 can determine whether there is an obstacle such as a wall, furniture, or a step by analyzing images taken by the cameras 5102. When an object that is likely to be caught in the brush 5103, such as a wire, is sensed by image analysis, the rotation of the brush 5103 can be stopped.

The display 5101 can display the remaining capacity of a battery, the amount of vacuumed dust, or the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. Images taken by the cameras 5102 can be displayed on the portable electronic device 5140. Accordingly, an owner of the cleaning robot 5100 can monitor his/her room even when the owner is not at home. The owner can also check the display on the display 5101 by the portable electronic device 5140 such as a smartphone.

The light-emitting apparatus of one embodiment of the present invention can be used for the display 5101.

Figure 12B:
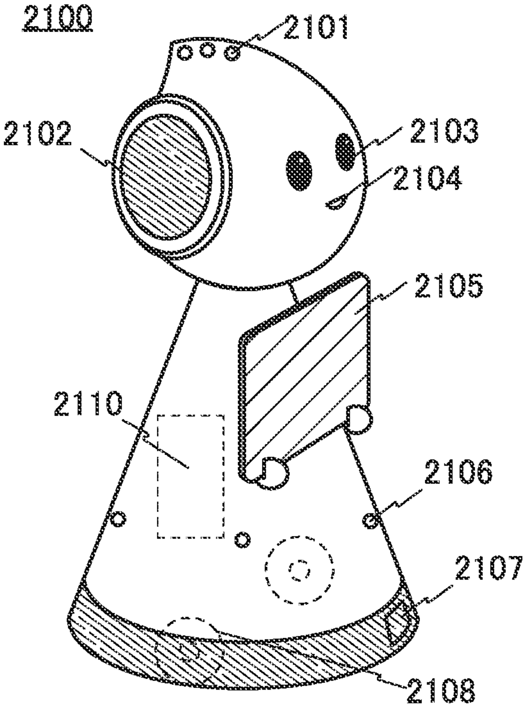

A robot 2100 illustrated in FIG. 12B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of sensing a speaking voice of a user, an environmental sound, and the like. The speaker 2104 has a function of outputting sound. The robot 2100 can communicate with a user by using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 12C:
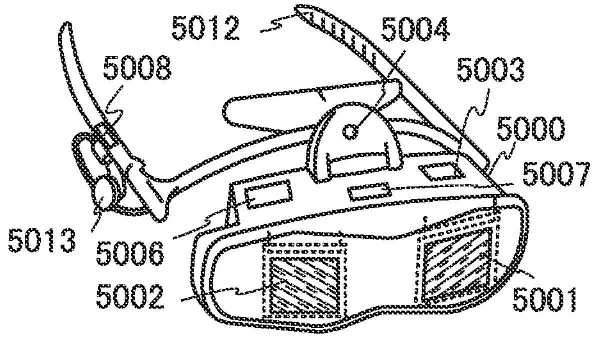

FIG. 12C is a diagram illustrating an example of a goggle-type display. The goggle-type display includes, for example, a housing 5000, a display portion 5001, a speaker 5003, an LED lamp 5004, operation keys (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, a chemical substance, sound, time, hardness, an electric field, current, voltage, power, radiation, flow rate, humidity, gradient, oscillation, odor, or infrared rays), a microphone 5008, a display portion 5002, a support 5012, and an earphone 5013.

The light-emitting apparatus of one embodiment of the present invention can be used for the display portion 5001 and the display portion 5002.

Figure 13:
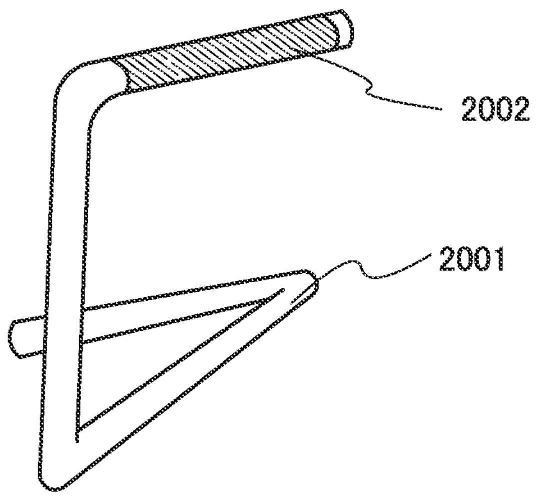
FIG. 13 is a diagram showing a lighting device.

FIG. 13 shows an example where the light-emitting device described in any one of Embodiment 1 to Embodiment 3 is used for a table lamp which is a lighting device. The table lamp illustrated in FIG. 13 includes a housing 2001 and a light source 2002, and the lighting device described in Embodiment 6 may be used for the light source 2002.

Figure 14:
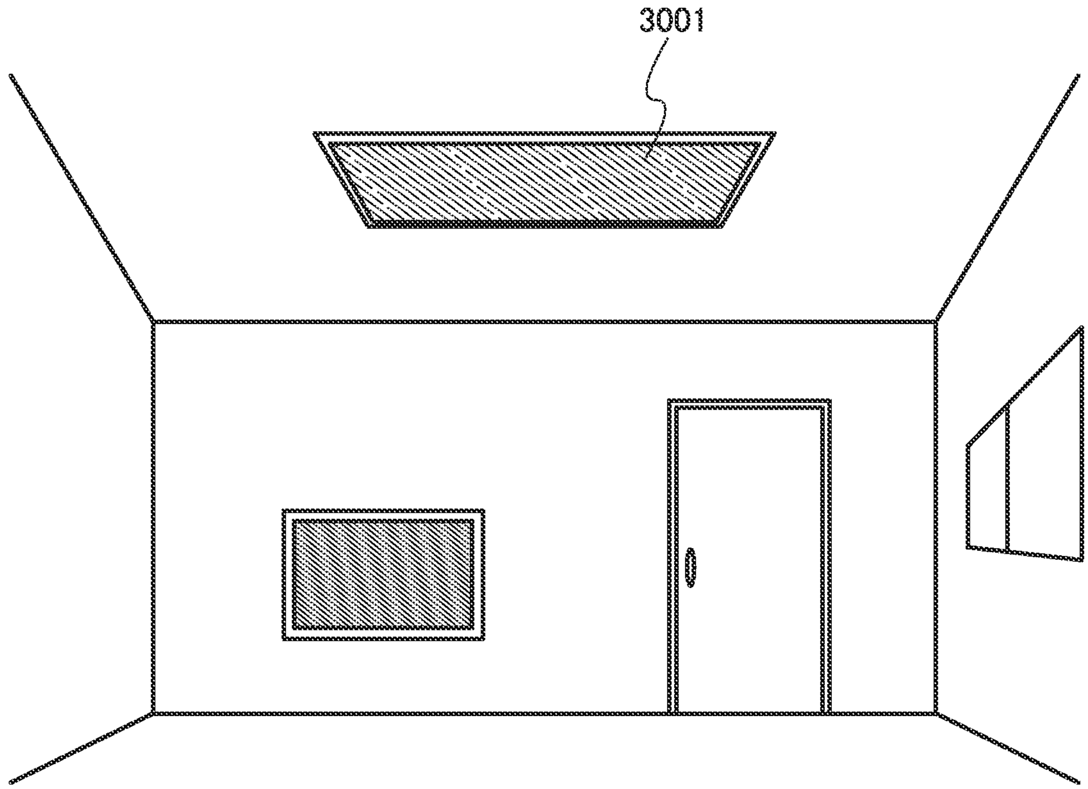
FIG. 14 is a diagram showing a lighting device.

FIG. 14 shows an example where the light-emitting device described in any one of Embodiment 1 to Embodiment 3 is used for an indoor lighting device 3001. Since the light-emitting device described in any one of Embodiment 1 to Embodiment 3 is a light-emitting device with high emission efficiency, the lighting device can have low power consumption. In addition, the light-emitting device described in any one of Embodiment 1 to Embodiment 3 can have a larger area, and thus can be used for a large-area lighting device. Furthermore, the light-emitting device described in any one of Embodiment 1 to Embodiment 3 is thin, and thus can be used for a lighting device having a reduced thickness.

Figure 15:
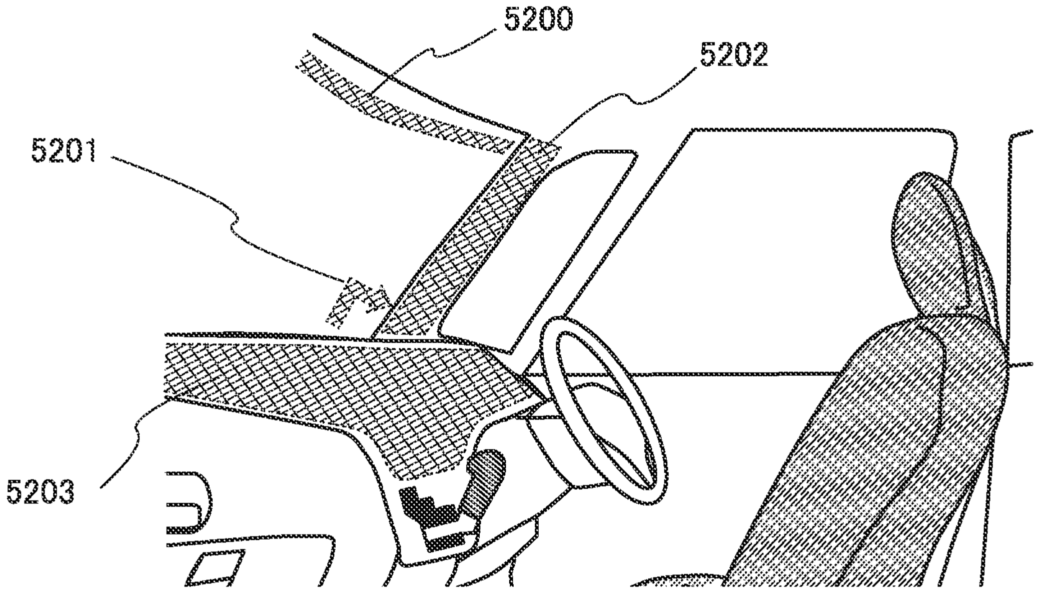
FIG. 15 is a diagram showing in-vehicle display apparatuses and lighting devices.

The light-emitting device described in any one of Embodiment 1 to Embodiment 3 can also be incorporated in a windshield or a dashboard of an automobile. FIG. 15 illustrates one mode in which the light-emitting device described in any one of Embodiment 1 to Embodiment 3 is used for a windshield or a dashboard of an automobile. A display region 5200 to a display region 5203 are each a display region provided using the light-emitting device described in any one of Embodiment 1 to Embodiment 3.

The display region 5200 and the display region 5201 are display apparatuses provided in the automobile windshield, in which the light-emitting devices described in any one of Embodiment 1 to Embodiment 3 are incorporated. When the light-emitting devices described in any one of Embodiment 1 to Embodiment 3 are manufactured using electrodes having light-transmitting properties as a first electrode and a second electrode, what is called see-through display apparatuses, through which the opposite side can be seen, can be obtained. Such see-through display apparatuses can be provided even in the automobile windshield without hindering the view. Note that in the case where a driving transistor or the like is provided, a transistor having a light-transmitting property, such as an organic transistor formed using an organic semiconductor material or a transistor formed using an oxide semiconductor, is preferably used.

The display region 5202 is a display apparatus provided in a pillar portion, in which the light-emitting devices described in any one of Embodiment 1 to Embodiment 3 are incorporated. The display region 5202 can compensate for the view hindered by the pillar by displaying an image taken by an image capturing means provided in the car body. Similarly, the display region 5203 provided in the dashboard portion can compensate for the view hindered by the car body by displaying an image taken by an image capturing means provided on the outside of the automobile; thus, blind areas can be eliminated to enhance the safety. Images that compensate for the areas that a driver cannot see enable the driver to ensure safety easily and comfortably.

The display region 5203 can provide a variety of information by displaying navigation information, speed, revolutions, a mileage, a fuel level, a gearshift state, air-condition setting, and the like. The content or layout of the display can be changed freely in accordance with the preference of a user. Note that such information can also be displayed on the display region 5200 to the display region 5202. The display region 5200 to the display region 5203 can also be used as lighting devices.

Figure 16A:
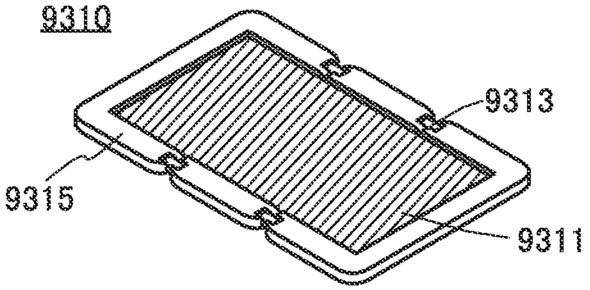
FIG. 16A to FIG. 16C are diagrams showing an electronic device.
Figure 16B:
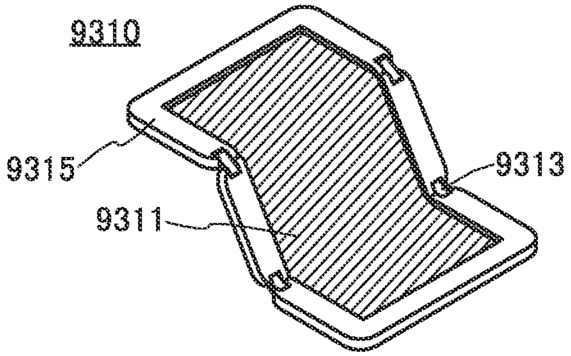
Figure 16C:
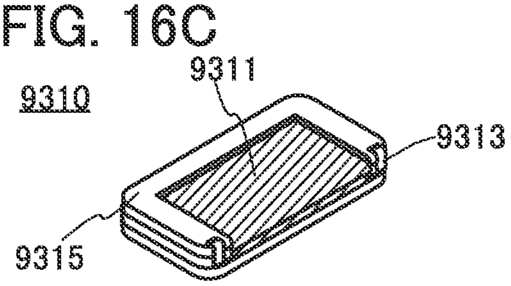

FIG. 16A to FIG. 16C illustrate a foldable portable information terminal 9310. FIG. 16A illustrates the portable information terminal 9310 that is opened. FIG. 16B illustrates the portable information terminal 9310 that is in the state of being changed from one of an opened state and a folded state to the other. FIG. 16C illustrates the portable information terminal 9310 that is folded. The portable information terminal 9310 is excellent in portability when folded, and is excellent in display browsability when opened because of a seamless large display region.

A display panel 9311 is supported by three housings 9315 joined together by hinges 9313. Note that the display panel 9311 may be a touch panel (an input/output device) that includes a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

Note that the structures described in this embodiment can be combined with any of the structures described in Embodiment 1 to Embodiment 3 as appropriate.

As described above, the application range of the light-emitting apparatus that includes the light-emitting device described in any one of Embodiment 1 to Embodiment 3 is wide, so that this light-emitting apparatus can be applied to electronic devices in a variety of fields. With the use of the light-emitting device described in any one of Embodiment 1 to Embodiment 3, an electronic device with low power consumption can be obtained.

Note that this embodiment can be combined with any of the other embodiments described in this specification as appropriate.

EXAMPLE

In this example, a light-emitting device 1 of embodiments of the present invention is described with reference to FIG. 17 to FIG. 24.

Figure 17A:
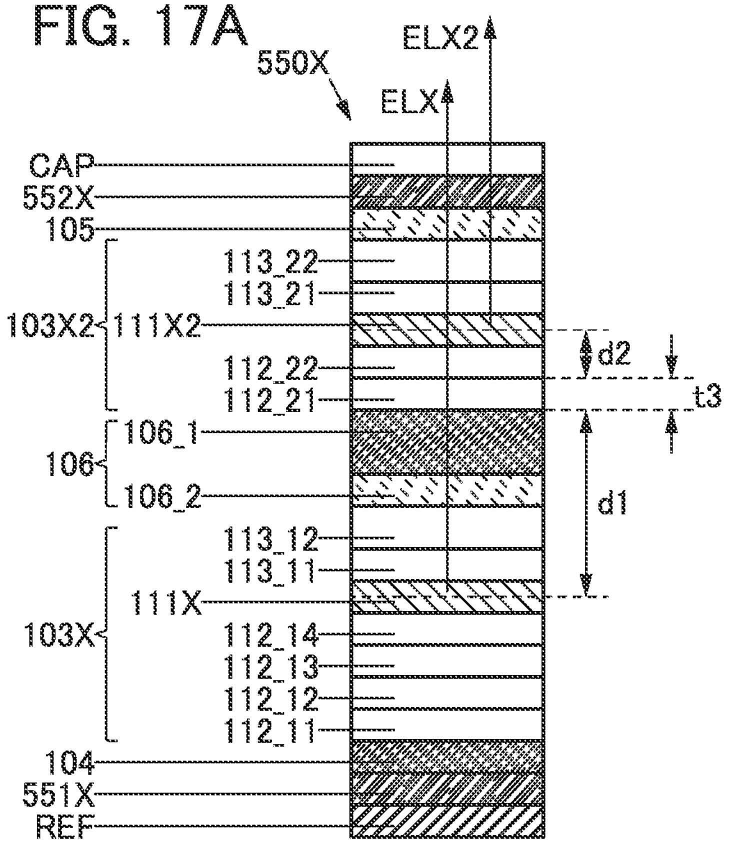
FIG. 17A and FIG. 17B are diagrams illustrating a structure of light-emitting devices of an example.
Figure 17B:
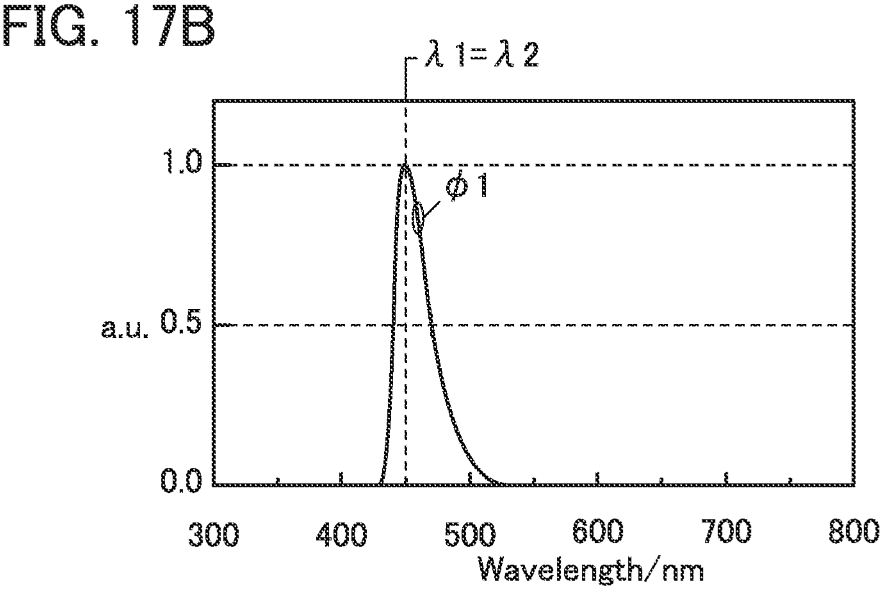

FIG. 17A is a diagram illustrating the structure of the light-emitting device 550X. FIG. 17B is a schematic diagram showing an emission spectrum of the light-emitting material used for the light-emitting device 1.

Figure 18:
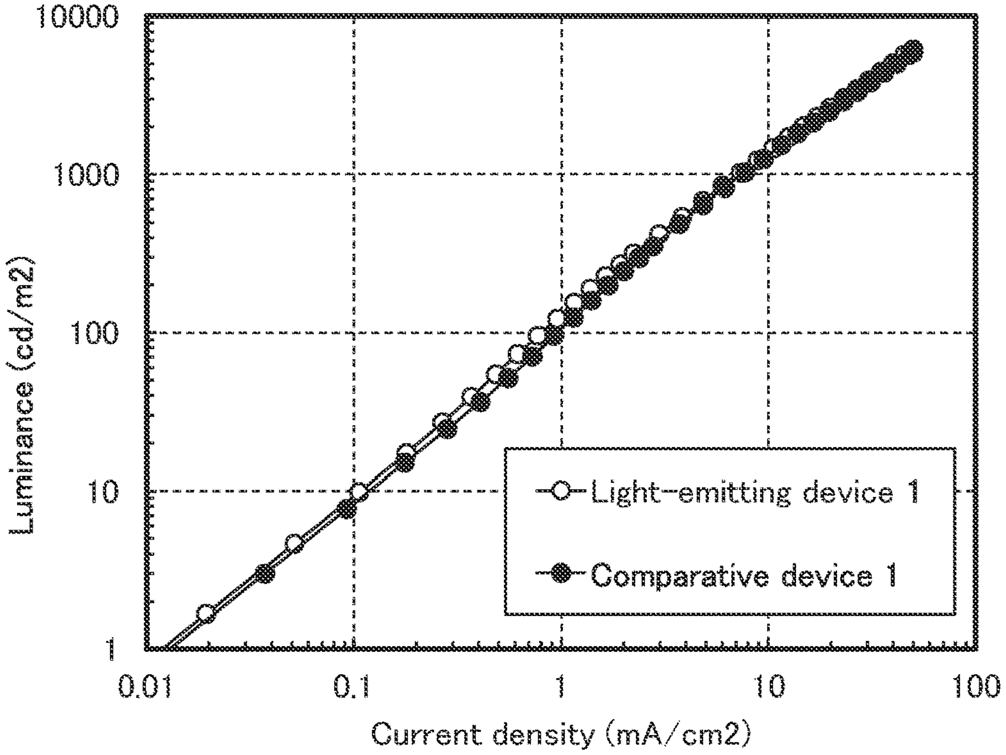
FIG. 18 is a diagram showing current density-luminance characteristics of light-emitting devices of an example.

FIG. 18 is a diagram showing the current density-luminance characteristics of the light-emitting device 1.

Figure 19:
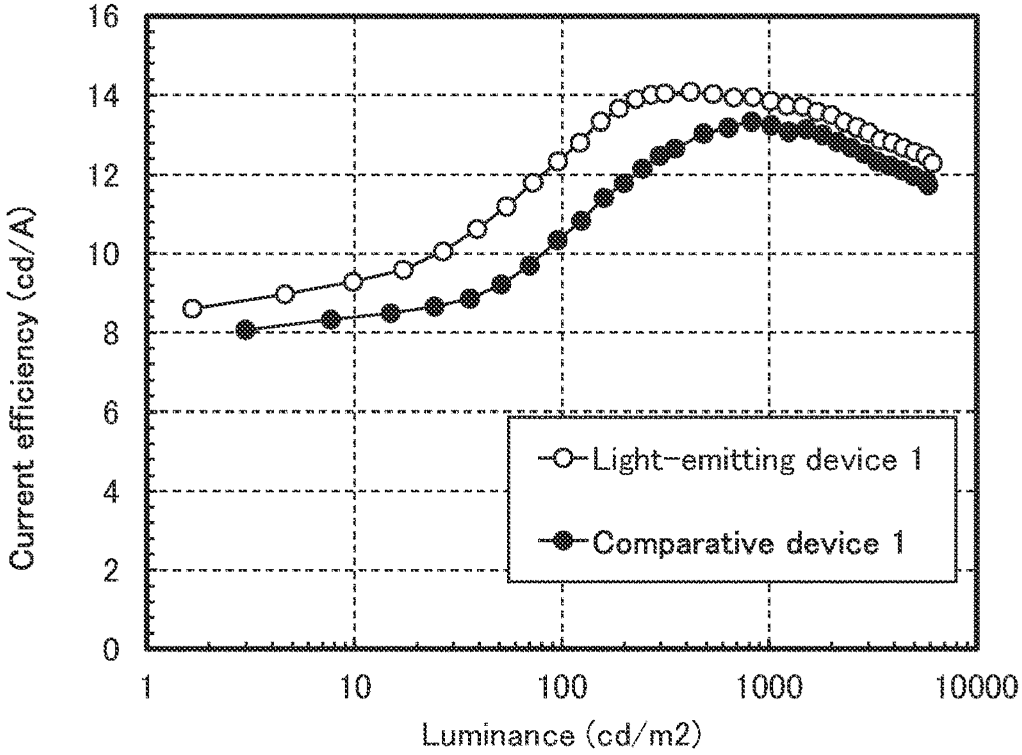
FIG. 19 is a diagram showing luminance-current efficiency characteristics of light-emitting devices of an example.

FIG. 19 is a diagram showing the luminance-current efficiency characteristics of the light-emitting device 1.

Figure 20:
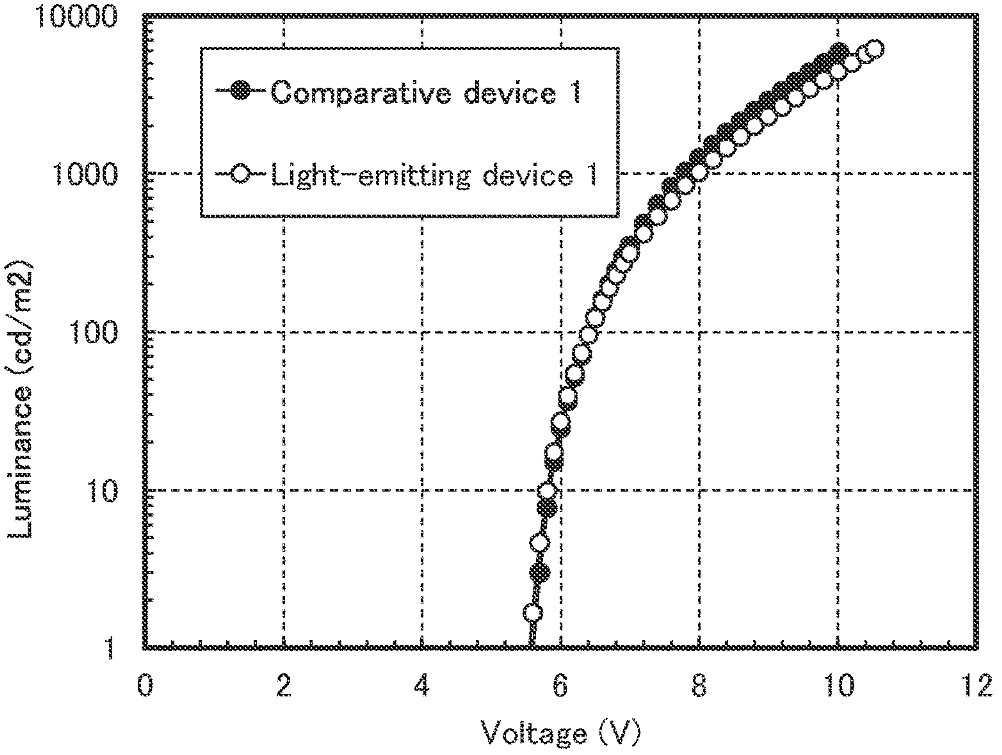
FIG. 20 is a diagram showing voltage-luminance characteristics of light-emitting devices of an example.

FIG. 20 is a diagram showing the voltage-luminance characteristics of the light-emitting device 1.

Figure 21:
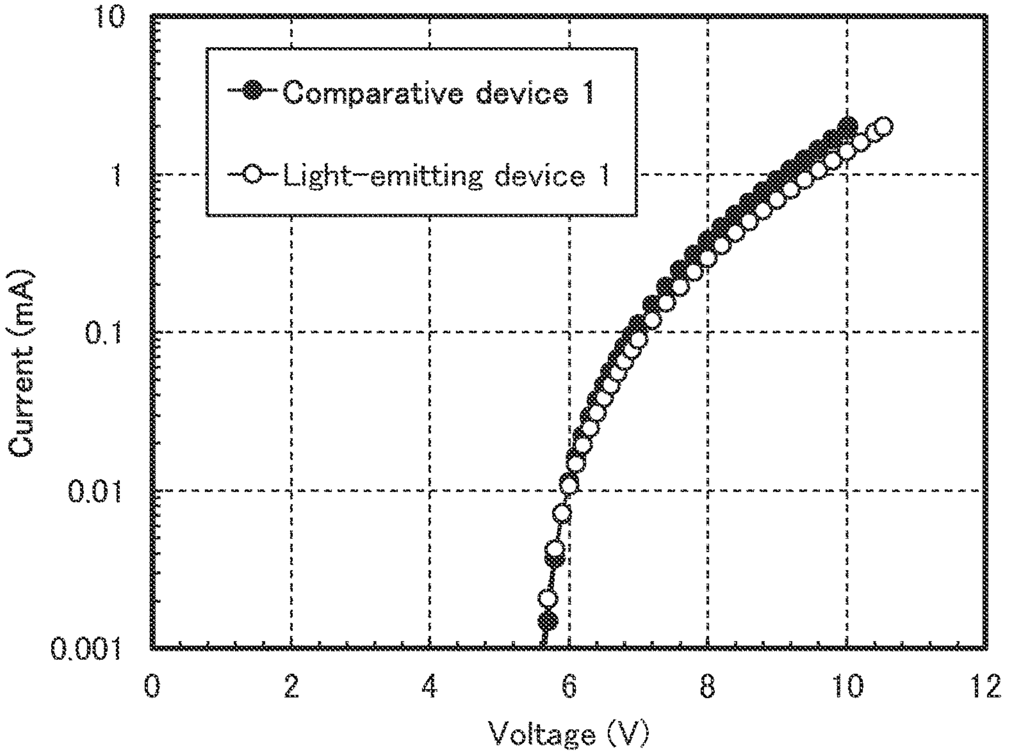
FIG. 21 is a diagram showing voltage-current characteristics of light-emitting devices of an example.

FIG. 21 is a diagram showing the voltage-current characteristics of the light-emitting device 1.

Figure 22:
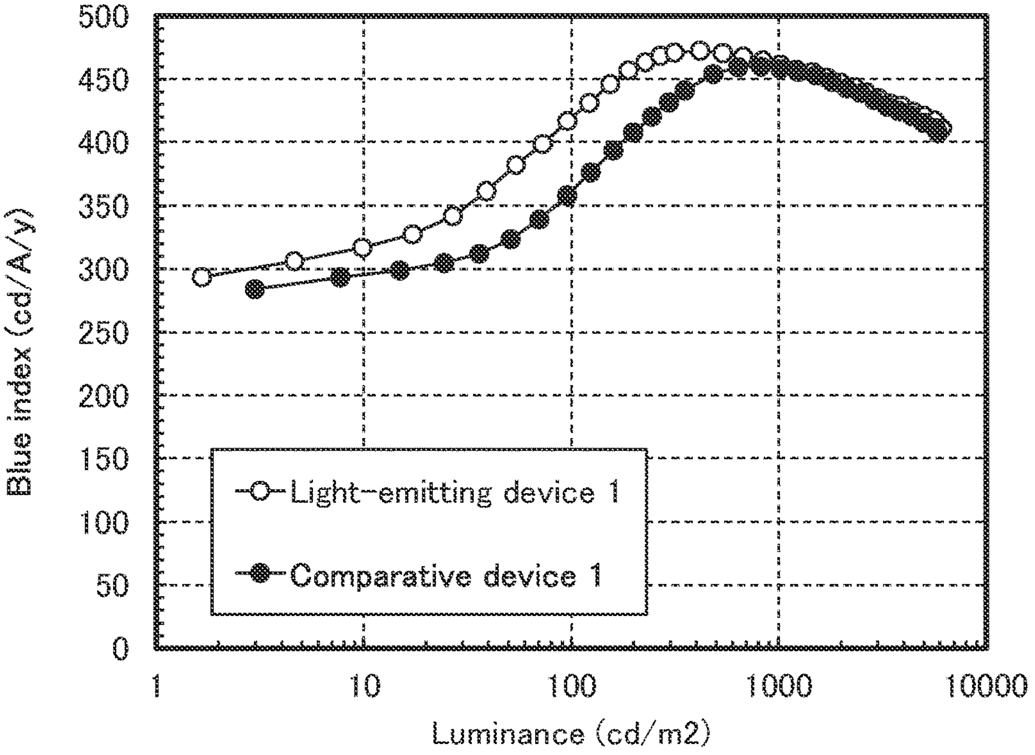
FIG. 22 is a diagram showing luminance-blue index characteristics of light-emitting devices of an example.

FIG. 22 is a diagram showing luminance-blue index characteristics of the light-emitting device 1. Note that the blue index (BI) is one of the indicators of characteristics of a blue-light-emitting device, and is a value obtained by dividing current efficiency (cd/A) by chromaticity y. In general, blue light with high color purity is useful in expressing a wide color gamut. In addition, blue light with higher color purity tends to have lower chromaticity y. Thus, a value obtained by dividing current efficiency (cd/A) by chromaticity y is the indicator of usefulness of a blue-light-emitting device. In other words, a blue-light-emitting device with a large BI is suitable for providing a display apparatus having a wide color gamut and high efficiency.

Figure 23:
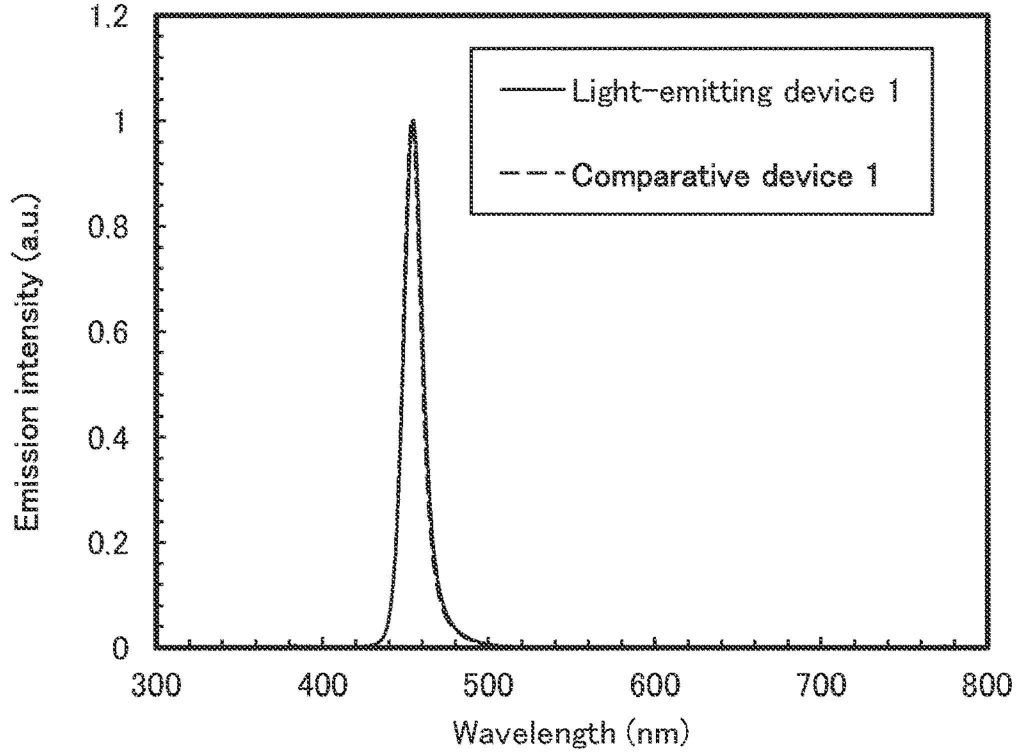
FIG. 23 is a diagram showing emission spectra of light-emitting devices of an example.

FIG. 23 is a diagram showing the emission spectrum of the light-emitting device 1 emitting light at a luminance of 1000 cd/$m^2$.

Figure 24:
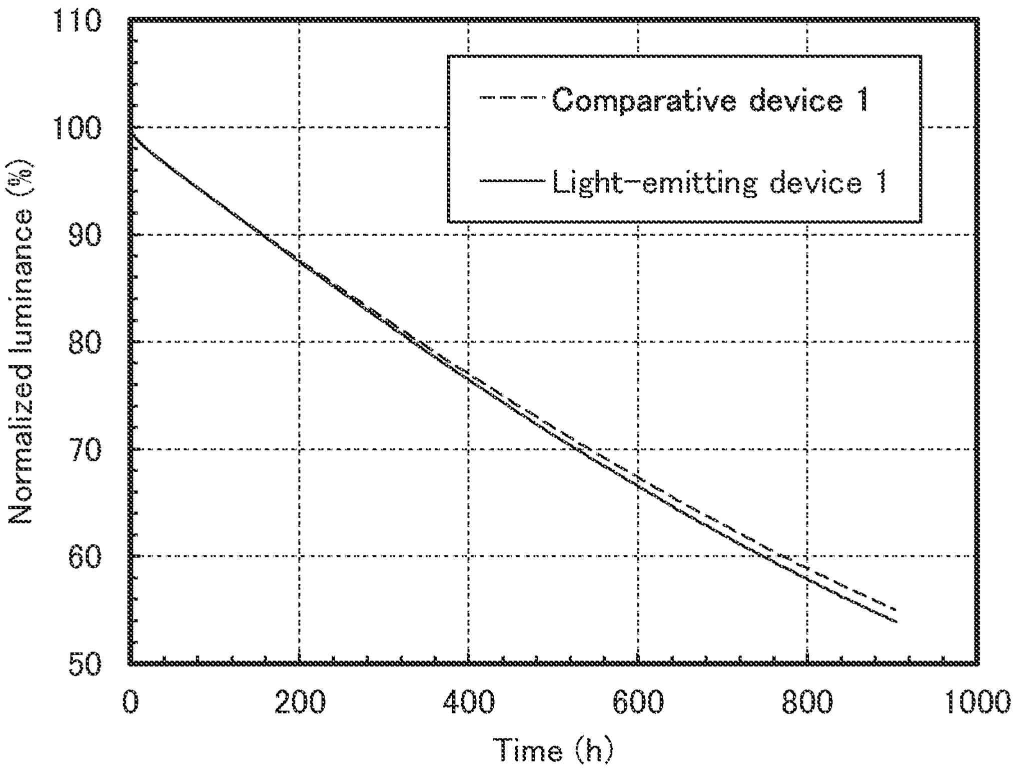
FIG. 24 is a diagram showing temporal changes in normalized luminance of light-emitting devices of an example.

FIG. 24 is a graph showing temporal change characteristics of normalized luminance in the case where a comparative device 1 and the light-emitting device 1 each emit light at a constant current density of 50 mA/$cm^2$.

<Light-Emitting Device 1>

The manufactured light-emitting device 1, which is described in this example, has a structure similar to that of the light-emitting device 550X (see FIG. 17A).

The light-emitting device 550X of one embodiment of the present invention includes the electrode 551X, the electrode 552X, the layer 111X, the layer 111X2, and the layer 112_21.

The layer 111X is interposed between the electrode 551X and the electrode 552X, the layer 111X2 is interposed between the electrode 552X and the layer 111X, and the layer 112_21 is interposed between the layer 111X2 and the layer 111X.

The layer 111X contains the light-emitting material EM1, the light-emitting material EM1 has the emission spectrum having the maximum at the wavelength λ1, and the layer 111X has the ordinary refractive index n1 at the wavelength λ1.

The layer 111X2 contains the light-emitting material EM2, the light-emitting material EM2 has the emission spectrum having the maximum at the wavelength λ2, and the layer 111X2 has the ordinary refractive index n2 at the wavelength λ2.

The layer 112_21 has the ordinary refractive index n31 which is lower than the ordinary refractive index n1 at the wavelength λ1, and the layer 112_21 has the ordinary refractive index n32 which is lower than the ordinary refractive index n2 at the wavelength λ2.

In the light-emitting device 550X, the layer 112_21 has the distance d1 from a center plane of the layer 111X, and the layer 112_21 has the distance d2 from a center plane of the layer 111X2. The layer 112_21 has the thickness t3.

The distance d1, the distance d2, the thickness t3, the wavelength λ1, the wavelength λ2, the ordinary refractive index n1, the ordinary refractive index n2, the ordinary refractive index n31, and the ordinary refractive index n32 satisfy the following Formula (1) and Formula (2).

[Formula 5]

$$n1 \times d1 + n31 \times t3 < \frac{1}{2} \times \lambda 1 \quad (1)$$

$$n2 \times d2 + n32 \times t3 < \frac{1}{2} \times \lambda 2 \quad (2)$$

<<Structure of Light-Emitting Device 1>>

Table 1 shows the structure of the light-emitting device 1. Structural formulae of materials used for the light-emitting device described in this example are shown below. Note that in the tables in this example, subscript characters and superscript characters are written in ordinary size for convenience. For example, subscript characters in abbreviations and superscript characters in units are written in ordinary size in the tables. Such notations in the tables can be replaced by referring to the description in the specification.

Note that the distance d1 is 50.1 nm, and the distance d2 is 20 nm. The thickness t3 is 40 nm. The wavelength λ1 and the wavelength λ2 are each 455 nm, the ordinary refractive index n1 and the ordinary refractive index n2 are each 1.93, and the ordinary refractive index n31 and the ordinary refractive index n32 are each 1.73. A spectroscopic ellipsometer (M-2000U, produced by J.A. Woollam Japan Corp.) was used for measuring a refractive index of a material. For the measurement sample, an approximately 50 nm-thick film of the material formed over a quartz substrate was used, and for thin film formation, a vacuum evaporation method was used.

Thus, the left side of Formula (1) above represents (1.93×50.1)+(1.73×40)=165.893 and the right side represents (0.5×455)=227.5, satisfying Formula (1) above.

The left side of Formula (2) above represents (1.93×20)+(1.73×40)=107.8 and the right side represents (0.5×455)=227.5, also satisfying Formula (2) above.

TABLE 1

| Structure | Reference numeral | Material | Composition ratio | Thickness/nm |
|---|---|---|---|---|
| Layer | CAP | BisBTc | | 65 |
| Electrode | 552X | Ag:Mg | 10:1 | 15 |
| Layer | 105 | LIF | | 2 |
| Layer | 113_22 | mmtBumBPTzn:Li-6mq | 0.5:0.5 | 20 |
| Layer | 113_21 | 6mBP-4Cz2PPm | | 10 |
| Layer | 111X2 | αN-βNP Anth:DPhA-tBu4DABNA | 1:0.015 | 20 |
| Layer | 112_22 | DBfBB1TP | | 10 |
| Layer | 112_21 | mmtBumTPoFBi-04 | | 40 |
| Layer | 106_1 | PCBBiF:OCHD-003 | 1:0.1 | 10 |
| Layer | 106_2 | Li2O | | 0.1 |
| Layer | 113_12 | NBPhen | | 20 |
| Layer | 113_11 | 6mBP-4Cz2PPm | | 10 |
| Layer | 111X | αN-βNP Anth:DPhA-tBu4DABNA | 1:0.015 | 20 |
| Layer | 112_14 | DBfBB1TP | | 10 |
| Layer | 112_13 | mmtBuBioFBi | | 40 |
| Layer | 112_12 | DBfBB1TP | | 50 |
| Layer | 112_11 | mmtBumTPoFBi-04 | | 35 |
| Layer | 104 | mmtBumTPoFBi-04:OCHD-003 | 1:0.1 | 10 |
| Electrode | 551X | ITSO | | 5 |
| Reflective film | REF | Ag | | 100 |

[Chemical Formula 13]

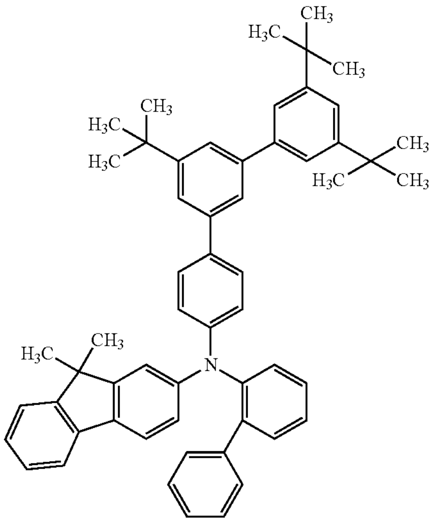

mmtBumTPoFBi-04

-continued

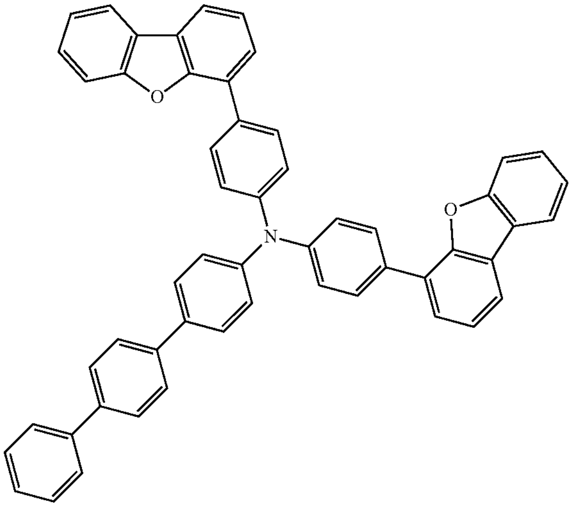

DBfBB1TP

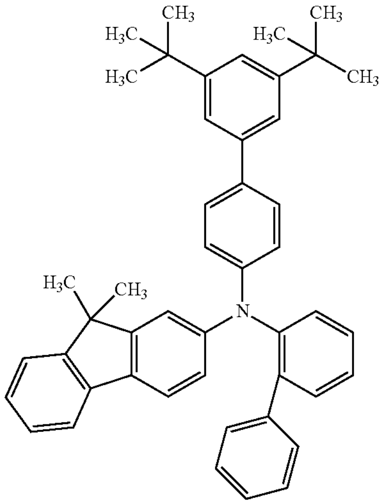

mmtBuBioFBi

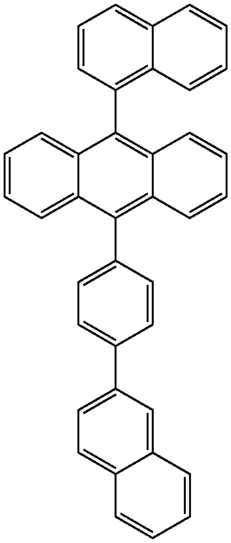

αN-βNPAnth

-continued
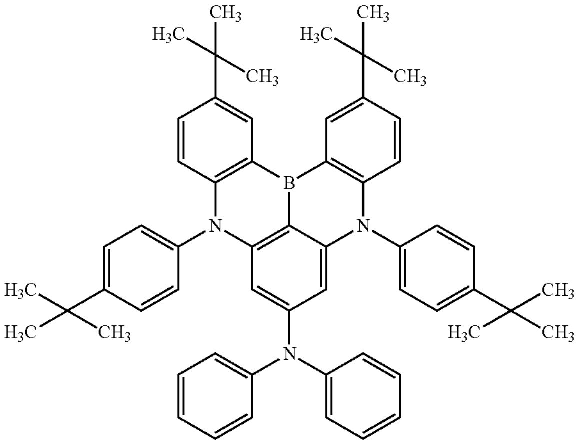
DPhA-tBu4DABNA
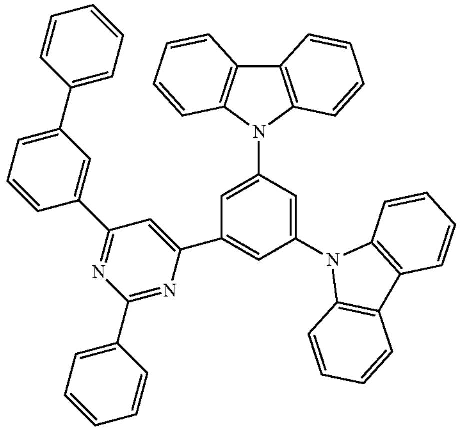
6mBP-4Cz2PPm
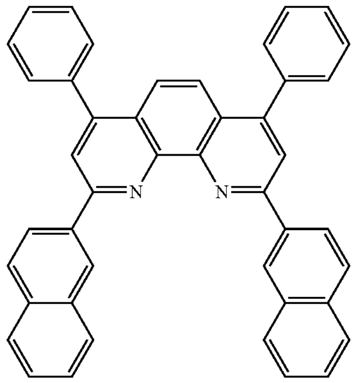
NBPhen
[Chemical Formula 14]
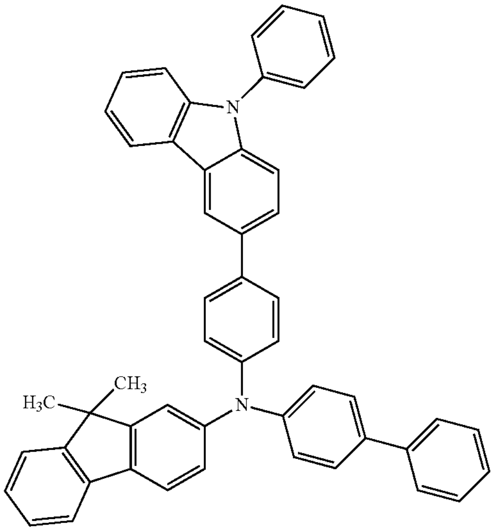
PCBBiF
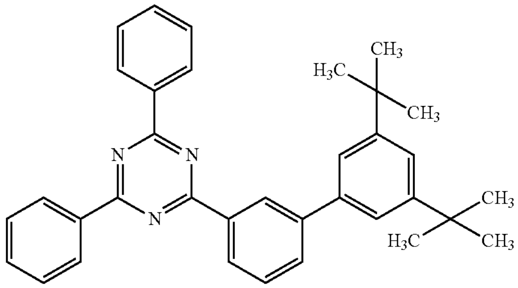
mmtBumBPTzn
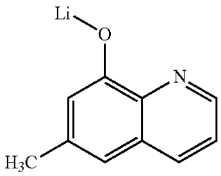
Li-6mq
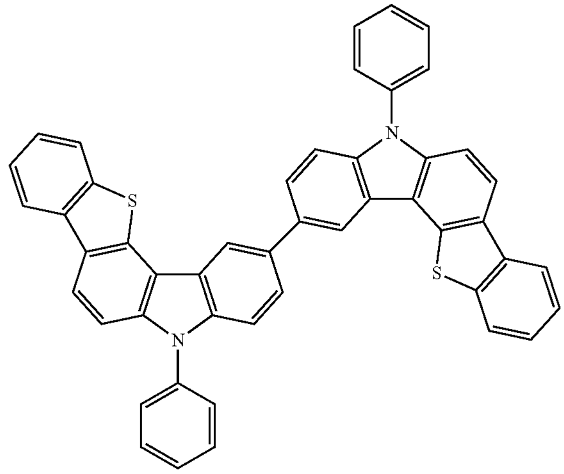
BisBTc <<Manufacturing Method of Light-Emitting Device 1>>

The light-emitting device 1 described in this example was manufactured using a method including the following steps.

[First Step]

In the first step, a reflective film REF was formed. Specifically, the reflective film REF was formed by a sputtering method using silver (abbreviation. Ag) as a target.

The reflective film REF contains Ag and has a thickness of 100 nm.

[Second Step]

In the second step, the electrode 551X was formed over the reflective film REF. Specifically, the electrode 551X was formed by a sputtering method using indium oxide-tin oxide containing silicon or silicon oxide (abbreviation. ITSO) as a target.

The electrode 551X contains ITSO and has a thickness of 5 nm and an area of 4 $mm^2$ (2 mm×2 mm).

Next, abase material over which the electrode 551X was formed was washed with water, baked at 200° C. for an hour, and then subjected to UV ozone treatment for 370 seconds. After that, the base material was transferred into a vacuum evaporation apparatus where the inside pressure was reduced to approximately $10^{-4}$ Pa, and vacuum baking was performed at 170° C. for 30 minutes in a heating chamber of the vacuum evaporation apparatus. Then, the base material was cooled down for approximately 30 minutes.

[Third Step]

In the third step, the layer 104 was formed over the electrode 551X. Specifically, a material was co-evaporated by a resistance heating method.

The layer 104 contains N-(3",5',5"-tri-tert-butyl-1,1':3',1"-terfenyl-4-yl)-N-(1,1'-biphenyl-2-yl)-9,9-dimethyl-9H-fluoren-2-amine (abbreviation: mmtBumTPoFBi-04) and an electron acceptor material (abbreviation: OCHD-003) at a weight ratio mmtBumTPoFBi-04:OCHD-003=1:0.1, and has a thickness of 10 nm. Note that OCHD-003 contains fluorine and has a molecular weight of 672.

[Fourth Step]

In the fourth step, the layer 112_11 was formed over the layer 104. Specifically, a material was evaporated by a resistance heating method.

The layer 112_11 contains mmtBumTPoFBi-04 and has a thickness of 35 nm. An mmtBumTPoFBi-04 film has a giant surface potential (GSP), and the potential gradient (the slope of GSP) is 16.2 mV/nm. The ordinary refractive index of the mmtBumTPoFBi-04 film with respect to light with a wavelength in the range of 455 nm and 465 nm was higher than or equal to 1.72 and lower than or equal to 1.73, and the ordinary refractive index of the mmtBumTPoFBi-04 film with respect to light with a wavelength of 633 nm was 1.66.

[Fifth Step]

In the fifth step, a layer 112_12 was formed over the layer 112_11. Specifically, a material was evaporated by a resistance heating method.

Note that the layer 112_12 contains N,N-bis[4-(dibenzofuran-4-yl)phenyl]-4-amino-p-terphenyl (abbreviation: DBfBB1TP) and has a thickness of 50 nm.

[Sixth Step]

In the sixth step, a layer 112_13 was formed over the layer 112_12. Specifically, a material was evaporated by a resistance heating method.

The layer 112_13 contains N-3',5'-ditertiarybutyl-1,1'-biphenyl-4-yl-N-1,1'-biphenyl-2-yl-9,9,-dimethyl-9H-fluoren-2-amine (abbreviation: mmtBuBioFBi) and has a thickness of 40 nm. The ordinary refractive index of an mmtBuBioFBi film with respect to light with a wavelength in the range of 455 nm to 465 nm was higher than or equal to 1.73 and lower than or equal to 1.74, and the ordinary refractive index of the mmtBuBioFBi film with respect to light with a wavelength of 633 nm was 1.66.

[Seventh Step]

In the seventh step, a layer 112_14 was formed over the layer 112_13. Specifically, a material was evaporated by a resistance heating method.

Note that the layer 112_14 contains DBfBB1TP and has a thickness of 10 nm.

[Eighth Step]

In the eighth step, the layer 111X was formed over the layer 112_14. Specifically, a material was co-evaporated by a resistance heating method.

The layer 111X contains 9-(1-naphthyl)-10-[4-(2-naphthyl)phenyl]anthracene (abbreviation: α,N-βNPAnth) and 2,12-di(tert-butyl)-5,9-di(4-tert-butylphenyl)-N,N'-diphenyl-5H,9H-[1,4]benzazaborino[2,3,4-kl]phenazaborin-7-amine (abbreviation: DPhA-tBu4DABNA) at a weight ratio α,N-βNPAnth:DPhA-tBu4DABNA=1:0.015, and has a thickness of 20 nm.

[Ninth Step]

In a ninth step, a layer 113_11 was formed over the layer 111X. Specifically, a material was evaporated by a resistance heating method. An α,N-βNPAnth film has a giant surface potential (GSP), and the potential gradient (the slope of GSP) that is divided by the film thickness is 10.8 mV/nm. The ordinary refractive index of the α,N-βNPAnth film with respect to light with a wavelength in the range of 455 nm to 465 nm was higher than or equal to 1.92 and lower than or equal to 1.93, and the ordinary refractive index of the α,N-βNPAnth film with respect to light with a wavelength of 633 nm was 1.81.

The layer 113_11 contains 6-(1,1'-biphenyl-3-yl)-4-[3,5-bis(9H-carbazol-9-yl)phenyl]-2-phenylpyrimidine (abbreviation: 6mBP-4Cz2PPm) and has a thickness of 10 nm.

[Tenth Step]

In the tenth step, a layer 113_12 was formed over the layer 113_11. Specifically, a material was evaporated by a resistance heating method.

The layer 113_12 contains 2,9-di(2-naphthyl)-4,7-diphenyl-1,10-phenanthroline (abbreviation: NBPhen) and has a thickness of 20 nm.

[Eleventh Step]

In the eleventh step, a layer 106_2 was formed over the layer 113_12. Specifically, a material was evaporated by a resistance heating method.

Note that the layer 106_2 contains lithium oxide (abbreviation: $Li_2O$) and has a thickness of 0.1 nm.

[Twelfth Step]

In the twelfth step, a layer 106_1 was formed over the layer 106_2. Specifically, a material was co-evaporated by a resistance heating method.

Note that the layer 106_1 contains N-(1,1'-biphenyl-4-yl)-N-[4-(9-phenyl-9H-carbazol-3-yl)phenyl]-9,9-dimethyl-9H-fluoren-2-amine (abbreviation: PCBBiF) and OCHD-003 at a weight ratio PCBBiF:OCHD-003=1:0.1 and has a thickness of 10 nm.

[Thirteenth Step]

In the thirteenth step, a layer 112_21 was formed over the layer 106_1. Specifically, a material was evaporated by a resistance heating method.

The layer 112_21 contains mmtBumTPoFBi-04 and has a thickness of 40 nm.

[Fourteenth Step]

In the fourteenth step, a layer 112_22 was formed over the layer 112_21. Specifically, a material was evaporated by a resistance heating method.

The layer 112_22 contains DBfBB1TP and has a thickness of 10 nm.

[Fifteenth Step]

In the fifteenth step, the layer 111X2 was formed over the layer 112_22. Specifically, a material was evaporated by a resistance heating method.

The layer 111X2 contains αN-βNPAnth and DPhA-tBu4DABNA at a weight ratio αN-βNPAnth:DPhA-tBu4DABNA=1:0.015 and has a thickness of 20 nm.

[Sixteenth Step]

In the sixteenth step, a layer 113_21 was formed over the layer 111X2. Specifically, a material was evaporated by a resistance heating method.

The layer 113_21 contains 6mBP-4Cz2PPm and has a thickness of 10 nm.

[Seventeenth Step]

In the seventeenth step, a layer 113_22 was formed over the layer 113_21. Specifically, a material was co-evaporated by a resistance heating method.

The layer 113_22 contains 2-{(3',5'-di-tert-butyl)-1,1'-biphenyl-3-yl}-4,6-diphenyl-1,3,5-triazine (abbreviation: mmtBumBPTzn) and 6-methyl-8-quinolinolato-lithium (abbreviation: Li-6mq) at a weight ratio mmtBumBPTzn:Li-6mq=0.5:0.5 and has a thickness of 20 nm.

[Eighteenth Step]

In the eighteenth step, the layer 105 was formed over the layer 113_22. Specifically, a material was evaporated by a resistance heating method.

The layer 105 contains lithium fluoride (abbreviation: LiF) and has a thickness of 2 nm.

[Nineteenth Step]

In the nineteenth step, the electrode 552X was formed over the layer 105. Specifically, a material was evaporated by a resistance heating method.

The electrode 552X contains silver (Ag) and magnesium (abbreviation: Mg) at Ag:Mg=10:1 (volume ratio) and has a thickness of 15 nm.

[Twentieth Step]

In the twentieth step, a layer CAP was formed over the electrode 552X. Specifically, a material was evaporated by a resistance heating method.

The layer CAP contains 5,5'-diphenyl-2,2'-di-5H-[1]benzothieno[3,2-c]carbazole (abbreviation: BisBTc) and has a thickness of 65 nm.

Operation Characteristics of Light-Emitting Device 1

When supplied with electric power, the light-emitting device 1 emitted light EL1 (see FIG. 17A). The operation characteristics of the light-emitting device 1 were measured at room temperature (see FIG. 18 to FIG. 23). The luminance, CIE chromaticity, and emission spectrum were measured using a spectroradiometer (SR-UL1R, manufactured by TOPCON TECHNOHOUSE CORPORATION).

Table 2 shows main initial characteristics of the manufactured light-emitting device emitting light at a luminance of approximately 1000 cd/$m^2$. Table 2 shows LT90, which is taken for the luminance to drop to 90% of its initial value and is obtained under the condition where the light-emitting device emitted light at a constant current density (50 mA/$cm^2$). Table 2 shows the characteristics of the other light-emitting devices, whose structures will be described later.

TABLE 2

| | Voltage (V) | Current (mA) | Current density (mA/cm2) | Chromaticity x | Chromaticity y | Current efficiency (cd/A) | B.I. (cd/A/y) | LT90 (hr) |
|---|---|---|---|---|---|---|---|---|
| Light-emitting device 1 | 8.0 | 0.29 | 7.4 | 0.15 | 0.03 | 13.8 | 461.6 | 156 |
| Comparative device 1 | 7.8 | 0.31 | 7.7 | 0.15 | 0.03 | 13.2 | 458.2 | 157 |

The light-emitting device 1 was found to have favorable characteristics. For example, the light-emitting device 1 exhibited higher current efficiency than the comparative device 1. The light-emitting device 1 exhibited a value of a blue index higher than that of the comparative device 1. When the maximum values of the current efficiency and the blue index of the light-emitting device 1 were compared to those of the comparative device 1, the light-emitting device 1 clearly exhibited a higher value.

Reference Example 1

The manufactured comparative device 1 described in this reference example has a structure similar to that of the light-emitting device 550X (see FIG. 17A).

Structure of Comparative Device 1

The structure of the comparative device 1 is different from the light-emitting device 1 in that PCBBiF is used for the layer 112_21 instead of mmtBumTPoFBi-04. The ordinary refractive index of the PCBBiF film with respect to a light with a wavelength of 455 nm is 1.93.

Manufacturing Method of Comparative Device 1

The comparative device 1 described in this reference example was manufactured using a method including the following steps. Note that the manufacturing method of the comparative device 1 is different from the manufacturing method of the light-emitting device 1 in that PCBBiF is used instead of mmtBumTPoFBi-04 in the step of forming the layer 112_21. Different portions are described in detail here, and the above description is referred to for portions formed by a similar method.

[Thirteenth Step]

In the thirteenth step, a layer 112_21 was formed over the layer 106_1. Specifically, a material was evaporated by a resistance heating method.

The layer 112_21 contains PCBBiF and has a thickness of 40 nm.

Operation Characteristics of Comparative Device 1

When supplied with electric power, the comparative device 1 emitted the light EL1 (see FIG. 17A). The operation characteristics of the comparative device 1 were measured at room temperature (see FIG. 18 to FIG. 23). The luminance, CIE chromaticity, and emission spectrum were measured using a spectroradiometer (SR-UL1R, manufactured by TOPCON TECHNOHOUSE CORPORATION).

Table 2 shows main initial characteristics of the manufactured comparative device emitting light at a luminance of approximately 1000 cd/$m^2$. Table 2 shows LT90, which is time taken for the luminance to drop to 90% of its initial value and is obtained under the condition where the light-emitting device emitted light at a constant current density (50 mA/$cm^2$). Table 2 also shows the characteristics of the other light-emitting devices, whose structures will be described later.

REFERENCE NUMERALS

CAP: layer, LN: layer, 103X: unit, 103X2: unit, 103Y: unit, 103Y2: unit, 104: layer, 104X: layer, 104Y: layer, 105: layer, 105X: layer, 105Y: layer, 106: layer, 106_1: layer, 106_2: layer, 106_3: layer, 106X: layer, 106XY: region, 106Y: layer, 111X: layer, 111X2: layer, 112: layer, 112_2: layer, 112_11: layer, 112_12: layer, 112_13: layer, 112_14: layer, 112_21: layer, 112_22: layer, 113: layer, 113: layer, 113_2: layer, 113_11: layer, 113_12: layer, 113_21: layer, 113_22: layer, 400: substrate, 401: electrode, 403: EL layer, 404: electrode, 405: sealant, 406: sealant, 407: sealing substrate, 412: pad, 420: IC chip, 510: base material, 520: functional layer, 521: insulating film, 528: insulating film, 528_1: insulating film, 528_2: insulating film, 528_3: insulating film, 550X: light-emitting device, 550X2: light-emitting device, 550Y: light-emitting device, 551X: electrode, 551XY: gap, 551Y: electrode, 552X: electrode, 552Y: electrode, 601: source line driver circuit, 602: pixel portion, 603: gate line driver circuit, 604: sealing substrate, 605: sealant, 607: space, 608: wiring, 609: external input terminal, 610: element substrate, 611: switching FET, 612: current control FET, 613: electrode, 614: insulator, 616: EL layer, 617: electrode, 618: light-emitting device, 623: FET, 700: display apparatus, 951: substrate, 952: electrode, 953: insulating layer, 954: partition layer, 955: EL layer, 956: electrode, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: electrode, 1024G: electrode, 1024R: electrode, 1024W: electrode, 1025: partition, 1028: EL layer, 1029: electrode, 1031: sealing substrate, 1032: sealant, 1033: base material, 1034B: coloring layer, 1034G: coloring layer, 1034R: coloring layer, 1035: black matrix, 1036: overcoat layer, 1037: interlayer insulating film, 1040: pixel portion, 1041: driver circuit portion, 1042: peripheral portion, 2001: housing, 2002: light source, 2100: robot, 2101: illuminance sensor, 2102: microphone, 2103: upper camera, 2104: speaker, 2105: display, 2106: lower camera, 2107: obstacle sensor, 2108: moving mechanism, 2110: arithmetic device, 3001: lighting device, 5000: housing, 5001: display portion, 5002: display portion, 5003: speaker, 5004: LED lamp, 5006: connection terminal, 5007: sensor, 5008: microphone, 5012: support, 5013: earphone, 5100: cleaning robot, 5101: display, 5102: camera, 5103: brush, 5104: operation button, 5120: dust, 5140: portable electronic device, 5200: display region, 5201: display region, 5202: display region, 5203: display region, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: display portion, 7401: housing, 7402: display portion, 7403: operation button, 7404: external connection port, 7405: speaker, 7406: microphone, 9310: portable information terminal, 9311: display panel, 9313: hinge, 9315: housing This application is based on Japanese Patent Application Serial No. 2021-169265 filed on Oct. 15, 2021, the entire contents are hereby incorporated herein by reference.

The invention claimed is:

1. A light-emitting device comprising:

a first electrode;

a second electrode;

a first layer;

a second layer; and a third layer, wherein the first layer is interposed between the first electrode and the second electrode, wherein the second layer is interposed between the second electrode and the first layer, wherein the third layer is interposed between the second layer and the first layer, wherein the first layer comprises a first light-emitting material, wherein the first light-emitting material has an emission spectrum having a peak at a wavelength λ1, wherein the first layer has an ordinary refractive index n1 at the wavelength λ1, wherein the second layer comprises a second light-emitting material, wherein the second light-emitting material has an emission spectrum having a peak at a wavelength λ2, wherein the second layer has an ordinary refractive index n2 at the wavelength λ2, wherein the third layer has an ordinary refractive index n31 which is lower than the ordinary refractive index n1 at the wavelength λ1, and wherein the third layer has an ordinary refractive index n32 which is lower than the ordinary refractive index n2 at the wavelength λ2.

2. The light-emitting device according to claim 1, wherein the third layer has an ordinary refractive index higher than or equal to 1.50 and lower than or equal to 1.75 with respect to light with a wavelength in the range of 455 nm to 465 nm.

3. The light-emitting device according to claim 1, wherein the third layer has an ordinary refractive index higher than or equal to 1.45 and lower than or equal to 1.70 with respect to light with a wavelength of 633 nm.

4. The light-emitting device according to claim 1, wherein the third layer has a thickness t3, wherein a distance d1, a distance d2, the thickness t3, the wavelength λ1, the wavelength λ2, the ordinary refractive index n1, the ordinary refractive index n2, the ordinary refractive index n31, and the ordinary refractive index n32 satisfy the following Formula (1) and Formula (2), $$n1 \times d1 + n31 \times t3 < \frac{1}{2} \times \lambda 1 \quad (1)$$

$$n2 \times d2 + n32 \times t3 < \frac{1}{2} \times \lambda 2, \quad (2)$$

wherein the distance d1 represents a distance between a center plane of the first layer and the third layer, and wherein the distance d2 represents a distance between a center plane of the second layer and the third layer.

5. The light-emitting device according to claim 1, wherein the wavelength λ1 and the wavelength λ2 are each in the range of 430 nm to 490 nm.

6. The light-emitting device according to claim 1, wherein the second light-emitting material is the same material as the first light-emitting material.

7. The light-emitting device according to claim 1, further comprising a fourth layer, wherein the fourth layer is interposed between the first electrode and the first layer, wherein the fourth layer has an ordinary refractive index n41 which is lower than the ordinary refractive index n1 at the wavelength λ1, and wherein the fourth layer has an ordinary refractive index n42 which is lower than the ordinary refractive index n2 at the wavelength λ2.

8. The light-emitting device according to claim 7, wherein the fourth layer has an ordinary refractive index higher than or equal to 1.50 and lower than or equal to 1.75 with respect to light with a wavelength in the range of 455 nm to 465 nm.

9. The light-emitting device according to claim 7, wherein the fourth layer has an ordinary refractive index higher than or equal to 1.45 and lower than or equal to 1.70 with respect to light with a wavelength of 633 nm.

10. The light-emitting device according to claim 7, wherein the fourth layer comprises the same material as the third layer.

11. The light-emitting device according to claim 1, further comprising a fifth layer, wherein the fifth layer is interposed between the second layer and the first layer, and wherein the fifth layer supplies holes to the second layer and electrons to the first layer.

12. The light-emitting device according to claim 11, wherein the third layer is interposed between the second layer and the fifth layer.

13. A display apparatus comprising:

a first light-emitting device; and a second light-emitting device, wherein the first light-emitting device is the light-emitting device according to claim 11, wherein the fifth layer comprises an electron-accepting substance, wherein the second light-emitting device is adjacent to the first light-emitting device, wherein the second light-emitting device comprises a third electrode, a fourth electrode, and a sixth layer, wherein a gap is between the third electrode and the first electrode, wherein the sixth layer is interposed between the third electrode and the fourth electrode, wherein the sixth layer comprises the electron-accepting substance, wherein the sixth layer comprises a region having a thickness smaller than that of the fifth layer, and wherein the region overlaps with the gap.

14. An electronic device comprising:

the display apparatus according to claim 13; and at least one of a sensor, an operation button, a speaker, and a microphone.

15. A display apparatus comprising:

a first light-emitting device; and a second light-emitting device, wherein the first light-emitting device is the light-emitting device according to claim 11, wherein the fifth layer comprises a transition metal oxide or an organic compound having a halogen group or a cyano group, wherein the second light-emitting device is adjacent to the first light-emitting device, wherein the second light-emitting device comprises a third electrode, a fourth electrode, and a sixth layer, wherein a gap is between the third electrode and the first electrode, wherein the sixth layer is interposed between the third electrode and the fourth electrode, wherein the sixth layer comprises the transition metal oxide or the organic compound having the halogen group or the cyano group, wherein the sixth layer comprises a region having a thickness smaller than that of the fifth layer, and wherein the region overlaps with the gap.

16. A display apparatus comprising:

the light-emitting device according to claim 1; and at least one of a transistor and a substrate.

17. A light-emitting device comprising:

a first electrode;

a second electrode;

a first layer;

a second layer; and a third layer, wherein the first layer is interposed between the first electrode and the second electrode, wherein the second layer is interposed between the second electrode and the first layer, wherein the third layer is interposed between the second layer and the first layer, wherein the first layer comprises a first light-emitting material and a first host material, wherein the first light-emitting material has an emission spectrum having a peak at a wavelength λ1, wherein the first host material formed into a film has an ordinary refractive index n1 at the wavelength λ1, wherein the second layer comprises a second light-emitting material and a second host material, wherein the second light-emitting material has an emission spectrum having a peak at a wavelength λ2, wherein the second host material formed into a film has an ordinary refractive index n2 at the wavelength λ2, wherein the third layer has an ordinary refractive index n31 which is lower than the ordinary refractive index n1 at the wavelength λ1, and wherein the third layer has an ordinary refractive index n32 which is lower than the ordinary refractive index n2 at the wavelength λ2.

18. The light-emitting device according to claim 17, wherein the third layer has an ordinary refractive index higher than or equal to 1.50 and lower than or equal to 1.75 with respect to light with a wavelength in the range of 455 nm to 465 nm.

19. The light-emitting device according to claim 17, wherein the third layer has an ordinary refractive index higher than or equal to 1.45 and lower than or equal to 1.70 with respect to light with a wavelength of 633 nm.

20. The light-emitting device according to claim 17, wherein the third layer has a thickness t3, wherein a distance d1, a distance d2, the thickness t3, the wavelength λ1, the wavelength λ2, the ordinary refractive index n1, the ordinary refractive index n2, the ordinary refractive index n31, and the ordinary refractive index n32 satisfy the following Formula (1) and Formula (2), $$n1 \times d1 + n31 \times t3 < \frac{1}{2} \times \lambda 1 \quad (1)$$

$$n2 \times d2 + n32 \times t3 < \frac{1}{2} \times \lambda 2, \quad (2)$$

wherein the distance d1 represents a distance between a center plane of the first layer and the third layer, and wherein the distance d2 represents a distance between a center plane of the second layer and the third layer.

* * * * *